(12) United States Patent
Imamura

(10) Patent No.: US 7,364,928 B2
(45) Date of Patent: Apr. 29, 2008

(54) ELECTRO-OPTICAL DEVICE AND METHOD OF MANUFACTURING THE SAME, ELEMENT DRIVING DEVICE AND METHOD OF MANUFACTURING THE SAME, ELEMENT SUBSTRATE, AND ELECTRONIC APPARATUS

(75) Inventor: Yoichi Imamura, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 11/476,687

(22) Filed: Jun. 29, 2006

(65) Prior Publication Data

US 2006/0246619 A1 Nov. 2, 2006

Related U.S. Application Data

(62) Division of application No. 10/445,079, filed on May 27, 2003, now Pat. No. 7,183,582.

(30) Foreign Application Priority Data

| May 29, 2002 | (JP) | ............................. 2002-156512 |
| Oct. 30, 2002 | (JP) | ............................. 2002-316083 |
| Feb. 17, 2003 | (JP) | ............................. 2003-038276 |
| Feb. 20, 2003 | (JP) | ............................. 2003-042657 |
| Apr. 17, 2003 | (JP) | ............................. 2003-112791 |
| May 23, 2003 | (JP) | ............................. 2003-146590 |
| May 23, 2003 | (JP) | ............................. 2003-146592 |

(51) Int. Cl.
*H01L 21/00* (2006.01)

(52) U.S. Cl. .................. 438/30; 438/48; 257/E21.587; 257/E51.018

(58) Field of Classification Search .................. 438/22, 438/24, 48, 455, 30, 128, 149, 151; 257/E21.359, 257/E21.368, E51.018, E51.022
See application file for complete search history.

(56) References Cited

U.S. PATENT DOCUMENTS

| 5,737,052 A | 4/1998 | Kimura |
| 5,963,278 A | 10/1999 | Yamazaki et al. |
| 6,191,838 B1 | 2/2001 | Muramatsu |
| 6,332,661 B1 | 12/2001 | Yamaguchi |
| 6,372,608 B1 * | 4/2002 | Shimoda et al. ............ 438/455 |

(Continued)

FOREIGN PATENT DOCUMENTS

CN 1307442 A 8/2001

(Continued)

*Primary Examiner*—Howard Weiss
*Assistant Examiner*—Hoa B Trinh
(74) *Attorney, Agent, or Firm*—Oliff & Berridge, PLC

(57) ABSTRACT

In a circuit to drive driven elements such, as electro-optical elements, an electro-optical device has an element layer, a wire-forming layer, and an electronic component layer in order to suppress variation in characteristics of active elements. The element layer has a plurality of organic EL elements, each of which is arranged in a different position in a plane. The electronic component layer has pixel-driving IC chips. The respective pixel-driving IC chips include a plurality of pixel circuits, each of which drives each organic EL element corresponding to the pixel circuit. The wire-forming layer is positioned between the element layer and the electronic component layer. The wire-forming layer has wires to connect the respective pixel circuits included in the pixel-driving IC chips with the organic EL elements corresponding to the pixel circuits.

17 Claims, 54 Drawing Sheets

U.S. PATENT DOCUMENTS

| | | |
|---|---|---|
| 6,417,025 B1 | 7/2002 | Gengel |
| 6,424,400 B1 | 7/2002 | Kawasaki |
| 6,556,182 B1 | 4/2003 | Goto et al. |
| 6,781,109 B2 | 8/2004 | Izumi et al. |
| 6,781,746 B2 | 8/2004 | Yamazaki et al. |

FOREIGN PATENT DOCUMENTS

| | | |
|---|---|---|
| JP | A 03-248122 | 11/1991 |
| JP | A-4-43322 | 2/1992 |
| JP | A-08-171432 | 7/1996 |
| JP | A-08-184821 | 7/1996 |
| JP | A-09-146477 | 6/1997 |
| JP | A 09-146477 | 6/1997 |
| JP | A 10-049102 | 2/1998 |
| JP | A-11-183862 | 7/1999 |
| JP | A-11-237845 | 8/1999 |
| JP | A-2000-236151 | 8/2000 |
| JP | A 2000-293245 | 10/2000 |
| JP | A-2001-42827 | 2/2001 |
| JP | A 2001-67048 | 3/2001 |
| JP | A-2001-083898 | 3/2001 |
| JP | A-2001-125138 | 5/2001 |
| JP | A-2001-154613 | 6/2001 |
| JP | A-2001-196169 | 7/2001 |
| JP | A-2001-221990 | 8/2001 |
| JP | A-2001-291595 | 10/2001 |
| JP | A-2001-308116 | 11/2001 |
| JP | A-2002-108233 | 4/2002 |
| JP | A-2002-134272 | 5/2002 |
| JP | A 2002-318553 | 10/2002 |
| JP | A 2002-318556 | 10/2002 |
| JP | A 2003-295792 | 10/2003 |
| WO | WO 00/36465 | 6/2000 |

\* cited by examiner

ELECTRO-OPTICAL DEVICE AND METHOD OF MANUFACTURING THE SAME, ELEMENT DRIVING DEVICE AND METHOD OF MANUFACTURING THE SAME, ELEMENT SUBSTRATE, AND ELECTRONIC APPARATUS

This is a Division of application Ser. No. 10/445,079 filed May 27, 2003 now U.S. Pat. No. 7,183,582. The disclosure of the prior application is incorporated by reference herein in its entirety.

BACKGROUND OF THE INVENTION

1. Field of Invention

The present invention relates to an element driving device for driving a plurality of driven elements and a method of manufacturing the same, and specifically to an electro-optical device which uses, as the driven elements, electro-optical elements for converting an electrical action into an optical action, and a method of manufacturing the same. In addition, the present invention relates to an element substrate suitable for the element driving device and the electro-optical device, and to an electronic apparatus including the electro-optical device and the element driving device.

2. Description of Related Art

It has been suggested that electro-optical elements for converting an electrical action into an optical action be used as display devices of various types of electronic apparatuses, such as mobile phones or PDAs (Personal Digital Assistants). Typical examples of such display devices include an organic EL display device using an organic EL material as the electro-optical element, or a liquid crystal display device using liquid crystal as the electro-optical element.

In these display devices, every pixel, a minimum unit for display, has a pixel circuit. This pixel circuit is a circuit for controlling the current or voltage supplied to the electro-optical element. Each pixel circuit, as disclosed in paragraph No. 0013 and paragraph No. 0014 of Japanese Unexamined Patent Application Publication No. 9-146477, includes a driving element formed on a silicon substrate.

In order to improve the quality of display in such display devices, it is desirable that the electrical characteristics of the pixel circuit be uniform over all pixels. However, for low-temperature polysilicon, variation in characteristics can easily occur in re-crystallization and, in addition, crystal defects may occur. Due to such variation and defects, for a display device using thin-film transistors including low-temperature polysilicon, it is very difficult to make the electrical characteristics of the pixel circuits uniform over all pixels. Specifically, if the number of pixels increases to improve the resolution of the display image or to increase the size of the screen, the possibility to generate the variation in characteristics of the respective pixel circuits may increase. Thus, the deterioration of the display quality may become more serious.

The present invention is conceived in view of such problems, and it is an object of the present invention to suppress variation in characteristics of active elements in a circuit for driving driven elements, such as electro-optical elements, thus improving performance, functionality, and the degree of integration of the circuit.

SUMMARY OF THE INVENTION

In order to address the above problems, an electro-optical device according to the present invention includes an element layer including a plurality of electro-optical elements, each of which is driven by a unit circuit; an electronic component layer including element-driving IC chips having a plurality of unit circuits; and a wire-forming layer being situated between the element layer and the electronic component layer, and including wires to connect the respective unit circuits included in the element-driving IC chips with the electro-optical elements corresponding to the unit circuits.

In this configuration, the plurality of unit circuits that drive the electro-optical elements are arranged as the IC chips. In characteristics, active elements included in the IC chips have a small variation as compared with thin film transistors made of low-temperature polysilicon. Therefore, even if the number of pixels increases for the purpose of obtaining high precision or large screen of display image, the possibility to generate the variation in characteristics in the unit circuits, which drive the electro-optical elements, can be suppressed. Thus, it is possible to enhance the throughput of the electro-optical device. In addition, since the active elements included in the IC chips are driven with a low voltage compared with the thin film transistor made of low-temperature polysilicon, etc., it is possible to reduce the power consumption by the electro-optical device.

Furthermore, the electro-optical elements of the present invention convert an electrical action, such as supply of current or application of voltage, into an optical action, such as the variation of brightness or transmittance, or convert an optical action into an electrical action. The typical example of such electro-optical elements includes organic EL elements, which emit light with brightness according to currents supplied from the unit circuits, or liquid crystal, of which an alignment direction (that is, transmittance of light) varies in accordance with the voltages applied from the unit circuits. Furthermore, the present invention can apply to devices using other electro-optical elements.

Furthermore, according to an aspect, a plurality of electro-optical elements are arranged in different positions in the same plane, respectively. For example, the plurality of electro-optical elements are arranged in a matrix shape along in a row direction and in a column direction.

According to another aspect, the electronic component layer has a plurality of element-driving IC chips, each element-driving IC chip including a plurality of unit circuits, and the wire-forming layer has wires to connect each of the unit circuits included in the respective element-driving IC chips with the electro-optical element corresponding to the unit circuit.

According to another aspect, the electronic component layer includes a selecting IC chip to select the IC chip to carry out the driving of the electro-optical element from the plurality of element-driving IC chips. In this configuration, the selecting IC chip is connected to each of the element-driving IC chips through the wires included in the wire-forming layer. Therefore, as compared with the configuration in which a circuit to select the element-driving IC chips is formed by a thin film transistor, it is possible to stabilize the operation of selecting the element-driving IC chips. Thus, the throughput of the electro-optical device can be enhanced and also the power consumption can be reduced.

In another aspect, the electronic component layer includes data-supplying IC chips, which output data signals indicative of the currents to be supplied to or the voltages to be applied to the electro-optical elements into the unit circuits of the respective element-driving IC chips, and the data-supplying IC chips are connected to the respective element-driving IC chips through the wires included in the wire-forming layer. With this configuration, as compared with the configuration in which a circuit to output the data signals to the unit circuits is formed by a thin film transistor, it is possible to stably and rapidly supply the data signals to the element-driving IC chips. Thus, the throughput of the electro-optical device can be enhanced and also the power consumption can be reduced.

In another aspect, the electronic component layer includes: selecting IC chips to select an IC chip, which drives the electro-optical elements, from the plurality of element-driving IC chips; data-supplying IC chips to output data signals indicative of the currents to be supplied to or the voltages to be applied to the respective electro-optical elements into the unit circuits in the respective element-driving IC chips; and a controlling IC chip to control the operation of the selecting IC chips and the data-supplying IC chips, the selecting IC chips and the data-supplying IC chips being connected to the respective element-driving IC chips through the wires included in the wire-forming layer, and the controlling IC chip being connected to the selecting IC chips and the data-supplying IC chips through the wires included in the wire-forming layer. With this configuration, it is possible to enhance the throughput of the electro-optical device and to reduce the power consumption.

In an aspect of the present invention, each of the plurality of element-driving IC chips is arranged in a position facing the plurality of electro-optical elements corresponding to the plurality of unit circuits included in each of the element-driving IC chips. With this configuration, since the type of the electro-optical elements can be selected independent of the positions of the element-driving IC chips, the electro-optical elements having different arrangement pitches can be driven, for example, using the same type of element-driving IC chips.

In an aspect, the electro-optical device according to the present invention may include a light-shielding layer to shield light provided on the opposite side of the wire-forming layer as seen from the plurality of element-driving IC chips. According to this aspect, the incident light from the opposite side of the wire-forming layer as seen from the electronic component layer is shielded by the light-shielding layer. Therefore, the malfunction of the element-driving IC chips due to irradiation of light can be reduced or prevented.

In another aspect, the electro-optical device according to the present invention may include a filling layer filled between the respective element-driving IC chips. By this configuration, the surface of the electronic component layer facing the wire-forming layer is flattened or reinforced by the filling layer. Therefore, the disconnection or the short circuit of the wires included in the wire-forming layer is reduced or prevented, and the wires having good characteristics are provided through simple processes. In another aspect, the filling layer is made of a material having its thermal expansion coefficient similar to that of the element-driving IC chip. According to this aspect, occurrence of thermal stress due to a difference in thermal expansion coefficients between the element-driving IC chip and the filling layer is suppressed. In addition, the filling layer is made of a material having excellent heat radiation. According to this aspect, the thermal uniformity of the whole electro-optical device can be improved, and thus it is possible to suppress the occurrence of defects due to heat.

In an aspect in which the respective element-driving IC chips have first connection terminals provided on the terminal-forming surfaces of the element-driving IC chips facing the wire-forming layer and connected to the electro-optical elements, and second connection terminals provided on the terminal-forming surfaces and connected to a power source lines, the area of the surfaces of the first connection terminals parallel to the terminal-forming surfaces is preferably ⅙ or less of the area of the surfaces of the second connection terminals parallel to the terminal-forming surfaces.

According to this aspect, the operation of the element-driving IC chips is inspected by bringing the probe pins into contact with the second connection terminals. On the other hand, since the first connection terminals have ⅙ or less of the area of the second connection terminals, the area of the terminal-forming surfaces of the element-driving IC chips is reduced as compared with a case where all the connection terminals have the same size as the first connection terminals. Therefore, further element-driving IC chips can be arranged for one electro-optical device. In addition, specifically, the plane shape of the second connection terminal is a rectangle having a length and a width of 100 μm by 70 μm, and the plane shape of the first connection terminals is a rectangle having a length and a width of 30 μm by 10 μm. Furthermore, in another aspect, the area of the surfaces of the first connection terminals parallel to the terminal-forming surfaces is ¹⁄₅₀ or more of the area of the surfaces of the second connection terminals parallel to the terminal-forming surfaces.

Furthermore, an electronic apparatus according to the present invention includes the electro-optical device according to each of the aspects described above. In such electronic apparatus, it is possible to suppress the variation in characteristics of the unit circuits to drive the electro-optical elements. Specifically, in the electronic apparatus using the electro-optical device as a display unit, the quality of display is maintained at a high level.

The electronic apparatus may include a first display unit having a light-emitting electro-optical device and a second display unit having a non-emissive electro-optical device. In such devices, the light-emitting electro-optical device has electro-optical elements emitting light by themselves. A typical example of the light-emitting electro-optical device includes an organic EL display device using the organic EL elements emitting light with brightness corresponding to the supplied currents as the electro-optical elements. On the other hand, the non-emissive electro-optical device has the electro-optical elements not emitting light by themselves. A typical example of the non-emissive electro-optical device includes a liquid crystal display device using the liquid crystal in which the transmittance varies correspondingly to the applied voltage as the electro-optical elements. In this electronic apparatus, the light emitted from the light-emitting electro-optical device reaches the non-emissive electro-optical device to be used for the image display. Therefore, additional illuminating devices are not necessary to secure the visibility of display using the non-emissive electro-optical device. Or, even if an illuminating device is provided, the amount of light emitted from the illuminating device is reduced. In another aspect of this electronic apparatus, the first display unit is movably connected to the second display unit such that display surfaces of the respective electro-optical devices forms a specific angle. According to this aspect, the relative positional relationship between the first display unit and the second display unit can be adjusted such that the light emitted from the first display unit efficiently reaches the second display unit.

The device to which the present invention applies is not limited to the electro-optical device including the electro-optical elements. That is, the present invention applies to various devices including a plurality of driven elements. An element driving device according to the present invention includes: an element layer including a plurality of driven elements, each of which is driven by a unit circuit; an electronic component layer including element-driving IC chips, each having a plurality of unit circuits; and a wire-forming layer being positioned between the element layer and the electronic component layer, and including wires to connect the respective unit circuits included in the element-driving IC chips with the driven elements corresponding to the unit circuits. The same advantages as that of the electro-optical device according to the present invention can be obtained by this element driving device.

Furthermore, the present invention is specified as a substrate used in the element driving device. That is, an element substrate according to the present invention includes: an electronic component layer including a plurality of electronic components having terminal-forming surface on which connection terminals are formed; and a wire-forming layer stacked opposite to the terminal-forming surface of the electronic component layer and having a plurality of wires connected to the connection terminals of the respective electronic components, the plurality of electronic components being arranged such that the respective terminal-forming surfaces are positioned approximately in the same plane. By this configuration, since the respective electronic components are arranged such that the terminal-forming surfaces of the plurality of electronic components are positioned approximately in the same plane, it is possible to collectively form the wires connected to the connection terminals of the respective electronic components.

The electro-optical device according to the present invention can be obtained according to a first to third exemplary manufacturing methods to be described later.

That is, the first exemplary manufacturing method includes the steps of: arranging a plurality of element-driving IC chips, each having a plurality of unit circuits to drive the electro-optical elements, such that their terminal-forming surfaces on which connection terminals are formed are directed to one side, and thereby forming an electronic component layer including the element-driving IC chips; forming a wire-forming layer including wires to connect the respective unit circuits included in the element-driving IC chips with the electro-optical elements corresponding to the unit circuits, on the surface of the electronic component layer to which the connection terminals of the element-driving IC chips are directed; and forming an element layer including the plurality of electro-optical elements, on the opposite side of the electronic component layer as seen from the wire-forming layer. According to the electro-optical device obtained by this method, it is possible to suppress the variation in characteristics of the unit circuits to drive the electro-optical elements.

Furthermore, the second exemplary manufacturing method includes the steps of: arranging element-driving IC chips, each having a plurality of unit circuits to drive the electro-optical elements, on one surface of a substrate in a state in which the terminal-forming surfaces of the element-driving IC chips having connection terminals are opposite to the substrate, and forming an electronic component layer including the element-driving IC chips; peeling off the substrate from the electronic component layer; forming a wire-forming layer including wires to connect the respective unit circuits included in the element-driving IC chips with the electro-optical elements corresponding to the unit circuits, on the surface of the electronic component layer from which the substrate is peeled off; and forming an element layer including the plurality of electro-optical elements, on the opposite side of the electronic component layer as seen from the wire-forming layer.

By this manufacturing method, the terminal-forming surfaces of the element-driving IC chips are arranged in the same plane by the substrate. In other words, the surface of the electronic component layer to face the wire-forming surface is flattened. Therefore, the wire-forming layer can be easily formed, and thus the disconnection or the short circuit of the wire can be effectively reduced or prevented. For example, the uniformity of the film thickness of the wiring layer constituting the wire-forming layer is enhanced, and thus errors relating to forming the wiring layers can be reduced. As a result, it is possible to enhance the throughput of the electro-optical device. In addition, since the element-driving IC chips are arranged in a state in which the terminal-forming surfaces thereof are opposite to the substrate, it is possible to avoid damage on the connection terminals in subsequent steps.

In an aspect of the second exemplary manufacturing method, a step of forming a peeling layer on the one surface of the substrate is carried out before the step of forming an electronic component layer, in the step of forming the electronic component layer, the electronic component layer is formed on the opposite side of the substrate as seen from the peeling layer, and in the step of peeling off the substrate, the substrate is peeled off from the boundary surface between the electronic component layer and the peeling layer by the peeling layer. According to this aspect, the substrate can be easily peeled off by the peeling layer.

In another aspect, the substrate is peeled off, for example, by supplying separation energy to the peeling layer. Specifically, the peeling energy is supplied to the peeling layer by irradiation of electromagnetic wave, such as light, or electromagnetic induction. According to this aspect, since the peeling energy is surely supplied to the peeling layer for a short time, it is possible to enhance productivity or the throughput of the electro-optical device. In addition, when a member which transmits the peeling energy is used as the substrate on which the peeling layer is formed, it is possible to supply the peeling energy to the peeling layer through the substrate.

Furthermore, in another aspect of the second exemplary manufacturing method, a step of forming an adhesive layer on one surface of the substrate is carried out before the step of forming the electronic component layer, and in the step of forming the electronic component layer, the terminal-forming surfaces of the element-driving IC chips adhere to the adhesive layer. According to this aspect, since the impact or stress in arranging the element-driving IC chips on the substrate is reduced by the adhesive layer, it is possible to reduce or prevent defective element-driving IC chips from occurring in the course of manufacturing the electro-optical device.

Furthermore, when the adhesive layer is removed before forming the wire-forming layer in this aspect, it is preferable that the adhesive layer be formed from gas or liquid not affecting the connection terminals of the element-driving IC chips or materials which can be removed by light. By doing so, since the damage on the connection terminals of the element-driving IC chips during the manufacturing steps can be avoided, the connection terminals and the wires of the wire-forming layer can be surely electrified.

Furthermore, in another aspect, the adhesive layer is not removed, but is used as a base of the wire-forming layer. That is, in this aspect, the adhesive layer is made of an insulating material, and in the step of forming the wire-forming layer, the wire-forming layer is formed on the surface of the adhesive layer which covers the electronic component layer. When the insulating layer is independently formed between the respective IC chips of the electronic component layer and the respective wires of the wire-forming layer, the respective IC chips are laid below the insulating layer, or the adhesive protrudes from sides of the IC chips. Thus, the flatness of the wire-forming layer may be damaged. According to the present invention, since the wire-forming layer is formed on the adhesive surface which covers the electronic component layer, the above problems can be reduced or solved. Furthermore, since the step of independently forming the insulating layer of the wire-forming layer can be omitted, it is possible to simplify the manufacturing steps or reduce the manufacturing cost.

On the other hand, the third exemplary manufacturing method includes the steps of: forming electrodes to supply current or applying voltage to the electro-optical elements on one surface of a substrate, and forming a wire-forming layer including wires to connect the electrodes with each of the plurality of unit circuits to drive the electro-optical elements; forming an electronic component layer, which includes element-driving IC chips having a plurality of unit circuits, on the opposite side of the substrate, as seen from the wire-forming layer; peeling off the substrate from the wire-forming layer; and forming the electro-optical elements contacting the electrodes on the opposite side of the electronic component layer, as seen from the wire-forming layer to form an element layer, including the plurality of electro-optical elements.

In this manufacturing method, since the electrodes are formed on the substrate, the surfaces of the electrodes are not affected by the wire-forming layer or the electronic component layer and thus are flat. Therefore, the characteristics of the electro-optical elements provided to contact with the electrodes are equalized.

In another aspect of the third exemplary manufacturing method, a step of forming a peeling layer on the one surface of the substrate is carried out before the step of forming the electronic component layer, and in the step of forming the wire-forming layer, the wire-forming layer is formed on the opposite side of the substrate as seen from the peeling layer. On the other hand, in the step of peeling off the substrate, the substrate is peeled off from the boundary surface between the wire-forming layer and the peeling layer by the peeling layer. According to this aspect, the substrate can be surely and easily peeled off by the peeling layer.

In another aspect of the second or third exemplary manufacturing method, a step of fixing a support substrate to the electronic component layer is carried out before the step of peeling off the substrate. According to this aspect, since the electronic component layer is supported by the support substrate, the handling thereof during the manufacturing processes can be facilitated.

Furthermore, in another aspect of the second or third exemplary manufacturing method, the step of forming the wire-forming layer includes: a step of forming the wires to connect the unit circuits with the electro-optical elements, a step of forming an insulating layer, which covers the wires and has apertures in portions corresponding to a part of the wires, and a step of forming electrode portions in the openings of the insulating layer. On the other hand, in the step of forming the electronic component layer, projected electrodes provided in the connection terminals of the element-driving IC chips are bonded to the electrode portions. According to this aspect, in the step of arranging the element-driving IC chips on the wire-forming layer, the connection terminals and the wires can be surely and easily electrified.

Furthermore, in another aspect according to the first to third exemplary manufacturing methods described above, the step of forming the electronic component layer includes a step of arranging the plurality of element-driving IC chips, each of which has a plurality of unit circuits, and a step of forming a filling layer among the respective element-driving IC chips. According to this aspect, since the respective element-driving IC chips are fixed by the filling layer, in the step of arranging the element-driving IC chips, only arranging the respective IC chips on the substrate, without bonding the respective IC chips onto the substrate, enables preventing the IC chips from departing from predetermined positions. Therefore, the arrangement of the respective IC chips can be carried out within a considerably short time. Furthermore, in another aspect, the filling layer may be made of materials of which the thermal expansion coefficient is similar to that of the respective IC chips, or materials having excellent heat radiation.

Furthermore, in another aspect, the step of forming the electronic component layer includes a step of forming a substrate layer between the plurality of element-driving IC chips and the filling layer. According to this aspect, since the base layer is interposed between the respective IC chips and the filling layer, the distortion due to the stress can be alleviated by the substrate layer, even if stress occurs in the electronic component layer due to the transformation of the filling layer and so forth. Therefore, the wire-forming layer is formed on the flat surface which does not have any distortion. In addition, when a light-shielding layer is made of a conductive material as described later, the base layer may serve to electrically insulate the wire-forming layer and the light-shielding layer.

Furthermore, in another aspect, the step of forming the electronic component layer includes a step of forming a light-shielding layer to shield light on the opposite side of the wire-forming layer as seen from the electronic component layer. According to this aspect, the light which is directed to the respective IC chips from the opposite side or the side surface of the wire-forming layer as seen from the electronic component layer, is shielded by the light-shielding layer. Therefore, malfunction of the element-driving IC chips due to irradiation of light can be prevented. In another aspect, the light-shielding layer is made of a conductive material. According this aspect, the light-shielding layer can be used as an earth line. Therefore, the brightness gradient or the cross-talk due to impedance of power source can be effectively reduced. Furthermore, according to an aspect that the light-shielding layer is made of materials having high heat radiation, the variation in characteristics of the electro-optical elements due to heat emitted from the electro-optical elements can be suppressed.

Furthermore, in another aspect according to the first to third exemplary manufacturing method, in the step of forming the electronic component layer, the plurality of element-driving IC chips, each having a plurality of unit circuits, are arranged in positions facing the plurality of electro-optical elements corresponding to the plurality of unit circuits included in the respective element-driving IC chips.

The first to third exemplary manufacturing method described above can similarly apply to an element driving device including a plurality of driven elements.

That is, a first exemplary manufacturing method to obtain an element driving device includes: a step of arranging element-driving IC chips, each having a plurality of unit circuits to drive the driven elements, such that their terminal-forming surfaces, on which connection terminals are formed, are directed to one side to form an electronic component layer including the element-driving IC chips; a step of forming a wire-forming layer, which includes wires to connect the respective unit circuits included in the element-driving IC chips with the driven elements corresponding to the unit circuits, on the surface of the electronic component layer to which the connection terminals of the element-driving IC chips have been directed; and a step of forming an element layer, which includes the plurality of driven elements, on the opposite side of the electronic component layer as seen from the wire-forming layer.

Furthermore, a second exemplary manufacturing method to obtain an element driving device includes: a step of arranging element-driving IC chips, each having a plurality of unit circuits to drive the driven elements, on one surface of a substrate in a state that their terminal-forming surfaces on which connection terminals are formed are opposite to the substrate so as to form an electronic component layer including the element-driving IC chips; a step of peeling off the substrate from the electronic component layer; a step of forming a wire-forming layer, which includes wires to connect the respective unit circuits included in the element-driving IC chips with the driven elements corresponding to the unit circuits, on the surface of the electronic component layer from which the substrate is peeled off; and a step of forming an element layer, including the plurality of driven elements on the opposite side of the electronic component layer, as seen from the wire-forming layer.

Furthermore, a third exemplary manufacturing method to obtain an element driving device includes: a step of forming electrodes to supply currents or apply voltages to the driven elements on one surface of the substrate, to form a wire-forming layer including wires to connect the electrodes with each of a plurality of unit circuits to drive the driven elements; a step of forming an electronic component layer, which includes element-driving IC chips having the plurality of unit circuits, on the opposite side of the substrate, as seen from the wiring layer; a step of peeling off the substrate from the wire-forming layer; and a step of forming the driven elements contacting the electrodes on the opposite side of the electronic component layer, as seen from the wire-forming layer, to form an element layer including the plurality of driven elements.

An electronic circuit feature of the electro-optical device, according to the present invention is to include: a plurality of electro-optical elements; a plurality of element-driving IC chips, each of which has a plurality of unit circuits to drive electro-optical elements, and a control circuit to sequentially select one or more unit circuits from the plurality of unit circuits and simultaneously carry out selective control, by which the selected one or more unit circuits are operated to drive the electro-optical elements; and a selecting circuit to sequentially select one or more IC chips from the plurality of element-driving IC chips and to simultaneously make the control circuits, of the selected IC chips, carry out the selective control.

In this configuration, the unit circuits to drive the electro-optical elements are included in the IC chips. The active elements included in the IC chips have small variation in characteristics thereof, as compared with a thin film transistor including low-temperature polysilicon, etc. Therefore, even if the number of the electro-optical elements increases to obtain the high accuracy or large screen of a display image, the possibility that the variation in characteristics of the unit circuits to drive the electro-optical elements may occur can be suppressed. As a result, it is possible to improve the throughput of the electro-optical device. In addition, since the active elements included in the IC chips are driven with low voltage, as compared with the thin film transistor made of low-temperature polysilicon, etc., it is possible to reduce the power consumption of the electro-optical device.

However, in the related art configuration in which the selecting circuit directly selects the respective unit circuits, a plurality of wires (scanning lines) extending from the selecting circuit to each of the plurality of unit circuits is required. On the other hand, in the present invention, each of the plurality of pixel-driving IC chips includes a plurality of unit circuits, and these pixel-driving IC chips are sequentially selected as IC chips which should drive the electro-optical elements. Therefore, it is not required that the wires for the selection be provided to every unit circuit, and thus the number of wires can be reduced as compared with the related art configuration. For example, in a configuration in which the number of wires is minimized, one wire for the selecting circuit selecting the pixel-driving IC chips may be provided to every pixel-driving IC chip. According to this configuration, as compared with the related art configuration requiring the wires extending from the selecting circuit to each of the plurality of unit circuits, the number of wires can be reduced.

Furthermore, the electro-optical elements of the present invention convert the electrical action, such as supply of current or application of voltage, into the optical action, such as variation of brightness or transmittance, or convert the optical action into the electrical action. The typical example of such electro-optical elements includes organic EL elements emitting light with brightness corresponding to the current supplied from the unit circuits, or liquid crystal of which alignment direction (that is, transmittance of light) varies correspondingly to the voltage applied from the unit circuits. Furthermore, the present invention may apply to devices using other electro-optical elements. In an aspect, the plurality of electro-optical elements are arranged at different positions in a plane, respectively. For example, the plurality of electro-optical elements are arranged in a matrix shape along a row direction and a column direction.

Furthermore, "the operation to drive the electro-optical elements" in the present invention refers to the operation of supplying current or voltage to the electro-optical elements, as well as the operation of maintaining the current or the voltage in capacitance elements before the actual supply thereof to the electro-optical elements.

In another aspect, each of the element-driving IC chips has a specifying circuit to sequentially specify one or more unit circuits included in each of the element-driving IC chips, and the control circuit carries out the selective control to one or more unit circuits specified by the specifying circuit. According to this aspect, in spite of the small number of wires, predetermined electro-optical elements can be surely driven by the control circuit.

In another aspect, the selecting circuit outputs clock signals to the selected element-driving IC chips, and the specifying circuits in the respective element-driving IC chips sequentially specify one or more unit circuits included in the element-driving IC chips in synchronization with the clock signals supplied from the selecting circuit. By this configuration, since the clock signals are supplied to the selected element-driving IC chips, the respective element-driving IC chips can easily adjust the driving operation of the electro-optical driving elements.

In another aspect, the respective unit circuits include: a holding circuit which holds electrical charge corresponding to driving current or driving voltage to drive the electro-optical elements; and a stick circuit to retain the electrical charge held by the holding circuit. By this configuration, the electrical charge held by the holding circuit is retained to be constant. When, for example, a capacitor is used as the holding circuit, the electrical charge held may be damaged through leakage. According to the aforementioned aspect, since the electrical charge held by the holding circuit is maintained to be constant, supply of current or voltage, other than the predetermined driving current or driving voltage, to the electro-optical elements can be reduced or prevented.

On the other hand, the operation of the respective element-driving IC chips can be tested by bringing the probe pins into contact with the connection terminals. However, in this case, it is required that the respective connection terminals are sized to come in contact with the probe pins. Therefore, in another aspect of the present invention, the control circuit of each of the element-driving IC chips outputs a test signal to test operation of the respective unit circuits to the unit circuits included in each of the element-driving IC chip. According to this aspect, the operation of each unit circuit is tested by supply of the test signal. Therefore, it is not required that the connection terminals of circuits, which are tested through the test signals, are sized to come in contact with the probe pins. That is, since a part or all of the connection terminals of the element-driving IC chips have smaller sizes than those required to contact with the probe pins, the sizes of the element-driving IC chips can be decreased.

A device to which the present invention applies is not limited to the electro-optical device including the electro-optical elements. That is, the present invention can apply to various devices including a plurality of driven elements. An element driving device, according to the present invention, includes: a plurality of driven elements; a plurality of element-driving IC chips each of which has a plurality of unit circuits to drive the driven elements and a control circuit to sequentially select one or more unit circuits from the plurality of unit circuits and simultaneously carry out selective control, by which the selected one or more unit circuits are operated to drive the electro-optical elements; and a selecting circuit to sequentially select one or more IC chips from the plurality of element-driving IC chips and simultaneously make the control circuits of the selected IC chips carry out the selective control. According to this element driving device, the same advantage as that of the aforementioned electro-optical device, according to the present invention, can be obtained.

A second electronic circuit feature of the electro-optical device, according to the present invention is to include: a plurality of electro-optical elements, each of which is driven by a driving current designated by a data signal; and a plurality of data supply circuits provided to every one or a plurality of electro-optical elements and including a first data supply circuit and a second data supply circuit, each of the plurality of data supply circuits having a standard-current supply circuit to generate a standard current based on a reference current and a data-signal output circuit to output a current value corresponding to the data signal based on the standard current generated by the standard-current supply circuit, the first data supply circuit outputting the reference current to the second data supply circuit, the reference current being used for the standard-current supply circuit of the first data supply circuit to generate the standard current, and the standard-current supply circuit of the second data supply circuit generating the standard current, based on the reference current supplied from the first data supply circuit.

In general, in the electro-optical device includes a plurality of data supply circuits, each outputting the data signals, the data signals are generated based on the reference current generated from each data supply circuit. However, in this configuration, if the variation in characteristics of the active elements, which constitute the respective data supply circuits, exists, the current value of the reference current may be different in every data supply circuit. In this case, since variation is generated in the current values of data signals generated on the basis of the reference current, there was a problem that the actual driving current may be different in every data supply circuit, even if the same driving current is intended to be supplied to the respective electro-optical elements. For example, when the electro-optical device is used as a display device, the uneven color may occur in the display image due to the variation in the driving current.

In order to address this problem, in the electro-optical device according to the present invention, the reference current used in the standard-current supply circuit of the first data supply circuit is output to the second data supply circuit, and the standard-current supply circuit of the second data supply circuit generates the standard current based on the reference current supplied from the first data supply circuit. That is, in the first data supply circuit and the second data supply circuit, the data signals are generated on the basis of the common reference current. Therefore, the error of the current values can be reduced with respect to the data signal output from the first data supply circuit and the data signal output from the second data supply circuit.

In another aspect of the present invention, the reference current output from the first data supply circuit is supplied in time division to each of the second data supply circuits. According to this aspect, the reference current, used in the plurality of second data supply circuits, is equal to the reference current used in the first data supply circuit.

In this aspect, a configuration in which the reference current output from the first data supply circuit is supplied to each of the second data supply circuits through current supply lines having parts common to the plurality of second data supply circuits, can be employed. According to this configuration, since the common wires are used in the plurality of second data supply circuits, the number of wires can be decreased as compared with a configuration in which the first data supply circuit and each of the plurality of second data supply circuits are separately connected.

Furthermore, in another aspect, each of the plurality of data supply circuits has a control circuit to determine whether to switch supplying the reference current to the standard-current supply circuit of the data supply circuit. According to this aspect, the reference current can be supplied to the standard-current supply circuit of each data supply circuit at an arbitrary timing regulated by the control circuit. Furthermore, in this aspect, a configuration in which the control circuit in each of the second data supply circuits determines whether to switch supplying the reference current to the standard-current supply circuit based on an enable signal supplied from the control circuit of the data supply circuit at a previous stage, and outputs the enable signal to the control circuit of the data supply circuit at a next stage, can be employed. For example, the control circuits of the respective second data supply circuits are cascade-connected (dependently connected). According to this configuration, the reference current is sequentially supplied to the standard-current supply circuits of the respective second data supply circuits in accordance with the enable signal.

Furthermore, in another aspect of the present invention, each of the data supply circuits includes a holding circuit to hold the reference current, and the standard-current supply circuit of each of the data supply circuits generates the standard current based on the reference current held in the holding circuit. In this aspect, since each of the data supply circuit has a holding circuit, the standard-current supply circuit can generate the standard current corresponding to the reference current at any timing, to output the standard current to the data-signal output circuit.

On the other hand, if the time period when the data signal is output overlaps the time period when the reference current is supplied to the standard-current supply circuit, the reference current can be affected by the power source noise due to the output of the data signal, and thus errors may be generated in the current value of the reference current. Therefore, in another aspect of the present invention, the supply of the reference current to the standard-current supply circuit in each of the data supply circuits is carried out for a time period, other than a time period when the data-signal output circuit of the data supply circuit outputs the data signal. By doing so, the occurrence of error in the current value of the reference current can be reduced or avoided.

Furthermore, in another aspect, a configuration of the first data supply circuit is equal to a configuration of the second data supply circuit. According to this aspect, in arranging the data supply circuits, it is not necessary to distinguish between the first data supply circuit and the second data supply circuit. Therefore, as compared with a case where the first data supply circuit has different constitution from the second data supply circuit, it is possible to improve the production efficiency and to reduce the manufacturing cost.

Furthermore, in an aspect of the present invention, element-driving IC chips having a plurality of unit circuits to supply driving currents corresponding to the data signals to the electro-optical elements are provided, and the data-signal output circuit in each of the data supply circuits outputs the generated data signals to the unit circuits in the element-driving IC chips. According to this aspect, since the unit circuits to drive the electro-optical elements are included in the IC chips, the variation in characteristics of the unit circuits can be suppressed.

One feature of the present invention is that the present invention can apply to various devices including a plurality of driven elements. That is, an element driving device according to the present invention includes: a plurality of driven elements, each of which is driven by a driving current designated by a data signal; and a plurality of data supply circuits provided to every one or a plurality of driven elements and including a first data supply circuit and a second data supply circuit, each of the plurality of data supply circuits having a standard-current supply circuit to generate a standard current based on a reference current and a data-signal output circuit to output a current value corresponding to the data signal based on the standard current generated by the standard-current supply circuit, the first data supply circuit outputting the reference current to the second data supply circuit other than the first data supply circuit, the reference current being used for the standard-current supply circuit of the first data supply circuit to generate the standard current, and the standard-current supply circuit of the second data supply circuit generating the standard current based on the reference current supplied from the first data supply circuit. By this element driving device, the same advantages as that of the electro-optical device, according to the present invention, can be obtained.

An electronic apparatus according to the present invention includes an electro-optical device having the aforementioned features. According to this electronic apparatus, the variation in characteristics of the active elements in the electro-optical device can be suppressed. Specifically, in the electronic apparatus in which the electro-optical device is used as a display device, the quality of display can be maintained at a high level.

More preferably, the electronic apparatus includes a first display unit having a light-emitting electro-optical device and a second display unit having a non-emissive electro-optical device. The light-emitting electro-optical device has electro-optical elements emitting light by themselves. A typical example of the light-emitting electro-optical device includes an organic EL display device using the organic EL elements emitting light with brightness corresponding to the supplied current as the electro-optical elements. On the other hand, the non-emissive electro-optical device has the electro-optical elements not emitting light by themselves. A typical example of the non-emissive electro-optical device includes a liquid crystal display device using the liquid crystal in which the transmittance varies correspondingly to the applied voltage as the electro-optical elements. In this electronic apparatus, the light output from the light-emitting electro-optical device reaches the non-emissive electro-optical device to be used for the image display. Therefore, additional lighting devices are not necessary to secure the visibility of display by the non-emissive electro-optical device. Or, even if an illuminating device is provided, the amount of light output from the illuminating device is reduced. In an aspect of this electronic apparatus, the first display unit is rotatably connected to the second display unit through the respective edge portions thereof. According to this aspect, the relative positional relationship between the first display unit and the second display unit can be adjusted, such that the light output from the first display unit efficiently reaches the second display unit.

DETAILED DESCRIPTION OF PREFERRED EMBODIMENTS

Figure 1:
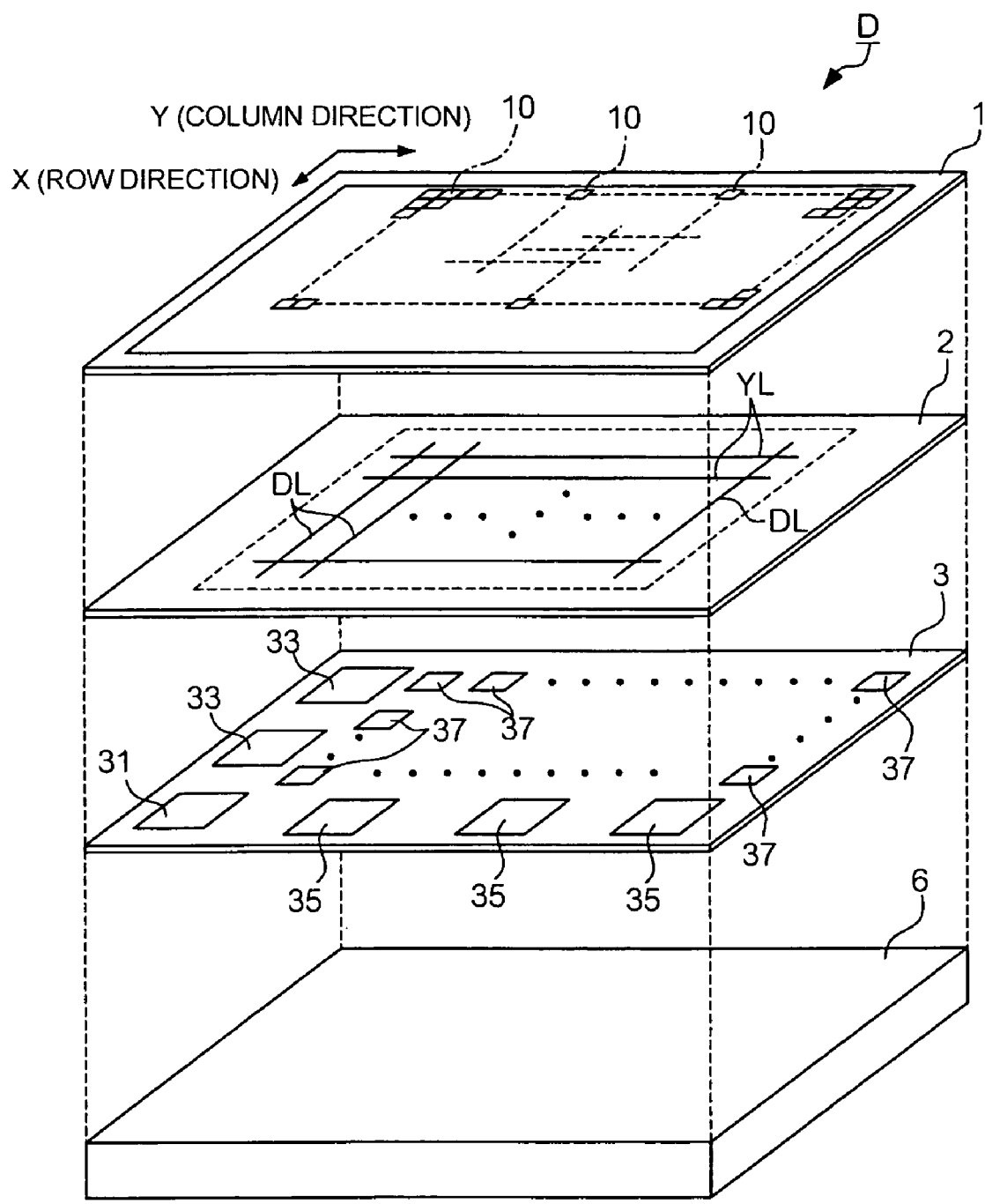
FIG. 1 is a perspective view illustrating a configuration of an electro-optical device according to an exemplary embodiment of the present invention.

Now, exemplary embodiments of the present invention will be described with reference to the drawings. Exemplary embodiments described below illustrate an exemplary embodiment of the present invention, are not intended to limit the present invention, and can be modified within the scope of the present invention. In addition, in the respective drawings described hereinafter, the respective elements are illustrated to have sizes that can be recognized in the drawings, and thus the measurements or ratios, etc. of the respective elements may not be to scale.

A: Configuration of Electro-Optical Device

First, an aspect to which an electro-optical device according to the present invention applies, as a device to display images, will be described. FIG. 1 is a perspective view illustrating an electro-optical device according to an exemplary embodiment of the present invention. As shown in FIG. 1, the electro-optical device D includes a support substrate 6, an organic EL layer 1, a wire-forming layer 2, and an electronic component layer 3. The support substrate 6 is a plate-shaped or film-shaped member made of glass, plastic, metal, ceramic, etc. The electronic component layer 3 is provided on one surface of the support substrate 6. Furthermore, the wire-forming layer 2 is provided on the opposite side of the support substrate 6, as seen from the electronic component layer 3. The organic EL layer 1 is provided on the opposite side of the support substrate 6, as seen from the wire-forming layer 2.

The organic EL layer 1 includes a plurality of organic EL elements 10 as electro-optical elements. These organic EL elements 10 are arranged in a matrix shape along in a row direction (X direction) and in a column direction (Y direction). The respective organic EL elements 10 are light emitting elements (elements to be driven) driven by the supplied current. The light emitted from the respective organic EL elements 10 are emitted toward an upper side in FIG. 1 (that is, in a direction opposite to the support substrate 6). Furthermore, this exemplary embodiment assumes that m organic EL elements 10 are arranged in the column direction and n organic EL elements 10 are arranged in the row direction. Accordingly, the total number of pixels is "m×n".

The electronic component layer 3 includes a plurality of electronic components to drive the respective organic EL elements 10. Specifically, the electronic component layer 3 includes various electronic components, such as semiconductor integrated circuits (IC chip) employing CMOS (Complementary Metal-Oxide Semiconductor) type or bipolar type of transistors, passive elements such as resistors or capacitors, TFT chips, or plate-shaped paper cells, and the like. As shown in FIG. 1, the electronic component layer 3 in this exemplary embodiment includes a controlling IC chip 31, a plurality of scanning IC chips 33, a plurality of column data-converting IC chips 35, and a plurality of pixel-driving IC chips 37 as the electronic components.

The wire-forming layer 2 is located between the electronic component layer 3 and the organic EL layer 1. The wire-forming layer 2 includes a plurality of wires. Specifically, the wire-forming layer 2 has wires to connect the electronic components included in the electronic component layer 3 each other. As shown in FIG. 1, the wire-forming layer 2 includes a plurality of scanning-control line groups YL and a plurality of data lines DL. The respective scanning-control line groups YL are wires to electrically connect the respective scanning IC chips 33 with the plurality of pixel-driving IC chips 37. On the other hand, the respective data lines DL are wires to electrically connect the respective column data-converting IC chips 35 with the plurality of pixel-driving IC chips 37. Furthermore, the wire-forming layer 2 includes wires to connect the electronic components included in the electronic component layer 3 with the organic EL elements 10 included in the organic EL layer 1. For example, the wire-forming layer 2 includes wires (not shown in FIG. 1) to electrically connect one pixel-driving IC chip 37 with the plurality of organic EL elements 10.

Figure 2:
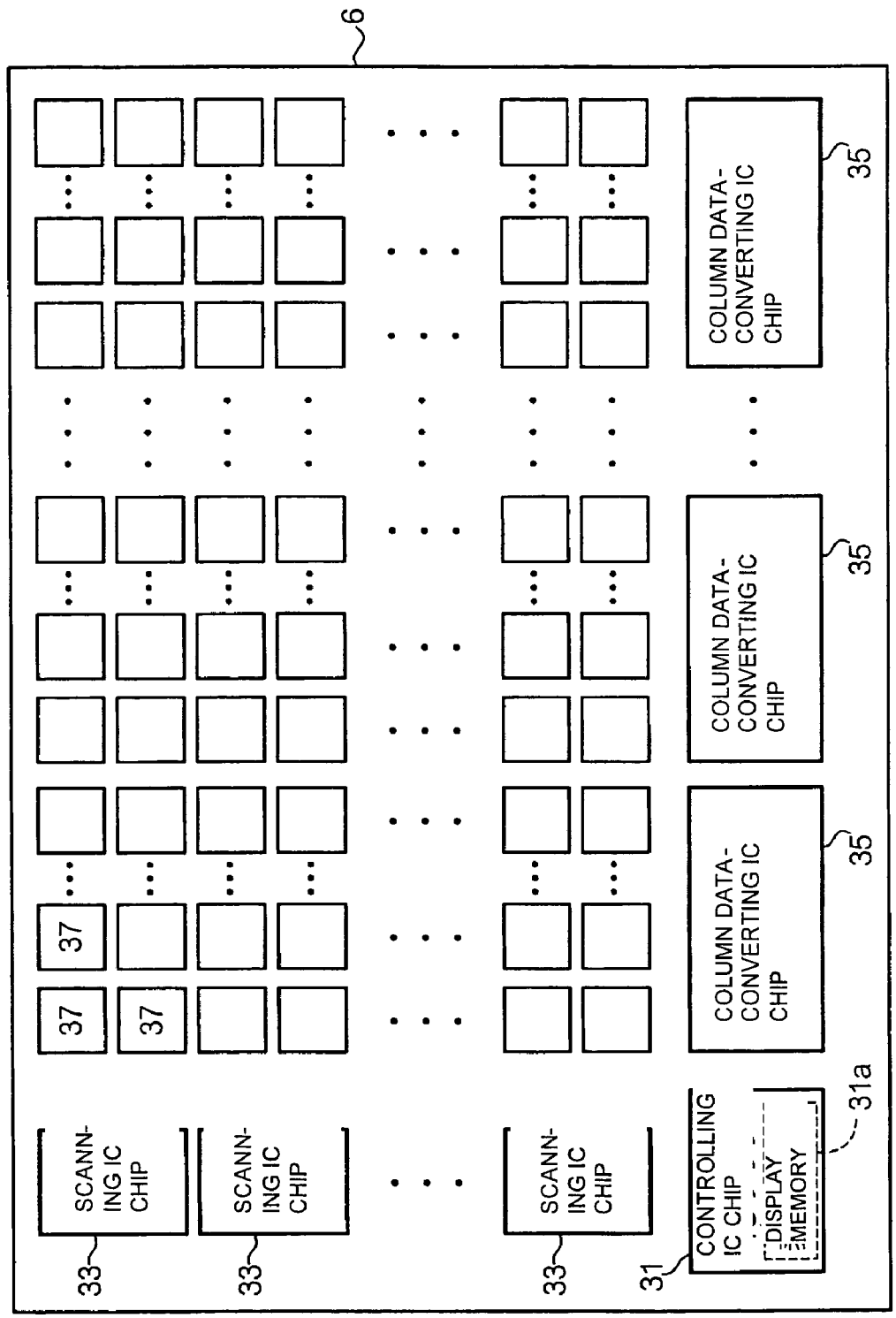
FIG. 2 is a plan view illustrating a configuration of an electronic component layer.

Next, a configuration of the electronic component layer 3 will be described with reference to FIG. 2. As shown in FIG. 2, a plurality of pixel-driving IC chips 37 are arranged in a matrix shape along the row direction (X direction) and the column direction (Y direction). Each of the pixel-driving IC chips 37 is provided to each of the predetermined number of organic EL elements 10 in a plurality of organic EL elements 10 included in the organic EL layer 1. The corresponding relationship between the pixel-driving IC chips 37 and the organic EL elements 10 is as follows.

Figure 3:
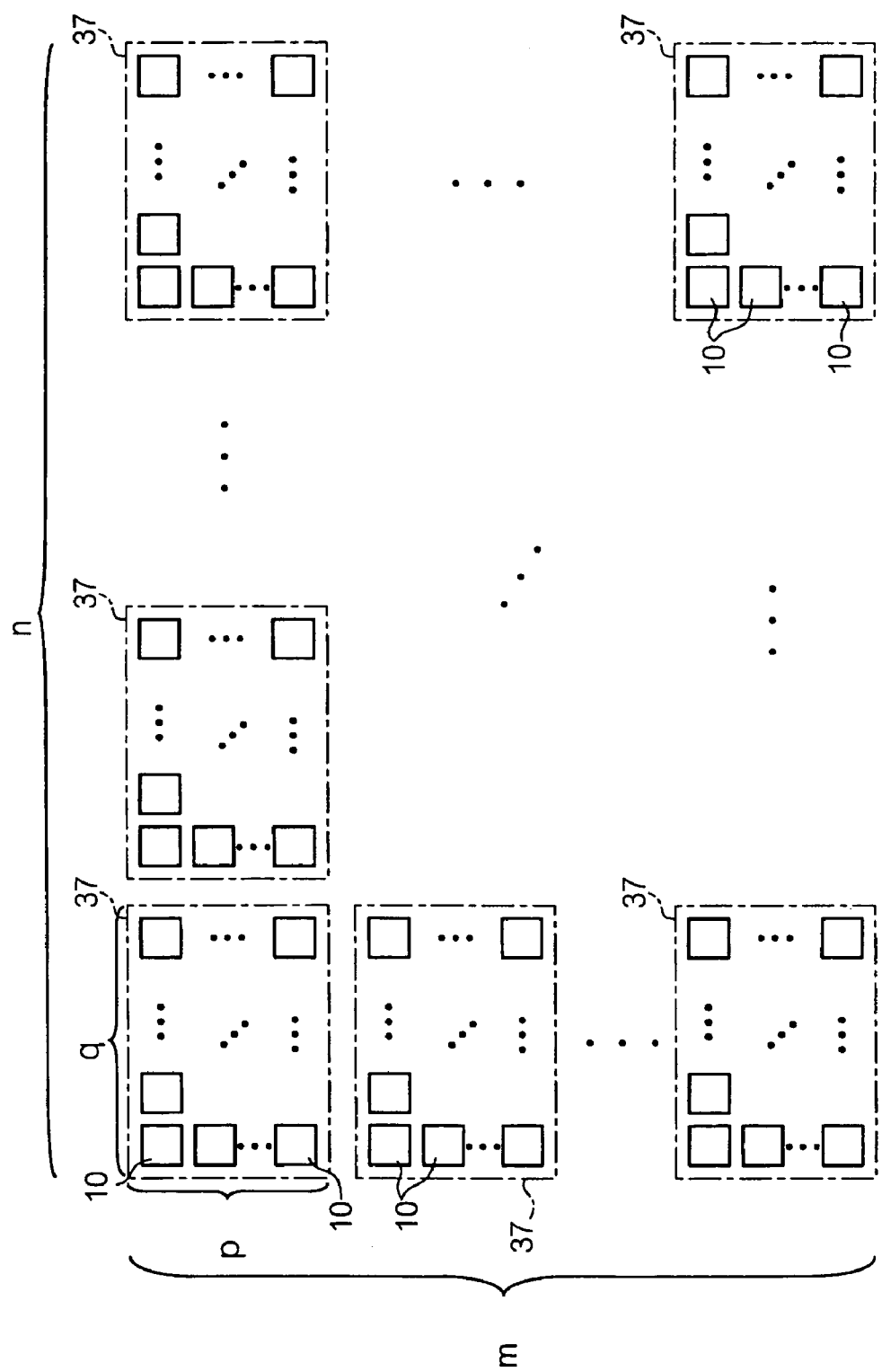
FIG. 3 is a schematic illustrating a corresponding relationship between pixel-driving IC chips and organic EL elements.

In this exemplary embodiment, a total of "m×n" organic EL elements 10 included in the organic EL layer 1 are classified into a plurality of groups (hereinafter, referred to as "element groups"). Specifically, as shown in FIG. 3, the n organic EL elements 10 arranged in the row direction are divided into groups of q elements, and the m organic EL elements 10 arranged in the column direction are divided into groups of p elements, and so one element group includes "p×q" organic EL elements 10 belonging to one area. In addition, one pixel-driving IC chip 37 is assigned to the respective element groups. That is, as shown in FIG. 3, the respective pixel-driving IC chips 37 are arranged to face the "p×q" organic EL elements 10 belonging to one element group, and serve to drive these organic EL elements 10.

Furthermore, as shown in FIG. 2, the plurality of scanning IC chips 33 are arranged in the column direction along one or two edges of the support substrate 6. The respective scanning IC chips 33 have a circuit to sequentially select the IC chips to drive the organic EL elements 10 from the plurality of pixel-driving IC chips 37. On the other hand, the plurality of column data-converting IC chips 35 are arranged in the row direction along other edges of the support substrate 6. The respective column data-converting IC chips 35 control currents flowing through the respective organic EL elements 10 on the basis of data (hereinafter, referred to as "image data") Xd indicative of images. The image data Xd are data to designate brightness (gray scale) of each organic EL element 10.

Furthermore, the controlling IC chip 31 is arranged in a portion (that is, a corner portion of the support substrate 6) in which the column of the plurality of scanning IC chips 33 and the row of the plurality of column data-converting IC chips 35 intersect. The controlling IC chip 31 synthetically controls the respective scanning IC chips 33 and the respective column data-converting IC chips 35. Specifically, the controlling IC chip 31 is connected to external apparatuses (not shown), such as a computer system, and receives the image data Xd or the control signal (for example, clock signals) to define the timing of display operations from the external apparatuses. The controlling IC chip 31 includes a display memory 31a. The display memory 31a temporarily memorizes the image data Xd supplied from the external apparatuses.

In addition, the controlling IC chip 31 generates signals (a reset signal RSET, a clock signal YSCL and a chip-selecting clock signal YECL to be described later) for selecting the plurality of scanning IC chips 33 one by one, on the basis of the control signals supplied from the external apparatuses, and then supplies the signals to the respective scanning IC chips 33 (see FIG. 5). Furthermore, the controlling IC chip 31 supplies the image data Xd, stored in the display memory 31a, to the respective column data-converting IC chips 35 (see FIG. 9). Moreover, the controlling IC chip 31 generates a compulsory off signal Doff to forcibly stop operation of the respective pixel-driving IC chips 37, and outputs this signals to the respective pixel-driving IC chips 37 through the wires included in the wire-forming layer 2.

Next, a configuration and operation of each of the pixel-driving IC chips 37, the scanning IC chips 33, and the column data-converting IC chips 35 will be described. In addition, hereinafter, the configurations and the operation of the pixel-driving IC chips 37 and the scanning IC chips 33 are first described, and then the configuration and the operation of the column data-converting IC chips 35 will be described.

Configuration of Pixel-Driving IC Chip

Figure 4:
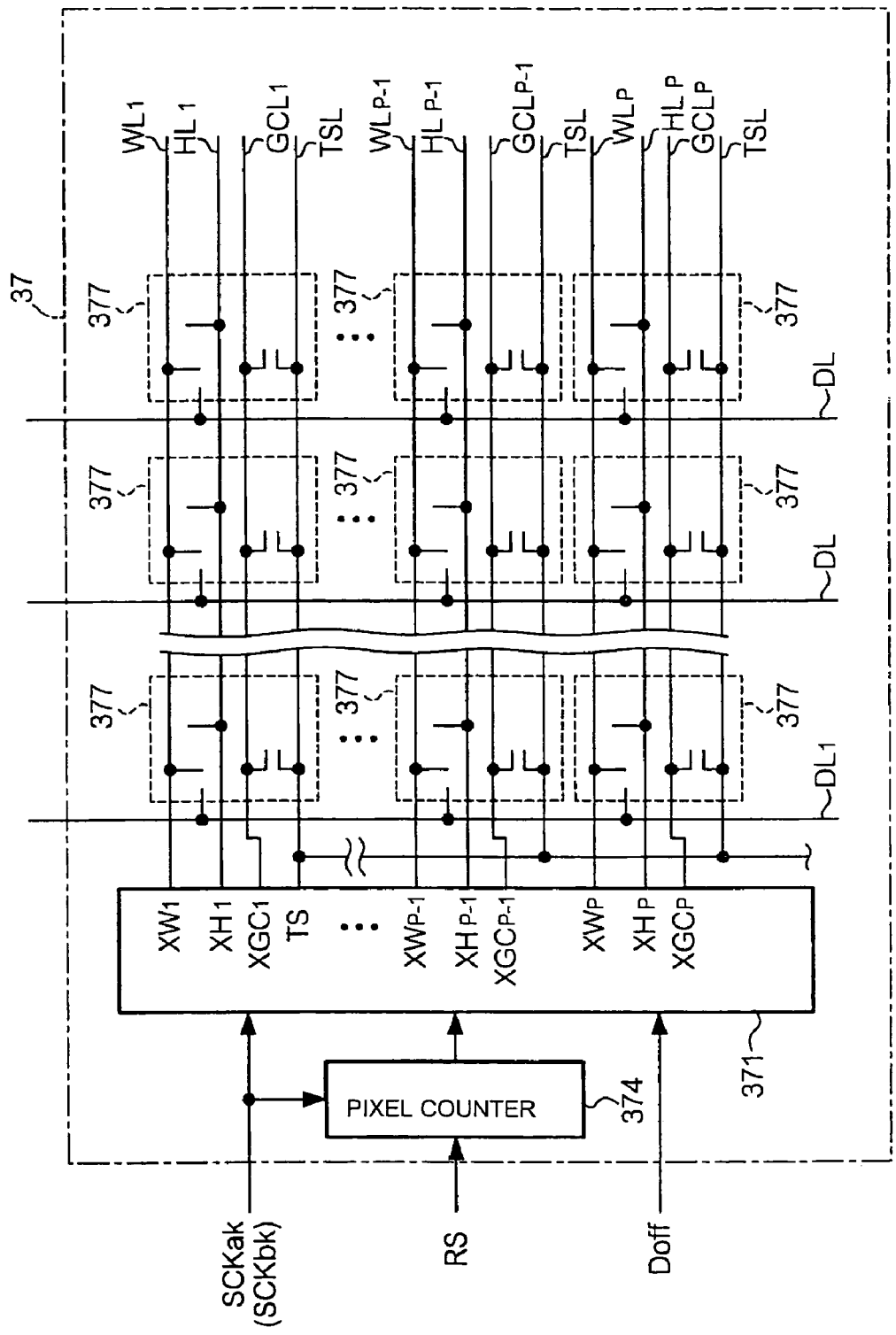
FIG. 4 is a schematic illustrating a configuration of the pixel-driving IC chips.

The respective pixel-driving IC chips 37 include circuits to drive a plurality of organic El elements 10 assigned thereto. Specifically, as shown in FIG. 4, each of the pixel-driving IC chips 37 has a pixel decoder 371, a pixel counter 374, and a plurality of pixel circuits 377. Each of the pixel circuits 377 is arranged in a matrix shape to have one-on-one correspondence with each of the organic EL elements 10 belonging to one element group. Therefore, each of the pixel-driving IC chips 37 includes a total of "p×q" pixel circuits 377. Each of the pixel circuits 377 is a circuit to drive one organic EL element 10. Thus, the "p×q" organic EL elements 10 included in the organic EL layer 1 are driven by one pixel-driving IC chip 37.

As shown in FIG. 4, the q pixel circuits 377 arranged in the row direction are mutually connected through one word line WLi (i is an integer satisfying $1 \leq i \leq m$), one holding control signal line Hli, and one light-emitting control signal line GCLi. One end of the respective word lines WLi, the respective holding control signal lines Hli, and the respective light-emitting control signal lines GCLi are connected to the pixel decoder 371. Based on such configuration, the selecting signals XWi are supplied from the pixel decoder 371 to the q pixel circuits 377, which are arranged in row direction, through the word lines WLi, the holding control signals Xhi are supplied from the pixel decoder 371 to the q pixel circuits 37 through the holding control signal lines Hli, and the light-emitting control signals XGCi are supplied from the pixel decoder 371 to the q pixel circuits 37 through the light-emitting control signal lines GCLi. On the other hand, the p pixel circuits 377 arranged in the column direction are connected to the column data-converting IC chips 35 through one data line DLj (j is an integer satisfying $1 \leq j \leq n$).

Furthermore, all the pixel circuits 377 included in one pixel-driving IC chip 37 are connected to the pixel decoder 371 through common test signal lines TSL. Based on such configuration, test signals TS are simultaneously supplied from the pixel decoder 371 to the respective pixel circuits 377 through the test signal lines TSL. As a result, the performance test for all the pixel circuits 377 is carried out at the same time.

Configuration of Scanning IC Chip 33

Next, a specific configuration of the scanning IC chip 33 will be described with reference to FIG. 5. Further, hereinafter, for the convenience of explanation, a group including a plurality of ("n/q") pixel-driving IC chips 37 arranged in the row direction is referred to as a "pixel-driving IC chip group".

Figure 5:
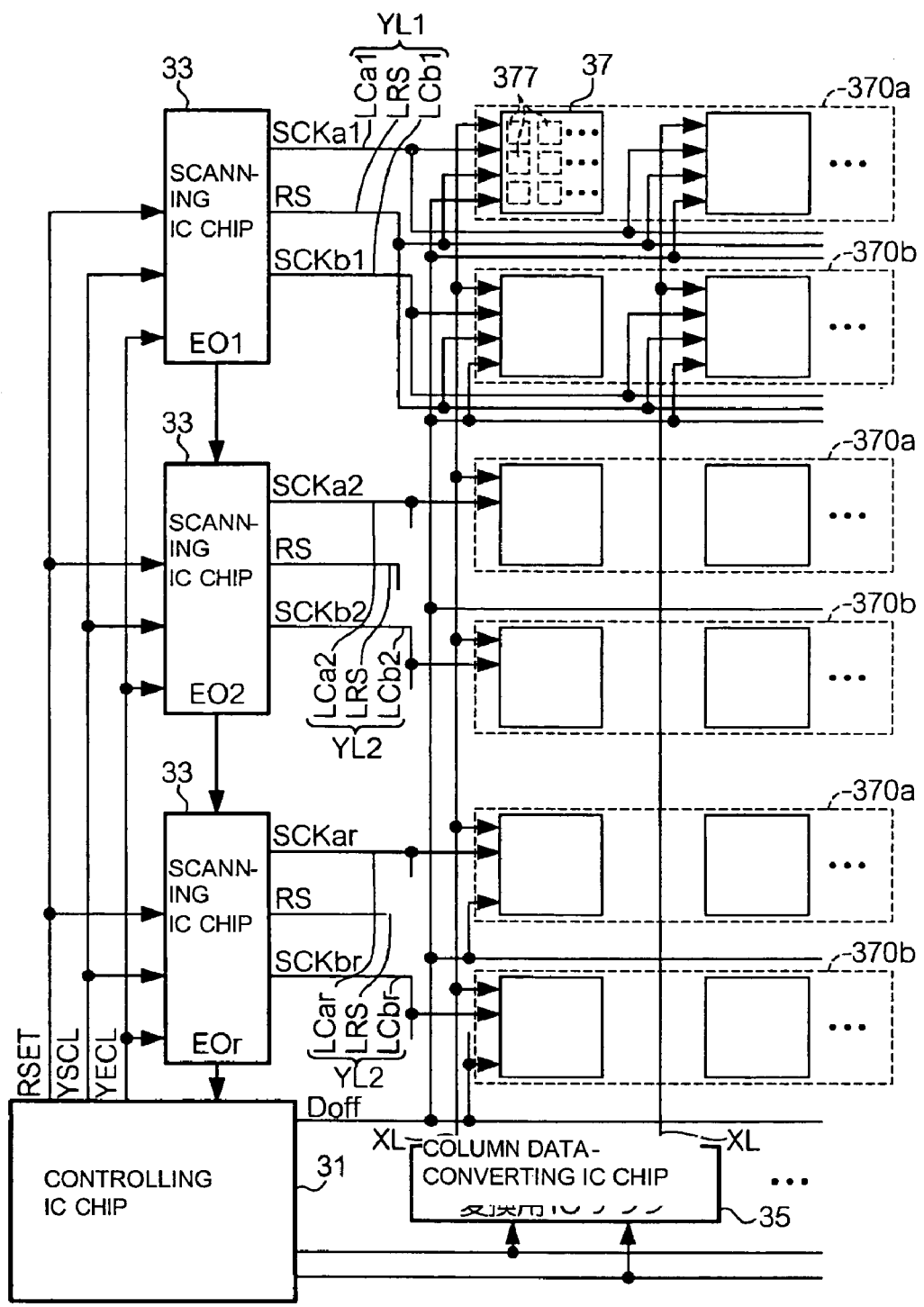
FIG. 5 is a schematic illustrating the relationships between the scanning IC chips and the pixel-driving IC chips.

As shown in FIG. 5, in this exemplary embodiment, one scanning IC chip 33 is provided for every two (that is, two rows) pixel-driving IC chip groups. Each scanning IC chip 33 controls operation of the plurality of ("2n/q") pixel-driving IC chips 37 belonging to the two pixel-driving IC chip groups. Furthermore, hereinafter, as a matter of explanation, the number of the scanning IC chips 33 is referred to as "r(=m/2p)". Furthermore, in the two pixel-driving IC chip groups corresponding to one scanning IC chip 33, one pixel-driving IC chip group is referred to as a "first pixel-driving IC chip group 370a", and the other pixel-driving IC chip group is referred to as a "second pixel-driving IC chip group 370b".

Each scanning IC chip 33 is connected to two pixel-driving IC chips 37, which are assigned to the scanning IC chip 33, through scanning control line groups YLk (k is an integer satisfying $1 \leq k \leq r$) included in the wire-forming layer 2. Each scanning control line group YLk includes a first local clock signal line LCak, a second local clock signal line LCbk, and a local reset signal line LRS. Specifically, each scanning IC chip 33 is connected to a plurality of pixel-driving IC chips 37, which belong to the first pixel-driving IC chip group 370a, through the first local clock signal line LCak. Similarly, each scanning. IC chip 33 is connected to a plurality of pixel-driving IC chips 37, which belong to the second pixel-driving IC chip group 370b, through the second local clock signal line LCbk. Furthermore, two scanning IC chips 33 adjacent to each other are electrically connected through the wires included in the wire-forming layer 2.

Figure 6:
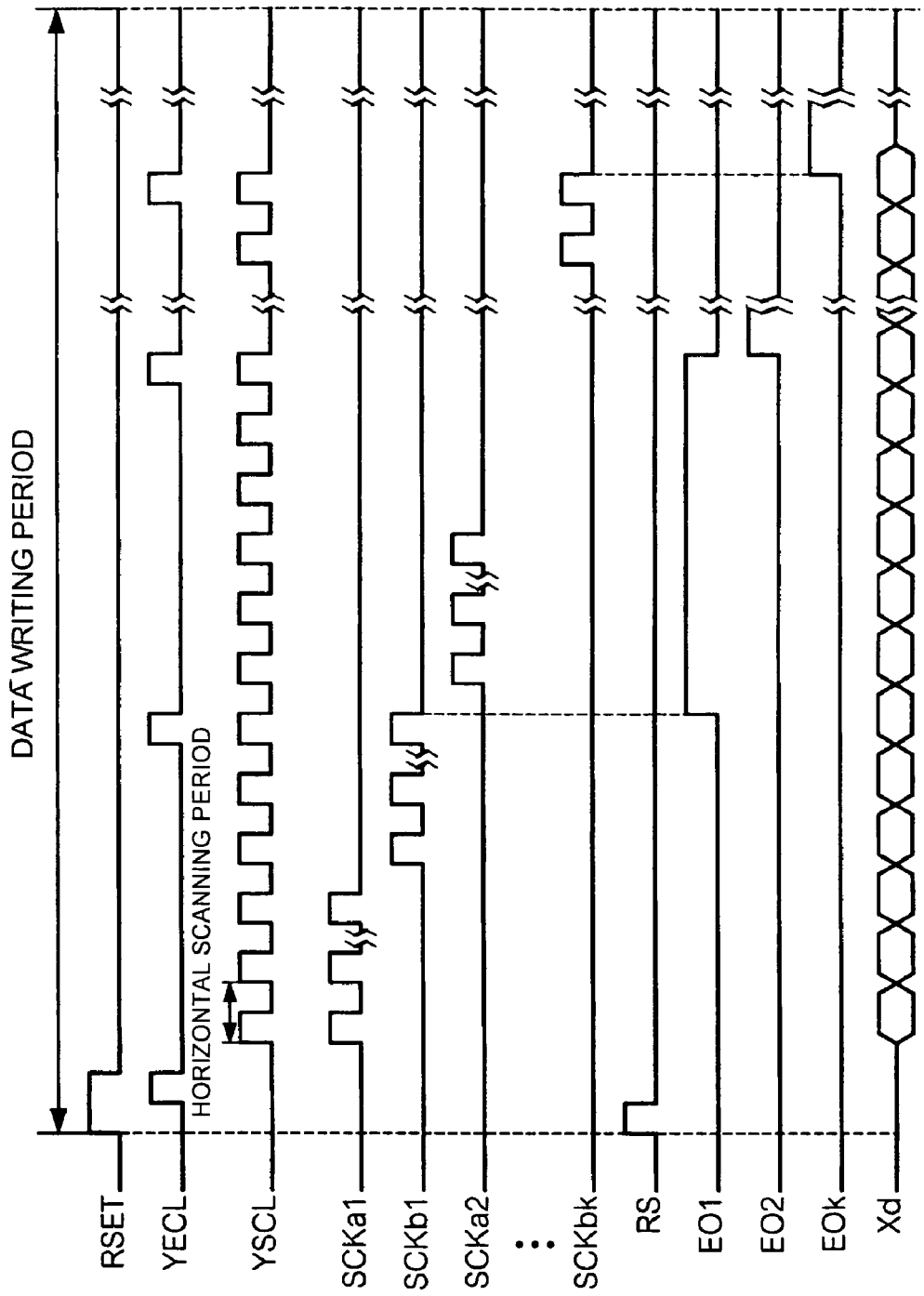
FIG. 6 is a timing chart illustrating operation of the scanning IC chips.

Herein, FIG. 6 is a timing chart illustrating signal waveforms relating to the scanning of each pixel circuit 377. A reset signal RSET, a clock signal YSCL, and a chip-selecting clock signal YECL shown in FIG. 6, are signals supplied from the controlling IC chip 31 to each scanning IC chip 33. The reset signal RSET is a signal which defines a time period (hereinafter, referred to as "data writing period") for scanning all "m×n" organic EL elements 10, and rises to H level at a starting point of time of each data writing period. On the other hand, the clock signal YSCL is a signal which has a period corresponding to a time period of one horizontal scanning time. This horizontal scanning period corresponds to a time period when the n pixel circuits 377 in one row are selected at a time. Furthermore, the chip-selecting clock signal YECL is a signal to select a scanning IC chip 33, which actually controls the pixel-driving IC chips 37, among the plurality of scanning IC chips 33. Thus, the chip-selecting clock signal YECL rises to H level by "r" times corresponding to the number of scanning IC chips for one data writing period.

Each scanning IC chip 33 sequentially outputs a first local clock signal SCKak and a second local clock signal SCKbk when it is selected by the chip-selecting clock signal YECL. The first local clock signal SCKak and the second local clock signal SCKbk are clock signals to select the plurality of pixel circuits 377 belonging to each pixel-driving IC chip group for every row.

More specifically, as shown in FIG. 6, the k-th scanning IC chip 33 first outputs the first local clock signal SCKak to the plurality of pixel-driving IC chips 37 belonging to the first pixel-driving IC chip group 370a. The first local clock signal SCKak is a signal in which its level is changed at the same period as that of the clock signal YSCL, for a time period corresponding to the p horizontal scanning period, where p is the number of the pixel circuit 377 arranged in the column direction in the first pixel-driving IC chip group 370a. Furthermore, when it is completed to select the pixel circuits 377 for p number of rows on the basis of the first local clock signal SCKak, the scanning IC chip 33 selected by the chip-selecting clock signal YECL outputs the second local clock signal SCKbk to the plurality of pixel-driving IC chips 37 belonging to the second pixel-driving IC chip group 370b. The second local clock signal SCKbk is a signal of which the level is changed at the same period as that of the clock signal YSCL, for a time period corresponding to the p horizontal scanning period, where p is the number of the pixel circuit 377 arranged in the column direction in the second pixel-driving IC chip group 370b. The first local clock signal SCKak and the second local clock signal SCKbk are transmitted through the first local clock signal line LCak and the second local clock signal line LCbk, respectively.

On the other hand, when it is completed to select the pixel circuits 377 for p number of rows on the basis of the second local clock signal SCKbk, each scanning IC chip 33, as shown in FIG. 6, reverses the enable signal EOk, which will be output to the scanning IC chip 33 at a next stage, into H level. The enable signal EOk is a signal to notify the scanning IC chip 33 at the next stage that the scanning IC chip 33 has completed to select the pixel-driving IC chip group for two rows. The (k+1)-th scanning IC chip 33, to which the enable signal EOk of H level is supplied, outputs a first local clock signal SCKak+1 and a second local clock signal SCKbk+1 in the same order as described above.

Configuration of Pixel Circuit

Next, an electrical configuration of the pixel circuit 377 as a unit circuit will be described with reference to FIG. 7. In addition, in FIG. 7, one pixel circuit 377 positioned in i-th row and j-th column is shown. This configuration is common to all the pixel circuits 377.

The pixel circuit 377 includes a plurality of MOS transistors and one capacitor C0. Specifically, the pixel circuit 377 has a pair of switching transistors Q1a and Q1b, a pair of reading-out transistors Q2a and Q2b, a capacitor C0, a light-emitting control transistor Q3, a test transistor Q8a and Q8b, and an analog memory portion 377a. The transistors Q1a, Q1b, Q2a, Q2b and Q3 are p channel MOS transistors, and the transistors Q8a and Q8b are n channel MOS transistors. The transistor Q2b is a driving transistor to supply static current to the organic EL element 10, and the transistor Q3 is a transistor to control the pass and non-pass of the static current.

The transistor Q1a is connected to the data line DLj and the transistor Q1b, and the gate terminal thereof is connected to the word line WLi. Furthermore, the transistor Q1b is connected to one end of the capacitor C0 and the transistor Q1a, and the gate terminal thereof is connected to the word line WLi. On the other hand, the other end of the capacitor C0 is connected to the power source line L1. A power source voltage VDD is applied to the power source line L1.

The transistors Q2a and Q2b constitute a current mirror circuit. Specifically, the respective gate terminals of the transistors Q2a and Q2b are connected to one end of the capacitor C0. Furthermore, the transistor Q2a is connected to the transistor Q1a and the power source line L1. Therefore, when the selection signal XWi supplied through the word line Wli is transferred to L level, both of the transistors Q1a and Q1b become on state. In this way, when the transistor Q1b becomes on state, the transistor Q2b in which the gate terminal is connected to the drain terminal functions as a diode. Therefore, the current corresponding to the data signal Dj of the data line DLj flows through a path of the power source line L1→the transistor Q2a→the transistor Q1a→the data line DLj, and the electrical charge corresponding to the gate voltage of the transistor Q2a is accumulated in the capacitor C0. Furthermore, the transistor Q2b is connected to the source terminal of the transistor Q3 and the power source line L1. The transistor Q2b constitutes a current mirror circuit along with the transistor Q2a, and makes the electrical charge accumulated in the capacitor C0, that is, the current corresponding to the gate voltage of the transistor Q2b flowed to the transistor Q3.

The gate terminal of the transistor Q3 is connected to the light-emitting control signal line GCLi. Furthermore, the drain terminal of the transistor Q3 is connected to the organic EL element 10 through the wire included in the wire-forming layer 2. Base on such configuration, when the light-emitting control signal XGCi is transferred to L level, the transistor Q3 becomes on state. At that time, the driving current Ie1 corresponding to the gate voltage of the transistor Q2b is supplied to the organic EL element 10 through the transistors Q2b and Q3. By means of supply of this driving current Ie1, the organic EL element 10 emits light. Furthermore, although p type transistors have been used as the transistors Q2a, Q2b, and Q3 in this exemplary embodiment, these transistors may be suitably replaced with n type transistors in accordance with the connection relationship of the organic EL element 10 or the power source line L1.

On the other hand, the analog memory portion 377a is a circuit to keep the electrical charge accumulated in the capacitor C0 constant. Specifically, the analog memory portion 377a has transistors Q4a, Q4b, Q5, Q6, and Q7. The transistors Q4a and Q4b are n channel MOS transistors, and the transistors Q5, Q6 and Q7 are p channel MOS transistors. The transistors Q4a and Q4b constitute a current mirror circuit. Similarly, the transistors Q5 and Q6 constitute a current mirror circuit.

The transistor Q5 is connected to the power source line L1 and the transistor Q4a, and the gate terminal thereof is connected to one end of the capacitor C0. The transistor Q6 is connected to the power source line L1 and the transistor Q4b, and the gate terminal thereof is connected to the transistor Q7. The transistor Q7 is connected to one end of the capacitor C0 and the transistor Q6, and the gate terminal thereof is connected to the holding signal line HLi. Therefore, when the holding signal XHi becomes L level, the transistor Q7 becomes on state.

On the other hand, the transistor Q4a is connected to the transistor Q5 and the earth line, and the gate terminal thereof is connected to the transistor Q5. In addition, the transistor Q4b is connected to the transistor Q6 and the earth line, and the gate terminal thereof is connected to the transistor Q5 and the gate terminal of the transistor Q4a.

Based on such configuration, the analog memory portion 377a operates as follows. That is, when the electrical charge corresponding to the data signal is accumulated in the capacitor C0, the current corresponding to the gate voltage of the transistor Q2b flows from the transistor Q5 to the transistor Q4a. Herein, since the transistors Q4a and Q4b constitute the equivalent times of current mirror circuit, the current equal to the current flowing through the transistor Q4a flows through the transistor Q4b, and the current flows through the transistor Q6. In addition, in this state, when the transistor Q7 becomes on state, the gate voltage of the transistor Q6 is fed back to the capacitor C0 through the transistor Q7. As a result, the electrical charge accumulated in the capacitor C0 is constantly maintained. Furthermore, in another aspect, a nonvolatile memory circuit may be employed instead of the analog memory portion 377a. Moreover, although the analog memory portion 377a is a circuit useful to rapidly resume display once the display is put-out for the purpose of a low power consumption or hot start of programs, it is not indispensable to the present invention.

Next, the pixel counter 374 and the pixel decoder 371 included in the pixel-driving IC chip 37 will be described. The pixel counter 374 shown in FIG. 4 sequentially specifies the pixel circuits 377 of each row included in one pixel-driving IC chip 37 with a purpose of selection. The local reset signal line LRS, and the first local clock signal line LCak or the second local clock signal line LCbk are connected to this pixel counter 374.

As described in detail, the pixel counter 374 increases the count value by "1", whenever the first local clock signal SCKak or the second local clock signal SCKbk supplied from the scanning IC chip 33 rises to H level. In addition, the pixel counter 374 resets the count value to "0", whenever the local reset signal RS supplied from the scanning IC chip 33 rises to H level. Therefore, the count value by the pixel counter 374 increases by "1" for every horizontal scanning period from "0" up to "p", for one data writing period. The count value by the pixel counter 374 is output to the pixel decoder 371.

The pixel decoder 371 sequentially selects the pixel circuits 377 in each row included in one pixel-driving IC chip 37. The first local clock signal line LCak or the second local clock signal line LCbk is connected to the pixel decoder 371. In addition, the pixel decoder 371 simultaneously selects the plurality (q number) of pixel circuits 377 belonging to a row corresponding to the count value by the pixel counter 374. That is, the pixel decoder 371 controls the levels of the selection signal XWi, the holding control signal Xhi, and the light-emitting control signal XGCi as described below.

Figure 8:
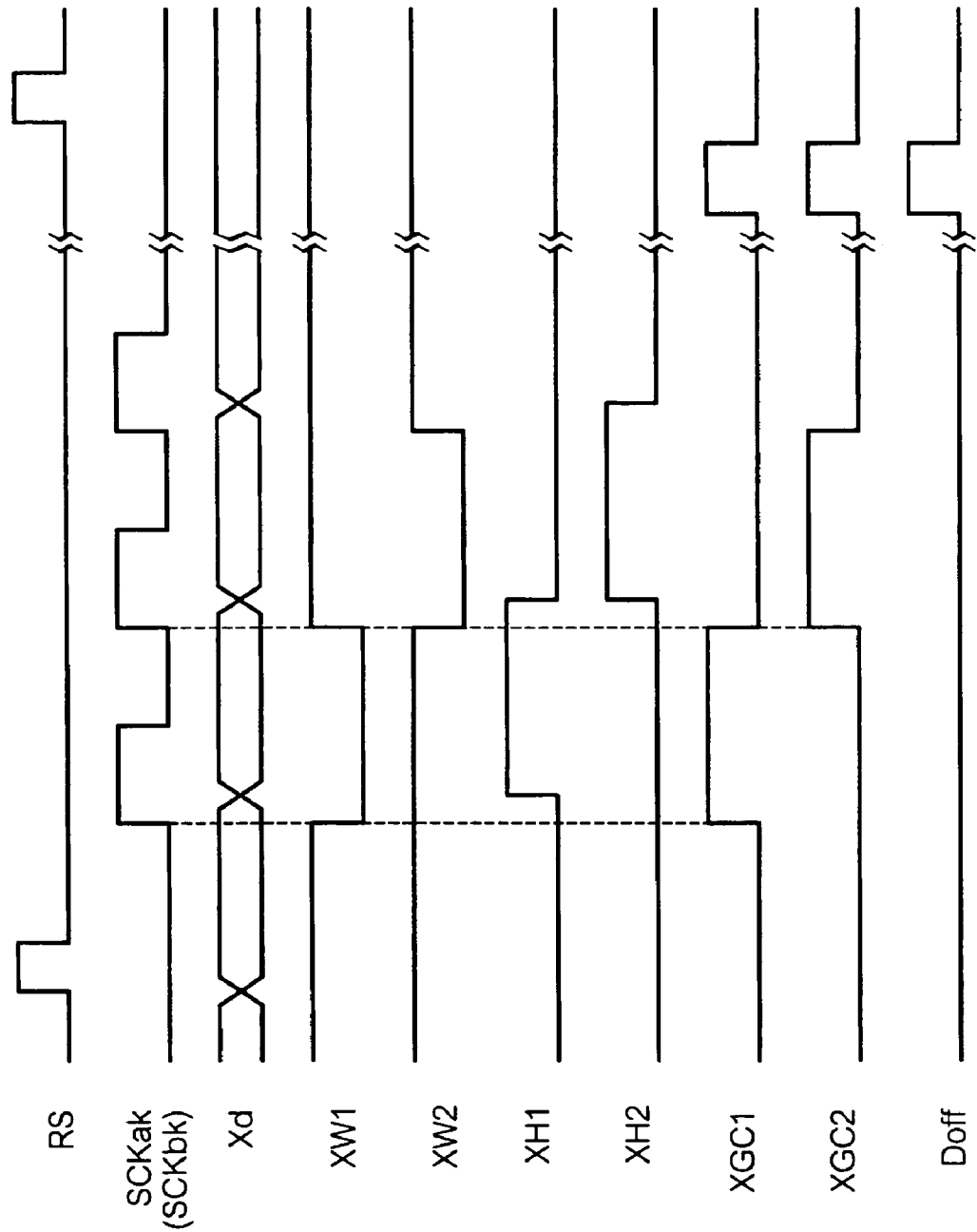
FIG. 8 is a timing chart illustrating the scanning of the pixel circuit.

As shown in FIG. 8, the selection signal XWi is a signal which becomes L level for one horizontal scanning period in the data writing period. That is, the selection signal XWi is reversed to L level in synchronization with the i-th rise of the first local clock signal LCak or the second local clock signal LCbk, and is reversed to H level in synchronization with the (i+1)-th rise, during the data writing period. Therefore, the selection signals XW1, XW2, . . . , XWp are sequentially reversed to L level in synchronization with the rise of the first local clock signal LCak or the second local clock signal LCbk. Furthermore, the holding control signal XHi is reversed to H level at a timing when the amount of a predetermined time elapses after the selection signal XWi falls to L level, and is reversed to L level after the time period corresponding to one horizontal scanning period elapses. Furthermore, the light-emitting control signal XGCi is a signal to which the level of the selection signal XWi is reversed. Therefore, the light-emitting control signals XGC1, XGC2, . . . , XGCp are sequentially reversed to H level in synchronization with the rise of the first local clock signal LCak or the second local clock signal LCbk.

Figure 7:
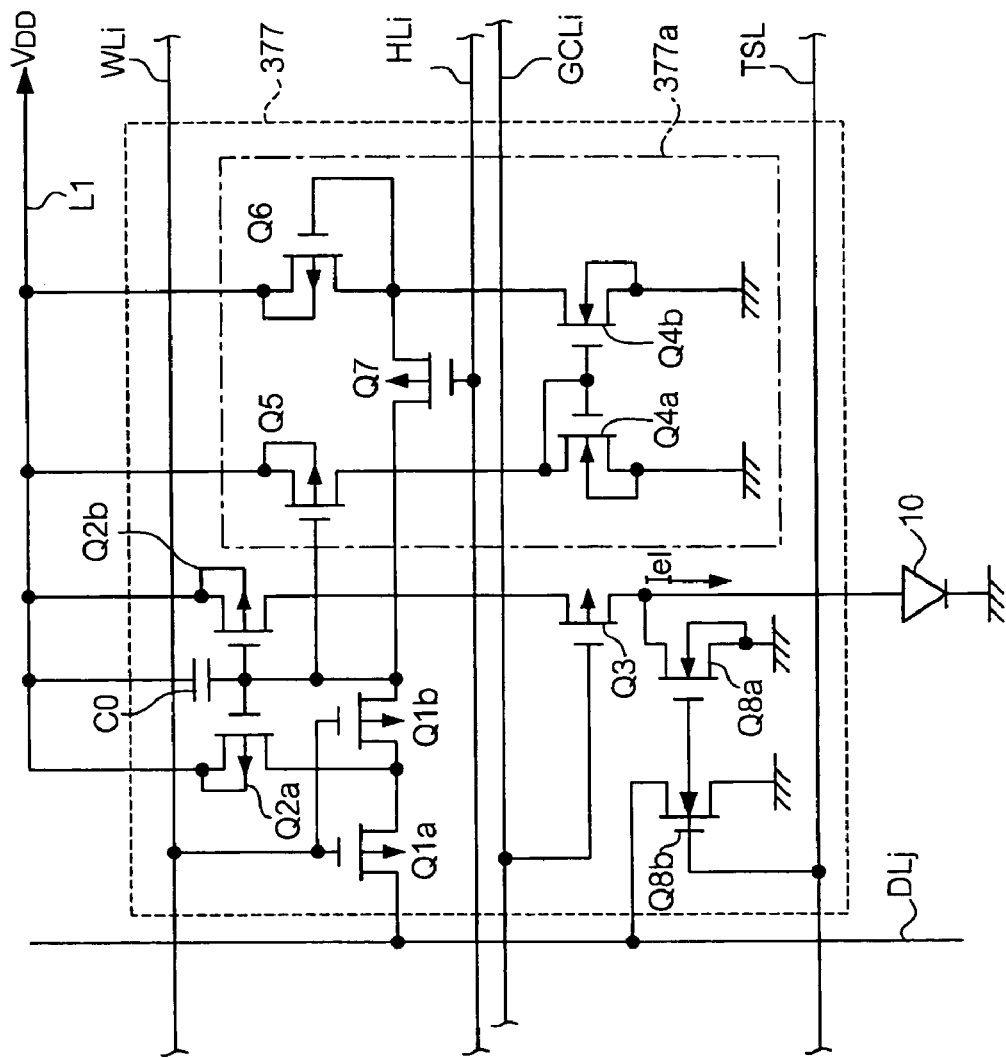
FIG. 7 is a circuit schematic illustrating a configuration of a pixel circuit.

On the other hand, as shown in FIG. 7, the gate terminals of the transistors Q8a and Q8b are connected to the test signal lines TSL. The drain terminal of the transistor Q8a is connected to the drain terminal of the transistor Q3. In a mode (a test mode) to test operations of the pixel circuits 377, the transistor Q3 becomes off state in accordance with the compulsory off signal Doff, and the transistor Q8a becomes on state in accordance with the reversion of the test signal TS to H level. As a result, the anode layer of the organic EL element 10 is connected to the earth line through the transistor Q8a. Furthermore, the drain terminal of the transistor Q8b is connected to the data line DL. Moreover, when the test signal TS is reversed to H level in the test mode, the transistor Q8b becomes on state. As a result, the data line DL is connected to the earth line through the transistor Q8b. At that time, if the transistors Q1a and Q1b become on state, the gate voltage of the transistor Q2a compulsorily is changed to the ground potential. In the test mode, by making the selection signal XWi or the data signal Dj, or the holding signal XHi to reach a predetermined level, the leak current of the pixel circuits 377 or the potential holding property of the capacitor C0 can be tested. In the test mode, the count value of the pixel counter 374 is set to plural values greater than "p", and the tests for contents assigned to the numerical values are carried out. Furthermore, p channel type transistors may be employed as the transistors Q8a and Q8b.

Next, the operation of each pixel circuit 377 will be described. Herein, although the operation of one pixel circuit 377 situated in the i-th row and the j-th column will be described, this operation is common to all the pixel circuits 377.

First, when the selection signal XWi supplied from the pixel decoder 371 is reversed to L level at the starting point of time of the horizontal scanning period, the transistors Q1a and Q1b of all the pixel circuits 377 belonging to the i-th row become on state. As a result, the current corresponding to the data signal Dj flows through the transistor Q2a, and the electrical charge corresponding to the current is accumulated in the capacitor C0. On the other hand, when the light-emitting control signal XGCi is reversed to H level at the starting point of time of the horizontal scanning period, the transistor Q3 becomes off state. Therefore, no current flows through the organic EL element 10 during charging the capacitor C0. Furthermore, the holding control signal XHi is reversed to H level at a timing when the amount of a predetermined time elapses after the selection signal XWi is reversed to L level, so that the transistor Q7 becomes off state.

Subsequently, when the selection signal XWi is reversed to H level at the finishing point of time of the horizontal scanning period, the transistors Q1a and Q1b of all the pixel circuits 377 belonging to the i-th row become off state. On the other hand, when the light-emitting control signal XGCi is reversed to L level at the finishing point of time of the horizontal scanning period, the transistors Q3 of all the pixel circuits 377 belonging to the i-th row become on state. As a result, the driving current Ie1, corresponding to the voltage held in the capacitor C0, is supplied to the organic EL element 10 through the transistors Q2b and Q3. Thus, the organic EL element 10 emits light with brightness corresponding to the magnitude of the driving current Ie1.

Furthermore, when the holding control signal XHi is reversed to L level at the point of time later in the amount of a predetermined time from the finishing point of time of the horizontal scanning period, the transistors Q7, of all the pixel circuits 377 belonging to the i-th row, become on state. Therefore, the gate voltage of the transistor Q2b is constantly maintained by the analog memory portion 377a.

In addition, as described above, the compulsory off signal Doff is supplied to the pixel decoder 371 from the controlling IC chip 31. When the compulsory off signal Doff is reversed to H level, the pixel decoder 371 reverses all the light-emitting control signals XGC1, XGC2, . . . , XGCp to H level. As a result, the transistors Q3 of all the pixel circuits 377 in the pixel-driving IC chip 37 become off state. Thus, all the organic EL elements 10 stop emitting light in accordance with the compulsory off signal Doff.

Selecting Operation of Pixel Circuit

Next, the selecting operation of the pixel circuits 377 carried out on the basis of the above configurations will be described in detail.

First, as shown in FIG. 6, the reset signal RSET supplied from the controlling IC chip 31 to the respective scanning IC chips 33 is at H level for a predetermined time period. Each scanning IC chip 33 sets the enable signal EOk, which will be supplied to the scanning IC chip 33 at the next stage, to L level, in synchronization with the rise of the reset signal RSET. Furthermore, each scanning IC chip 33 reverses the local reset signal RS supplied to the first pixel-driving IC chip group 370a and the second pixel-driving IC chip group 370b to H level for a predetermined time period. As a result, the pixel counter 374 included in each pixel-driving IC chip group resets the count value to "0".

On the other hand, by reversing the chip-selecting clock signal YECL to H level at a first time of the data writing period, the first-stage scanning IC chip 33 is selected. This scanning IC chip 33 outputs a clock pulse of the first local clock signal SCKa1, on the basis of the clock signal YSCL supplied from the controlling IC chip 31. This first local clock signal SCKa1 is supplied to the first pixel-driving IC chip group 370*a* through the first local clock signal line LCa1.

Furthermore, the pixel counter 374 of the pixel circuits 377, belonging to the first pixel-driving IC chip group 370*a*, increases the count value from "0" to "1" in synchronization with the first rise of the clock pulse in the first local clock signal LCa1. On the other hand, the pixel decoder 371 selects the pixel circuits 377 in the first row corresponding to the count value "1", and carries out the operation (hereinafter, referred to as "selecting operation") to make the current corresponding to the data signal Dj flow to the organic EL elements 10 corresponding to these pixel circuits 377.

That is, the pixel decoder 371 reverses the selection signal XW1 corresponding to the count value "1" to L level for one horizontal scanning period. As a result, the transistors Q1*a* and Q2*a* of all the pixel circuits 377 belonging to the first row become on state. That is, all the pixel circuits 377 belonging to the first row are selected. As a result, the electrical charge corresponding to the current of the data signal Dj are charged in the capacitor C0.

Furthermore, in a time period in which the pixel circuits 377 in one row are selected, the pixel decoder 371 makes the transistors become off state by making the holding control signal XH1 be at H level, and makes the transistor Q3 become off state by making the light-emitting control signal XGC1 be at H level.

On the other hand, if one horizontal scanning period elapses by reversing the selection signal to L level, the pixel decoder 371 reverses the selection signal XW1 to H level. As a result, the transistors Q1*a* and Q1*b* become off state in all the pixel circuits 377 belonging to the first row. Furthermore, the pixel decoder 371 reverses the holding control signal XH1 to L level at a later timing slightly delayed from the rise of the selection signal XW1. As a result, the transistors Q7 of the pixel circuits 377 belonging to the first row become on state.

Furthermore, the pixel decoder 371 reverses the light-emitting control signal XGC1 to L level at the same time of the rise of the selection signal XW1. As a result, the transistors Q3 of the pixel circuits 377 belonging to the first row become on state.

According to the above operation, the current Ie1 corresponding to the voltage held in the capacitor C0 flows between the sources and the drains of the transistors Q2*b* in all the pixel circuits 377 belonging to the first row. Therefore, the organic EL elements 10 emit light with the brightness (gray scale) corresponding to the data signal Dj.

By doing so, if the selecting operation for the pixel circuits 377 in the first row is completed, the pixel counter 374 increases the count value from "1" to "2". In addition, in the second horizontal scanning period, the same selecting operation as described above is carried out for the pixel circuits 377 in the second row, belonging to the first pixel-driving IC chip group 370*a*. Next, the same selecting operation as described above is carried out for the pixel circuits 377 in the p-th row, belonging to the first pixel-driving IC chip group 370*a*. That is, whenever the pixel counter 374 increases the count value by "1" at the starting point of time of each horizontal scanning period, the selecting operation is carried out for the pixel circuits 377 in the row specified by the count value. Generally, when the count value by the pixel counter 374 is "k", the pixel circuits 377 in the k-th row, belonging to the first pixel-driving IC chip group 370*a*, are selected, and the organic EL elements 10 corresponding to these pixel circuits 377 emit light with the brightness in accordance with the data signal Dj.

Next, when the selecting operation is completed for all the pixel circuits 377 in the p number of rows belonging to the first pixel-driving IC chip group 370*a*, the first-stage scanning IC chip 33 outputs the clock pulse of the second local clock signal SCKb1 on the basis of the clock signal YSCL. The second local clock signal SCKb1 is supplied to the second pixel-driving IC chip group 370*b* through the second local clock signal line LCb1. And then, in the respective pixel-driving IC chips 37, belonging to the second pixel-driving IC chip group 370*b*, the same selecting operation as described above is repeated for the first pixel-driving IC chip group 370*a*. That is, the respective rows of the pixel circuits 377 belonging to the second pixel-driving IC chip group 370*b* are selected for every horizontal scanning period, and the organic EL elements 10 corresponding to the pixel circuits 377 emit light with the brightness in accordance with the data signal Dj.

On the other hand, if the selecting operation is completed for the pixel circuits 377 in the p-th row, belonging to the second pixel-driving IC chip group 370*b*, the first-stage scanning IC chip 33 reverses the enable signal EO1 supplied to the second-stage scanning IC chip 33 to H level. By doing so, the aforementioned selecting operation is sequentially carried out for the first pixel-driving IC chip group 370*a* (the pixel-driving IC chips 37 in the third row) and the second pixel-driving IC chip group 370*b* (the pixel-driving IC chips 37 in the fourth row) corresponding to the second-stage scanning IC chip 33. Thereafter, similarly, the scanning IC chip 33 is selected by the chip-selecting clock signal YECL and the enable signal EO, and the same selecting operation as described above is sequentially carried out for the first pixel-driving IC chip group 370*a* and the second pixel-driving IC chip group 370*b* corresponding to the selected scanning IC chip 33. Generally, if the k-th-stage scanning IC chip 33 is selected by the chip-selecting clock signal YECL and the enable signal EOk−1, first, the selecting operation is sequentially carried out for the pixel circuits 377 in the p-th row, belonging to the first pixel-driving IC chip group 370*a* (the pixel-driving IC chip group in the (2k−1)-th row). Then, if the above operation is completed, the selecting operation is sequentially carried out for the pixel circuits 377 in the p-th row belonging to the second pixel-driving IC chip group 370*b* (the pixel-driving IC chip group in the (2k)-th row) corresponding to the k-th-stage scanning IC chip 33. As a result of the above operations, the image corresponding to the image data Xd supplied from the external apparatus is displayed.

According to the scanning IC chips 33 and the pixel-driving IC chips 37 of the present invention, the following advantages can be obtained.

(1) The pixel decoder 371 and the pixel counter 374 to sequentially select the respective pixel circuits 377 are provided in the pixel-driving IC chip 37, and the respective pixel-driving IC chips 37 are connected to the scanning IC chip 33 through the scanning control line group YLk.

Therefore, it is not necessary to provide the scanning control line group YLk for every row of pixel circuit 377. As a result, compared with the related art configuration, in which the scanning line is provided for every row of the pixel circuits 377, the number of the scanning control line groups YLk becomes small, and thus the space which the scanning control line groups YLk occupy can be reduced.

On the other hand, reduction in the number of the scanning control line groups YLk means that wider wires can be formed in the same space as the related art configuration. In this case, since the impedance of the wires is decreased, even if the electro-optical device D has a large screen including a plurality of pixels, a display device having a high quality of display and high brightness can be realized. Furthermore, since the number of pads to connect the driving IC chips to the scanning IC chips 33 becomes small, the size of the pixel-driving IC chip 37 decreases.

(2) Since the respective pixel circuits 377 are tested by means of the test signal TS, the pads (connection terminals) connected to the organic EL elements 10 in the pixel-driving IC chips 37 can become small. That is, when the test for the pixel circuits 377 is carried out by mechanically bringing the probe pin into contact with the pads of the pixel-driving IC chips 37, it is required that the pads of the pixel-driving IC chips 37 have a size enough for probe pins to contact therewith. However, according to this exemplary embodiment, since the pixel circuits 377 are tested by supplying the test signal TS, it is not necessary to bring the probe pin into contact with the pads to be connected to the organic EL elements 10 in the pixel-driving IC chips 37. Therefore, it is possible that the pads in the pixel-driving IC chips 37 have a size much smaller than the size required for the probe pins to contact therewith. Accordingly, since the size of the pixel-driving IC chips 37 can be decreased and the number of wires to connect the respective pixel-driving IC chips 37 with the scanning IC chip 33 can be decreased, a display with higher resolution can be realized.

Furthermore, although the construction has been exemplified in FIG. 5 that one scanning IC chip 33 controls the pixel-driving IC chips 37 of two rows, the number of pixel-driving IC chips 37 assigned to the one scanning IC chip 33 is not limited thereto.

Configuration of Column Data-Converting IC Chip

Next, a configuration of each column data-converting IC chip 35 will be described. As shown in FIG. 2, according to this exemplary embodiment, one column data-converting IC chip 35 is provided to every group of the pixel-driving IC chips 37 in a plurality of columns (herein, referred to as "s" columns). The respective column data-converting IC chips 35 supply the data signals Dj to the pixel circuits 377 included in the pixel-driving IC chips 37 through the data lines DLj.

Figure 9:
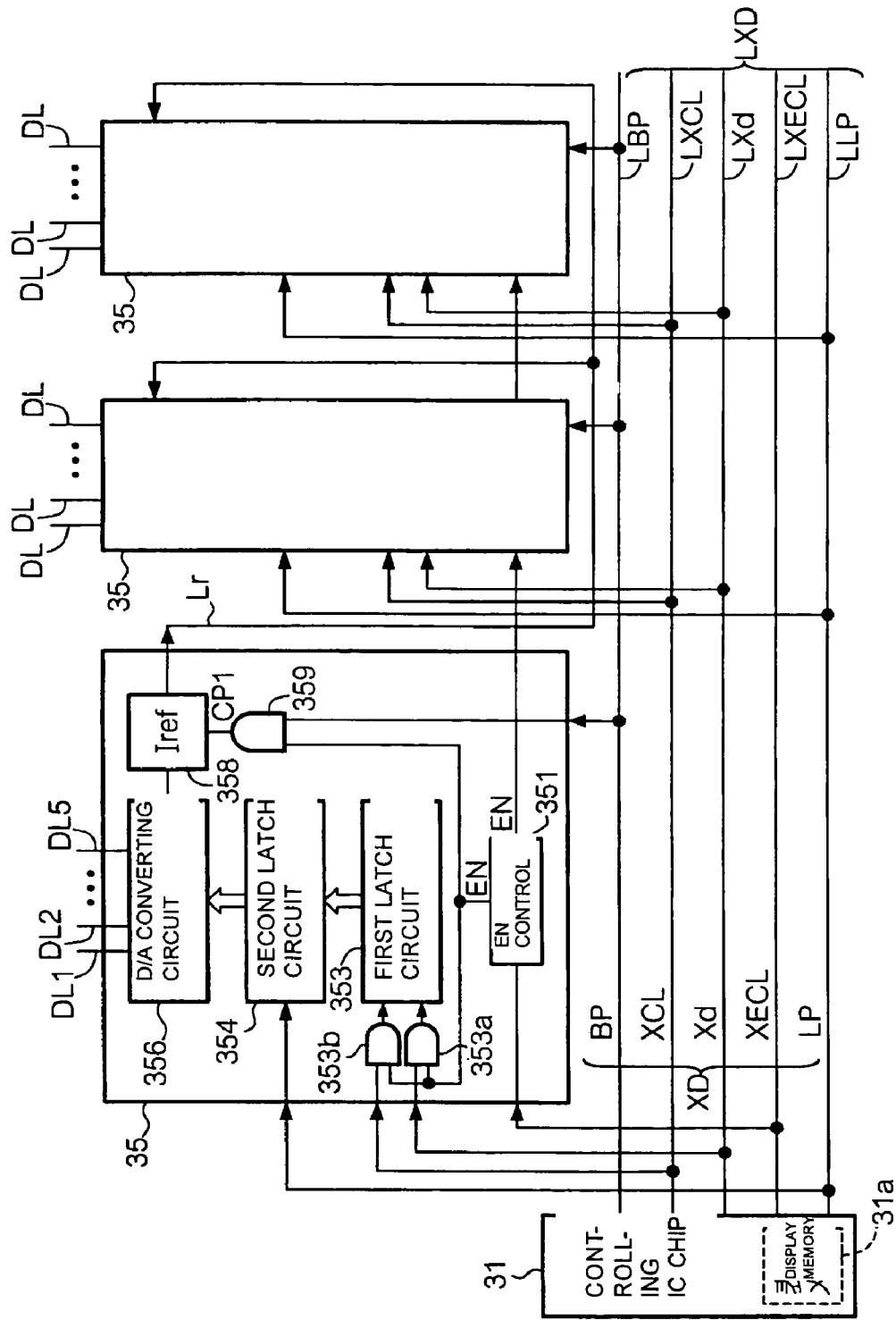
FIG. 9 is a schematic illustrating a configuration of the column data-converting IC chips.

As shown in FIG. 9, the respective column data-converting IC chips 35 have an enable control circuit 351, a first latch circuit 353, a second latch circuit 354, a D/A converting circuit 356, and a standard-current supply circuit 358. Furthermore, although only the configuration of the first-stage column data-converting IC chip 35 is shown in detail in FIG. 9, the column data-converting IC chips 35 of the second or latter stages have the same configuration.

Each of the column data-converting IC chips 35 is connected to the controlling IC chip 31 through the data control line LXD. The data control line LXD includes an enable signal line LXECL, an image data signal line LXd, a clock signal line LXCL, a reference current control line LBP, and a latch pulse signal line LLP.

The enable signal line LXECL is a wire to supply the enable control signal XECL from the controlling IC chip 31 to the enable control circuit 351 in the first-stage column data-converting IC chip 35. The enable control circuit 351 generates an enable signal EN based on the enable control signal XECL. The enable signal EN allows the first latch circuit 353 and the standard-current supply circuit 358 to operate or not to operate. The enable signal EN generated by the enable control circuit 351 is output to the input terminals of AND gates 353a, 353b and 359.

The enable control circuit 351 in each column data-converting IC chip 35 is cascade-connected to the enable control circuit 351 in the next-stage column data-converting IC chip 35. Based on this configuration, the enable control circuits 351 in the column data-converting IC chips 35 of the second or latter stages receive the enable signal EN from the enable control circuits 351 of the previous-stage column data-converting IC chips 35, respectively, and generate the enable signal EN on the basis of the signal.

The output terminal of the AND gate 353a and the output terminal of the AND gate 353b are connected to the first latch circuit 353. The image data Xd is input from the controlling IC chip 31 to the input terminal of the AND gate 353 a through the image data signal line LXd. That is, the AND gate 353a outputs a logical product of the enable signal EN and the image data Xd to the first latch circuit 353. In other words, only in a time period when the enable signal EN is at H level, the image data Xd output from the controlling IC chip 31 is supplied to the first latch circuit 353 through the AND gate 353a. On the other hand, the clock signal XCL is input from the controlling IC chip 31 to the input terminal of the AND gate 353b through the clock signal line LXCL. That is, the AND gate 353b outputs a logical product of the enable signal EN and the clock signal XCL to the first latch circuit 353. In other words, only in a time period when the enable signal EN is at H level, the clock signal XCL output from the controlling IC chip 31 is supplied to the first latch circuit 353 through the AND gate 353b. The clock signal XCL is a so-called dot clock. Based on the above configuration, in the time period when the enable signal EN is at H level, the first latch circuit 353 sequentially holds the image data Xd in synchronization with the clock signal XCL. On the other hand, the enable signal EN is reversed to L level at a point of time when the image data Xd for the "s" pixel circuits 377 are taken in the first latch circuit 353. Therefore, the first latch circuit 353 accepts the image data Xd for the "s" pixel circuits 377.

The output terminal of the first latch circuit 353 is connected to the input terminal of the second latch circuit 354. On the other hand, the output terminal of the second latch circuit 354 is connected to the input terminal of the D/A converting circuit 356. Furthermore, the latch pulse signal LP is input from the controlling IC chip 31 to the second latch circuit 354 through the latch pulse signal line LLP. The latch pulse signal LP is a signal which is reversed to H level at the starting point of the horizontal scanning period. The second latch circuit 354 simultaneously accepts the image data Xd for the "s" pixel circuits 377 held in the first latch circuit 353 at the rise of the latch pulse signal LP, and outputs the accepted image data Xd to the D/A converting circuit 356. That is, the first latch circuit 353 and the second latch circuit 354 carry out a serial/parallel conversion.

The D/A converting circuit 356 is a circuit to output the current corresponding to the image data output from the second latch circuit 354 to the "s" data lines as the data signal Dj. That is, the D/A converting circuit 356 converts the image data Xd output from the second latch circuit 354 into an analog data signal Dj, and then outputs the analog data signal Dj to the data lines DLj. The D/A converting circuit 356 of this exemplary embodiment converts the image data Xd into the data signal Dj on the basis of the standard current Ir supplied from the standard-current supply circuit 358.

As shown in FIG. 9, the output terminal of the AND gate 359 is connected to the standard-current supply circuit 358. The standard current writing signal BP is input from the controlling IC chip 31 to the input terminal of the AND gate 359 through the reference current control line LBP. The AND gate 359 computes the logical product of the enable signal EN and the standard current writing signal BP, and outputs the result as the control pulse signal CP. In other words, only in a time period when the enable signal EN is at H level, the standard current writing signal BP output from the controlling IC chip 31 is supplied to the standard-current supply circuit 358 through the AND gate 359 as the control pulse signal CP. The standard current writing signal BP is a signal to instruct the standard-current supply circuit 358 to generate the standard current Ir. Furthermore, in this exemplary embodiment, the approval or disapproval of the accepting operation of the image data Xd by the first latch circuit 353, and the approval or disapproval of the generating operation of the standard current Ir by the standard-current supply circuit 358 are controlled by the common enable signal EN. However, a construction in which the approvals or disapprovals of the operations are controlled by separate signals may be employed.

Figure 10:
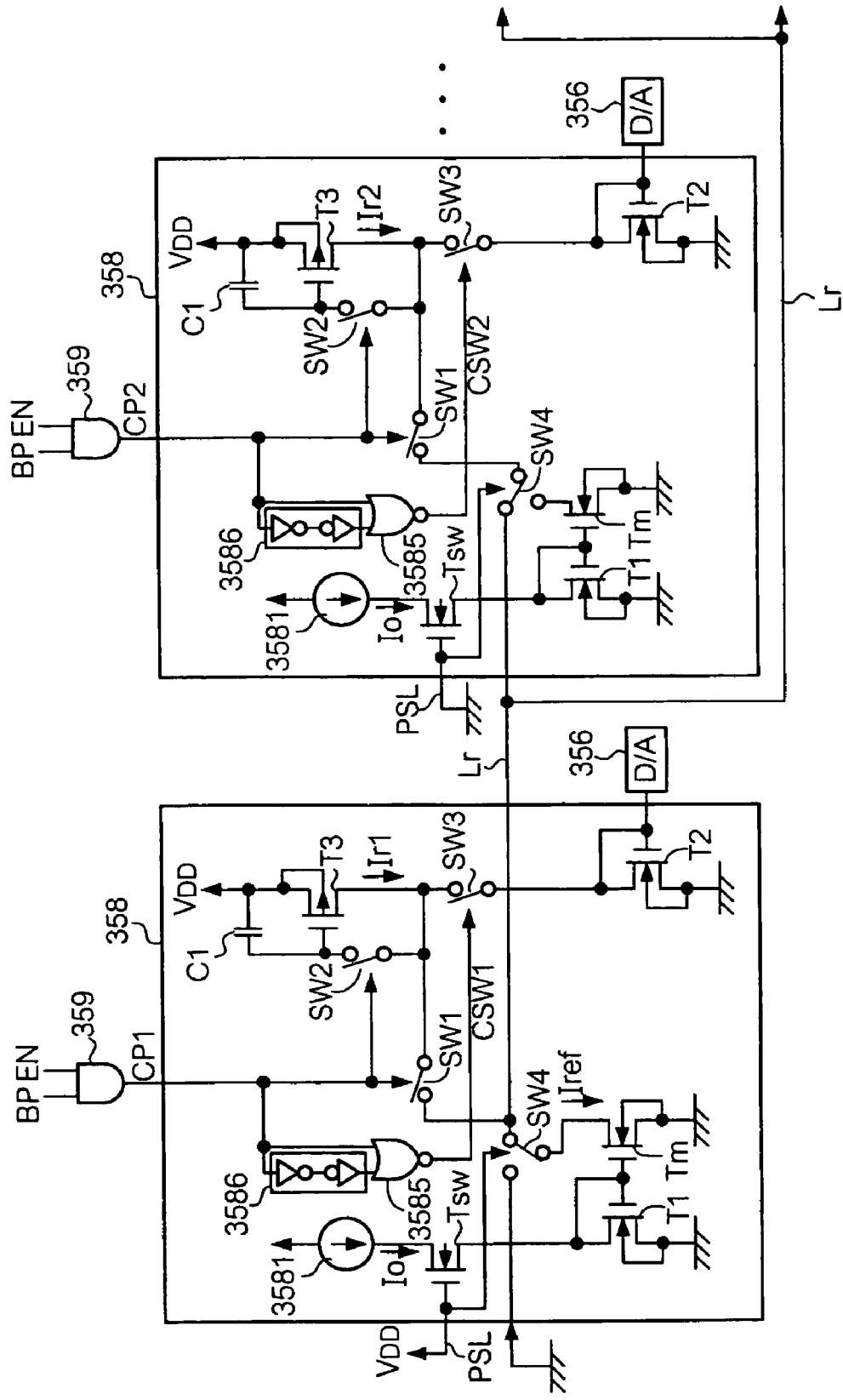
FIG. 10 is a circuit schematic illustrating a configuration of the standard-current supply circuits.

Next, FIG. 10 is a view illustrating the configuration of the standard-current supply circuit 358 in the respective column data-converting IC chips 35. Furthermore, although only the standard-current supply circuits 358 included in the first-stage and second-stage column data-converting IC chips 35 are shown in FIG. 10, the standard-current supply circuits 358 of other column data-converting IC chips 35 have the same configuration. Moreover, hereinafter, the standard-current supply circuit 358 included in the first-stage column data-converting IC chip 35 is simply referred to as "first-stage standard-current supply circuit 358", and the respective standard-current supply circuits 358 included in a plurality of column data-converting IC chips 35 of the second or latter stages are simply referred to as "second-or-latter-stage standard-current supply circuits 358".

As shown in FIG. 10, the respective standard-current supply circuits 358 have a static current source 3581, a capacitor C1, and first to fourth switching devices SW1 to SW4. Furthermore, the respective standard-current supply circuits 358 have transistors Tsw, T1, T2, T3, and Tm. The transistors Tsw, T1, T2, and Tm are n channel type FETs (Field Effect Transistors). On the other hand, the transistor T3 is a p channel type FET.

The configurations of the second-or-latter-stage standard-current supply circuits 358 are the same as that of the first-stage standard-current supply circuit 358. However, the second-or-latter-stage standard-current supply circuits 358 and the first-stage standard-current supply circuit 358 have different connection condition for the fourth switching device SW4. That is, in the first-stage standard-current supply circuit 358, the power source potential of high potential (VDD) is applied to the gate terminal of the transistor Tsw and the fourth switching device SW4. Therefore, in the first-stage standard-current supply circuit 358, the transistor Tsw is always in on state, and the drain terminal of the transistor Tm is always connected to one end of the first switching device SW1 through the fourth switching device SW4. On the contrary, in the second-or-latter-stage standard-current supply circuits 358, the power source potential of low potential (ground potential) is applied to the gate terminal of the transistor Tsw and the fourth switching device SW4. Therefore, in the second-or-latter-stage standard-current supply circuits 358, the transistor Tsw is always in off state, and the drain terminal of the transistor Tm is always disconnected from one end of the first switching device SW1. Thus, in the second-or-latter-stage standard-current supply circuits 358, the static current source 3581, the transistor T1, and the transistor Tm do not participate in operation.

The static current source 3581 generates a static current Io and supplies the static current Io to the drain terminal of the transistor Tsw. The source terminal of the transistor Tsw is connected to the drain terminal of the transistor T1. The transistor T1 is diode-connected, and the source terminal thereof is connected to ground. Furthermore, the gate terminal of the transistor T1 is connected to the gate terminal of the transistor Tm. Therefore, the transistor T1 and the transistor Tm constitute a current mirror circuit. That is, the reference current Iref corresponding to the static current Io flowing through the transistor T1 flows in the transistor Tm. The source terminal of the transistor Tm is connected to ground.

The drain terminal of the transistor Tm is connected to one end of the first switching device SW1 through the fourth switching device SW4. The other end of the first switching device SW1 is connected to one end of the second switching device SW2 and the drain terminal of the transistor T3. The other end of the second switching device SW2 is connected to the gate terminal of the transistor T3. One end of the capacitor C1 is connected to the gate terminal of the transistor T3. The other end of the capacitor C1 and the source terminal of the transistor T3 are connected to the power source line.

On the other hand, the drain terminal of the transistor T3 is connected to one end of the third switching device SW3. The other end of the third switching device SW3 is connected to the drain terminal of the transistor T2. The source terminal of the transistor T2 is grounded.

Furthermore, the first switching device SW1 and the second switching device SW2 are switched into any one of the on state and the off state in accordance with the control pulse signals CP (CP1, CP2, . . . ). More specifically, each of the first and second switching devices SW1 and SW2 becomes on state when the control pulse signal CP is at H level, and becomes off state when the control pulse signal CP is at L level.

Figure 11:
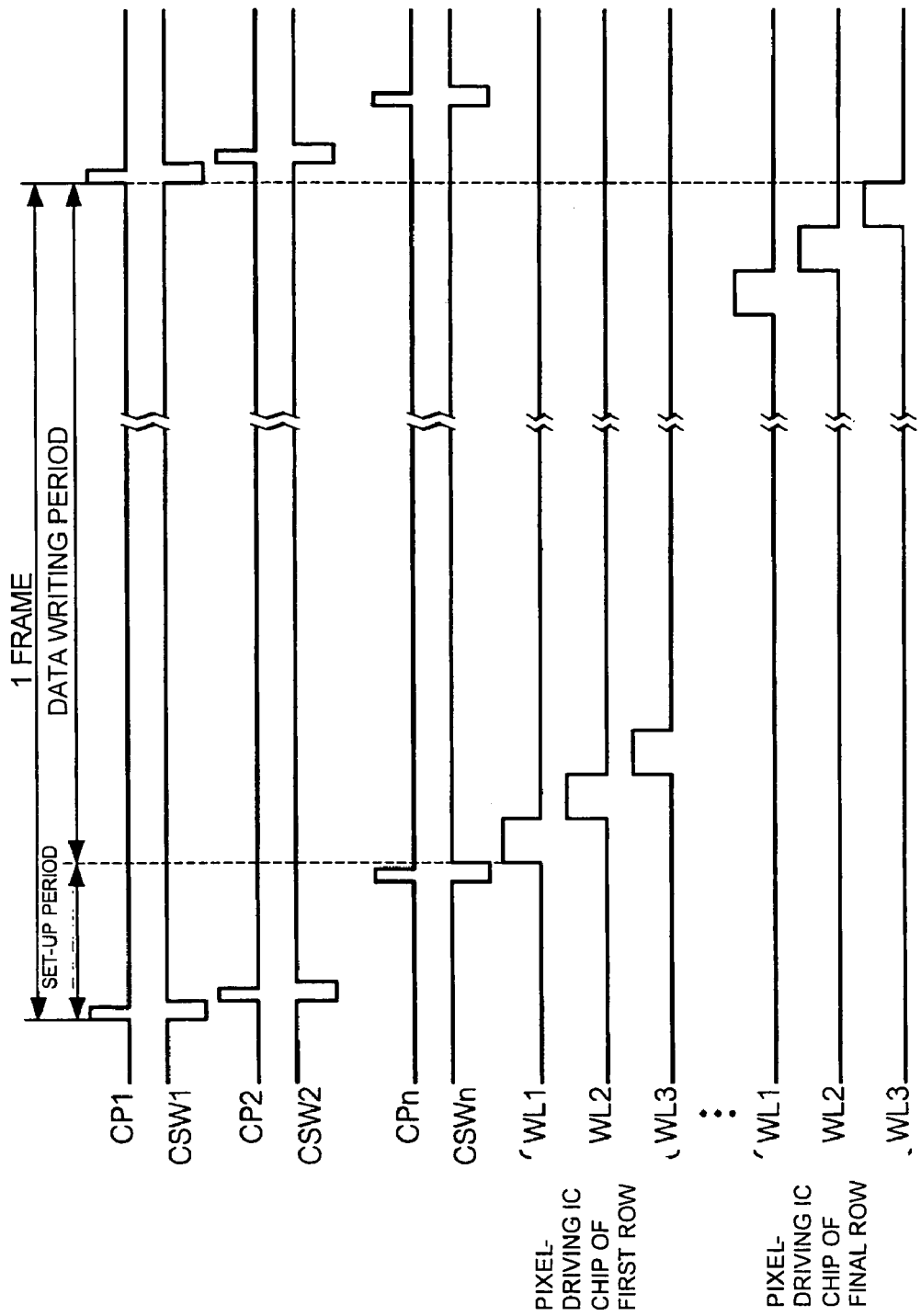
FIG. 11 is a timing chart illustrating operations for a set-up time.

Moreover, the third switching device SW3 is switched into any one of the on state and the off state in accordance with the control inverted-pulse signals CSW (CSW1, CSW2, . . . ). The control inverted-pulse signal CSW is a signal to reverse the level of the control pulse signal CP and then delaying the signal. That is, the control pulse signal CP is input to a gate circuit including a delay circuit 3586 and an NOR gate 3585, and the output signal from the gate circuit is supplied to the third switching device SW3 as the control inverted-pulse signal CSW. More specifically, as shown in FIG. 11, when the control pulse signal CP is at H level, the control inverted-pulse signal CSW is at L level. At that time, the third switching device SW3 is in off state. On the other hand, the control inverted-pulse signal CSW becomes H level at a little later point of time after the control pulse signal CP is reversed to L level. At that time, the third switching device SW3 is in on state.

Based on the configuration described above, when the enable signal EN and the standard current writing signal BP are all at H level, the control pulse signal CP is at H level, and the first and second switching devices SW1 and SW2 are all in on state. At that time, in the first-stage standard-current supply circuit 358, the current having a magnitude proportional to the static current Io, generated by the static current source 3581, flows through the transistor Tm, and the first and second switching devices SW1 and SW2, and the electrical charge corresponding to the current is accumulated in the capacitor C1. On the other hand, since the third switching device SW3 is in off state, the current does not flow through the second transistor T2.

Next, when the control pulse signal CP is reversed to L level, the first and second switching devices SW1 and SW2 are in off state, and the third switching device SW3 is in on state. As a result, the standard current Ir1, corresponding to the electrical charge accumulated in the capacitor C1, that is, the gate voltage of the transistor T3, flows through the transistor T3. The standard current Ir1 is supplied to the transistor T2.

On the other hand, one end of the first switching device SW1 in the first-stage standard-current supply circuit 358 is connected to one ends of the fourth switching device SW4 in all the second-or-latter-stage standard-current supply circuits 358 through the standard current supply line Lr. Therefore, in the first-stage standard-current supply circuit 358, when the first and second switching devices SW1 and SW2 are in off state, the reference current Iref is supplied to all the second-or-latter-stage standard-current supply circuits 358 through the standard current supply line Lr. In addition, the electrical charge, corresponding to the reference current Iref supplied through the standard current supply line Lr, is accumulated in the capacitor C1 in each of the second-or-latter-stage standard-current supply circuits 358.

As described above, in this exemplary embodiment, the reference current Iref proportional to the static current Io, which is output from the static current source 3581 in one column data-converting IC chip 35, is supplied to the standard-current supply circuits 358 in other column data-converting IC chips 35. Therefore, the magnitudes of the standard current Ir used in all the column data-converting IC chips 35 are equal. Furthermore, other devices (for example, nonvolatile memory having the same function as the capacitor C1) having a function of holding the standard current Ir may be employed instead of the capacitor C1 shown in FIG. 10.

Next, with reference to FIGS. 12 and 13, a specific configuration of the D/A converting circuit 356 will be described. Furthermore, although the D/A converting circuit 356 in the first-stage column data-converting IC chip 35 is shown in FIG. 12, the D/A converting circuits 356 in other column data-converting IC chips 35 also have the same configuration.

Figure 12:
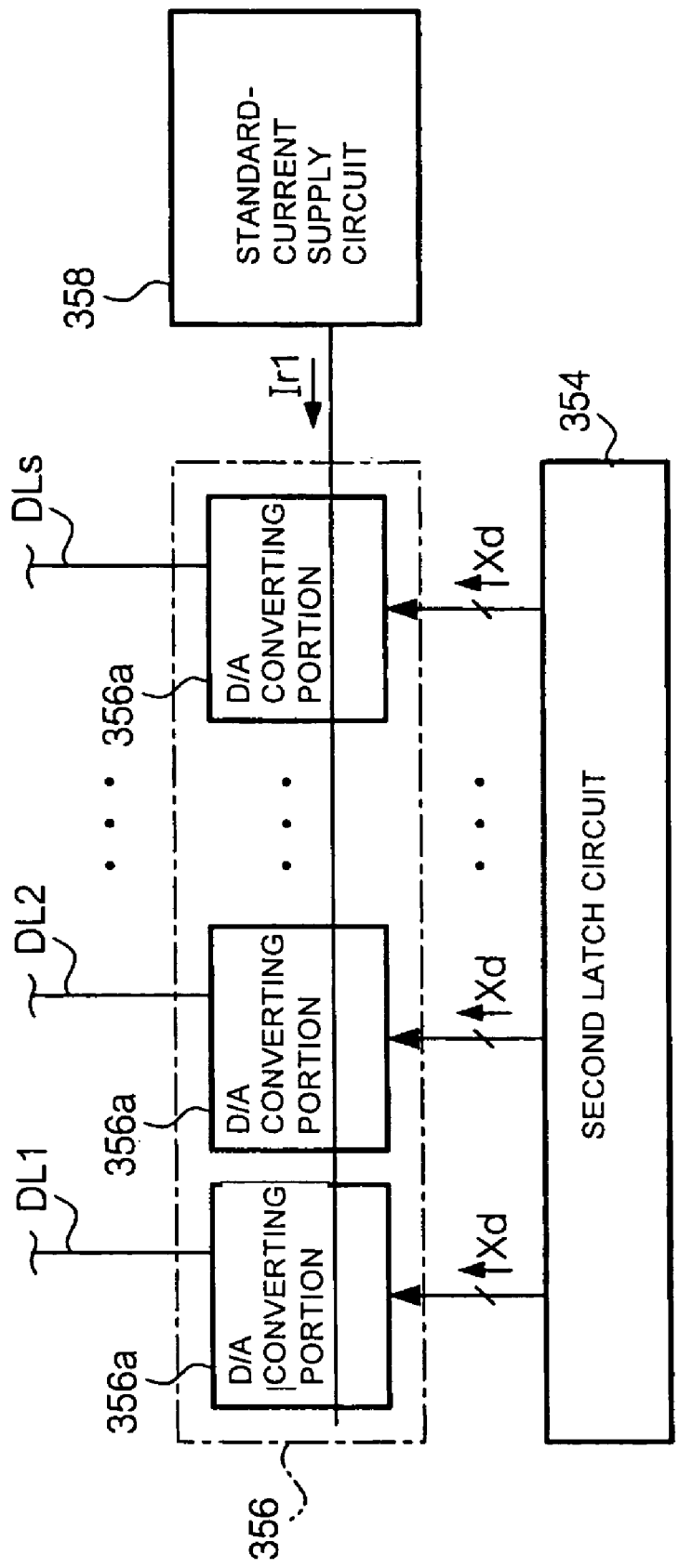
FIG. 12 is a schematic illustrating a configuration of a D/A converting circuit.

As shown in FIG. 12, the D/A converting circuit 356, in each of the column data-converting IC chips 35, has the "s" D/A converting portions 356a corresponding to the number of data lines assigned to the column data-converting IC chip 35. The current Ir1, output from the standard-current supply circuit 358, is supplied to each of the "s" D/A converting portions 356a. Each D/A converting portion 356a receives the image data Xd corresponding to one pixel circuit 377 from the second latch circuit 354. Then, each D/A converting portion 356a converts the image data into the data signal Dj on the basis of the current Ir1, and outputs the resultant data signal Dj to the data line XLj. Furthermore, in this exemplary embodiment, the image data Xd is a 6-bit data.

Figure 13:
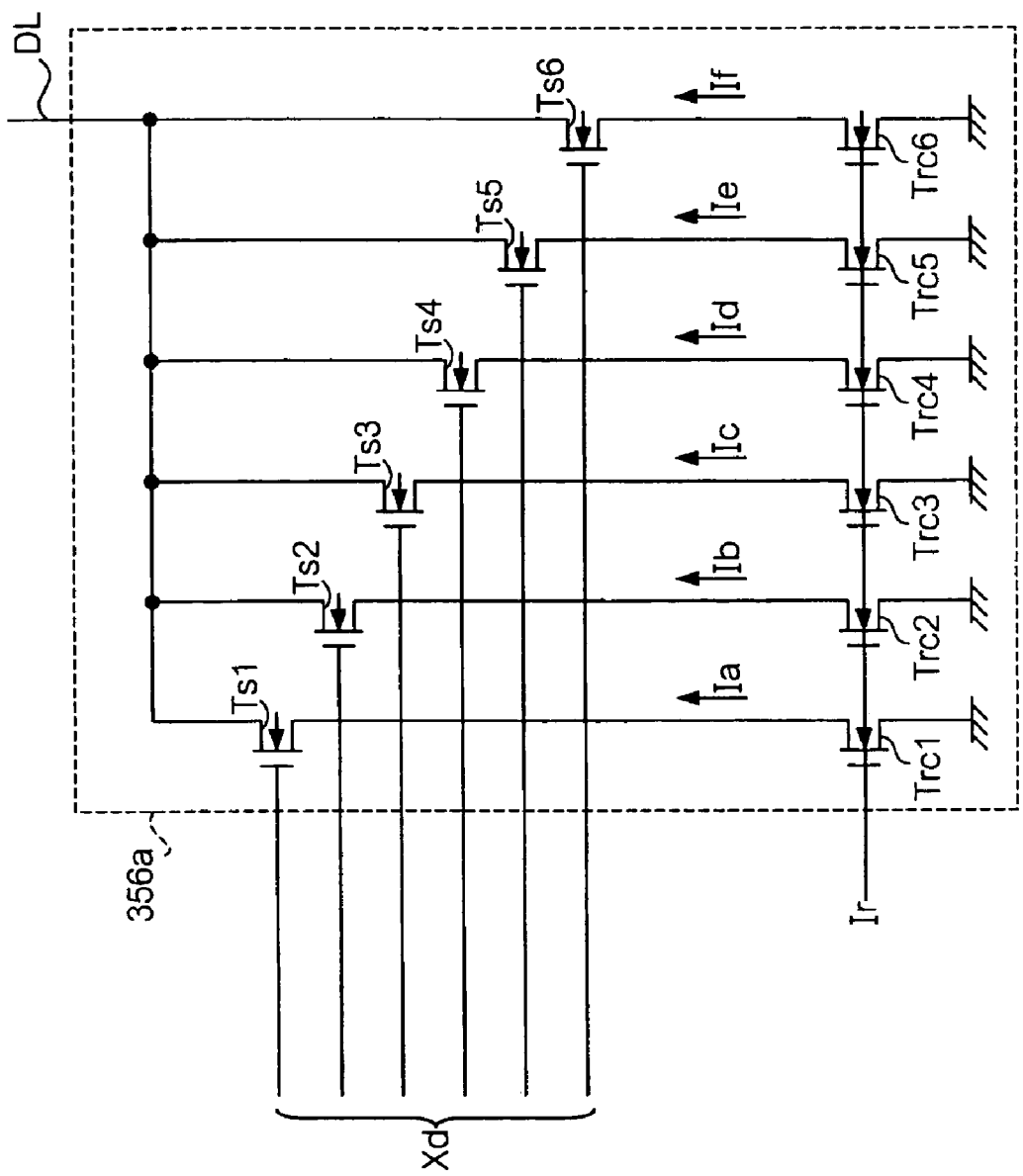
FIG. 13 is a circuit schematic illustrating a configuration of a D/A converting portion.

Next, FIG. 13 is a schematic illustrating the configuration of each D/A converting portion 356a. As shown in FIG. 13, the D/A converting portion 356a has 6 transistors Trc1 to Trc6, and 6 transistors Ts1 to Ts6.

The gate terminals of the transistors Trc1 to Trc6 are connected to the gate terminal of the transistor T2 in the standard-current supply circuit 358. Therefore, each of the transistors Trc1 to Trc6 constitutes a current mirror circuit along with the transistor T2. By this configuration, each of the transistors Trc1 to Trc6 functions as a static current source to output a predetermined current value. In this exemplary embodiment, the sizes of the respective transistors Trc1 to Trc6 are selected such that the output current ratio (Ia:Ib:Ic:Id:Ie:If) of the transistors Trc1 to Trc6 is 1:2:4:8:16:32.

The drain terminals of the transistors Ts1 to Ts6 are connected to the transistors Trc1 to Trc6, respectively. Furthermore, the source terminals of the transistors Ts1 to Ts6 are connected to one data line XLj. On the other hand, each bit of the image data Xd output from the second latch circuit 354 are supplied to the transistors Ts1 to Ts6, respectively. Specifically, the least significant bit of the image data Xd is supplied to the transistor Ts1. The most significant bit of the image data Xd is supplied to the transistor Ts6. By this configuration, the transistors Ts1 to Ts6 are switched to any one of the on state and the off state in accordance with each bit of the image data supplied from the second latch circuit 354.

Based on the configuration described above, the current output from the transistors Trc1 to Trc6 are selectively supplied to the data lines XLj in accordance with the states of the transistors Ts1 to Ts6. As a result, the current corresponding to the image data Xd flows through the data lines XLj as the data signal Dj. As apparently known from the output current ratio of the respective transistors Trc1 to Trc6, the current value of the data signal Dj can be selected from sixty four values. Therefore, the brightness of the organic El elements 10 can be controlled to sixty four gray scales in accordance with the six-bit image data Xd.

Operation of Column Data-Converting IC Chip

Next, the supplying operation of data signal Dj, performed based on the configuration explained above, will be described. As described above, the respective pixel circuits 377 are sequentially selected for one data writing period. Then, supplying the data signal Dj from the column data-converting IC chip 35 to the respective pixel circuits 377 is sequentially carried out for one frame (horizontal scanning period) in synchronization with the scanning of the pixel circuits 377. Furthermore, in this exemplary embodiment, as shown in FIG. 11, the charging of the capacitor C1 in the respective standard-current supply circuits 358 is sequentially carried out for each data writing period, that is, a portion of time period (hereinafter, referred to as "set-up period") in each frame. In addition, the display of images is executed in a period other than the period for supplying the data signal to the pixel circuits 377. That is, the display of image may be executed for both of the set-up period and the data writing period.

First, when the set-up period starts, the standard current writing signal BP to be supplied to the first-stage column data-converting IC chip 35, and the enable signal EN generated by the enable control circuit 351 are simultaneously reversed to H level. Accordingly, when the control pulse signal CP1 is transferred to H level, the first and second switching devices SW1 and SW2, in the first-stage standard-current supply circuit 358, are in on state. On the other hand, as shown in FIG. 11, the control inverted-pulse signal CSW1 is reversed to L level in accordance with the reversion of level of the control pulse signal CP1. Therefore, the third switching device SW3 in the first-stage standard-current supply circuit 358 is in off state. As a result, the electrical charge corresponding to the static current Io supplied from the static current source 3581 is accumulated in the capacitor C1 in the first-stage standard-current supply circuit 358.

Next, as shown in FIG. 1, the control pulse signal CP 1 is reversed to L level. Accordingly, the first and second switching devices SW1 and SW2 in the first-stage standard-current supply circuit 358 are in off state. In addition, at that time, the control inverted-pulse signal CSW1 is reversed to H level. Therefore, the third switching device SW3, in the first-stage standard-current supply circuit 358, is in on state. As a result, it is completed to charge the capacitor C1 in the first-stage standard-current supply circuit 358.

Subsequently, the standard current writing signal BP to be supplied to the second-stage column data-converting IC chip 35, and the enable signal EN generated in the enable control circuit 351 in the column data-converting IC chip 35 are simultaneously reversed to H level. Accordingly, when the control pulse signal CP2 is reversed to H level, the first and second switching devices SW1 and SW2 in the second-stage standard-current supply circuit 358 are in on state. In addition, at that time, the control inverted-pulse signal CSW2 is reversed to L level, and the third switching device SW3 in the second-stage standard-current supply circuit 358 is in off state. As a result, the reference current Iref, which corresponds to the static current Io, in the first-stage column data-converting IC chip 358, is supplied to the second-stage column data-converting IC chip 35 through the standard current supply line Lr. Then, the electrical charge, corresponding to the reference current Iref, is accumulated in the capacitor C1 in the second-stage column data converting IC chips 35.

Next, as shown in FIG. 11, the control pulse signal CP2 is reversed to L level, and the control inverted-pulse signal CSW2 is reversed to H level. Accordingly, the first and second switching devices SW1 and SW2 in the second-stage standard-current supply circuit 358 are in off state, and the third switching device SW3 is in on state. As a result, it is completed to charge the capacitor C1 in the second-stage standard-current supply circuit 358.

Thereafter, the same operation as described above is executed in other column data-converting IC chips 35. As a result, at the finish point of time in the set-up period, the electrical charge corresponding to the reference current Iref supplied from the first-stage standard-current supply circuit 358 is accumulated in the capacitors C1 in all the second-or-latter standard-current supply circuits 358. That is, the reference current Iref supplied from the first-stage standard-current supply circuit 358 is sequentially supplied to the capacitors C1 of the respective standard-current supply circuits 358 in time division. In addition, although a case in which one set-up period is provided to every frame has been exemplified in this exemplary embodiment, a configuration in which one set-up period is provided to every plurality of frames may be employed. Or, a configuration in which the capacitor C1 in each of the standard-current supply circuits 358 is charged for an interval period (a period of time corresponding to the flyback period of the line sequential scanning) when the D/A converting circuits 356 output the data signals Dj may be employed. That is, one set-up period may disperse in a plurality of frames or disperse in one frame time, but it is preferable that the charging of the capacitors C1 for the set-up period be executed in the flyback period.

On the other hand, in the data writing period subsequent to the set-up period, the column data-converting IC chips 35 output the data signals in synchronization with the scanning of the pixel circuits 377 in the respective rows. That is, in the respective column data-converting IC chips 35, the data signal Dj is generated using the standard current Ir (Ir1, Ir2, . . . ), which corresponds to the electrical charge of the capacitor C1 in the standard-current supply circuit 358, as a standard value, and the data signal Dj is supplied to the currently selected pixel circuits 377. The operation of scanning the pixel circuits 377 or the associated operation of the pixel circuits 377 accordingly is as described above.

With the column data-converting IC chips 35 according to this exemplary embodiment, the following advantages are obtained.

(1) In this exemplary embodiment, the reference current Iref is supplied from the first-stage standard-current supply circuit 358 to all the second-or-latter-stage standard-current supply circuits 358. Then, the respective standard-current supply circuits 358 supply the standard current Ir, corresponding to the reference current Iref, to the D/A converting circuits 356. By this configuration, the magnitudes of the standard current Ir in all the standard-current supply circuits 358 are equal. Thus, the output error of the data signal Dj output from the respective column data-converting IC chips 35 is suppressed. As a result, a problem in which vertical stripes are generated in a portion of display image, which corresponds to a boundary of the column data-converting IC chips 35, can be prevented.

(2) In this exemplary embodiment, the first-stage column data converting IC chip 35 and the second-or-latter-stage column data-converting IC chips 35 have the same configuration. Therefore, in manufacturing the electro-optical device D, it is not necessary to distinguish the first-stage column data-converting IC chip 35 and the second-or-latter-stage column data-converting IC chips 35. Therefore, even if a configuration in which the reference current Iref is output from the first-stage column data-converting IC chip 35 to other column data-converting IC chips 35 has been employed, the manufacturing cost does not increase largely as compared with the related art electro-optical devices.

Furthermore, the D/A converting circuit 356 or the standard-current supply circuit 358 may be provided in the pixel-driving IC chip 37. By this configuration, the same advantages as described above can be also obtained.

B: Stacked Structure of Electro-Optical Device and Manufacturing Method Thereof

Next, the stacked structure of the electro-optical device D and the manufacturing method thereof, according to the present invention will be described. Hereinafter, three kinds of electro-optical devices, in which their manufacturing methods are different, will be exemplified, and the stacked structures and the manufacturing methods of the respective electro-optical devices will be explained. In addition, when the pixel-driving IC chip 37, the controlling IC chip 31, the scanning IC chip 33, and the column data-converting IC chip 35 are not specifically distinguished, these are called generically as "IC chips 30".

Stacked Structure by First Manufacturing Method

Figure 14:
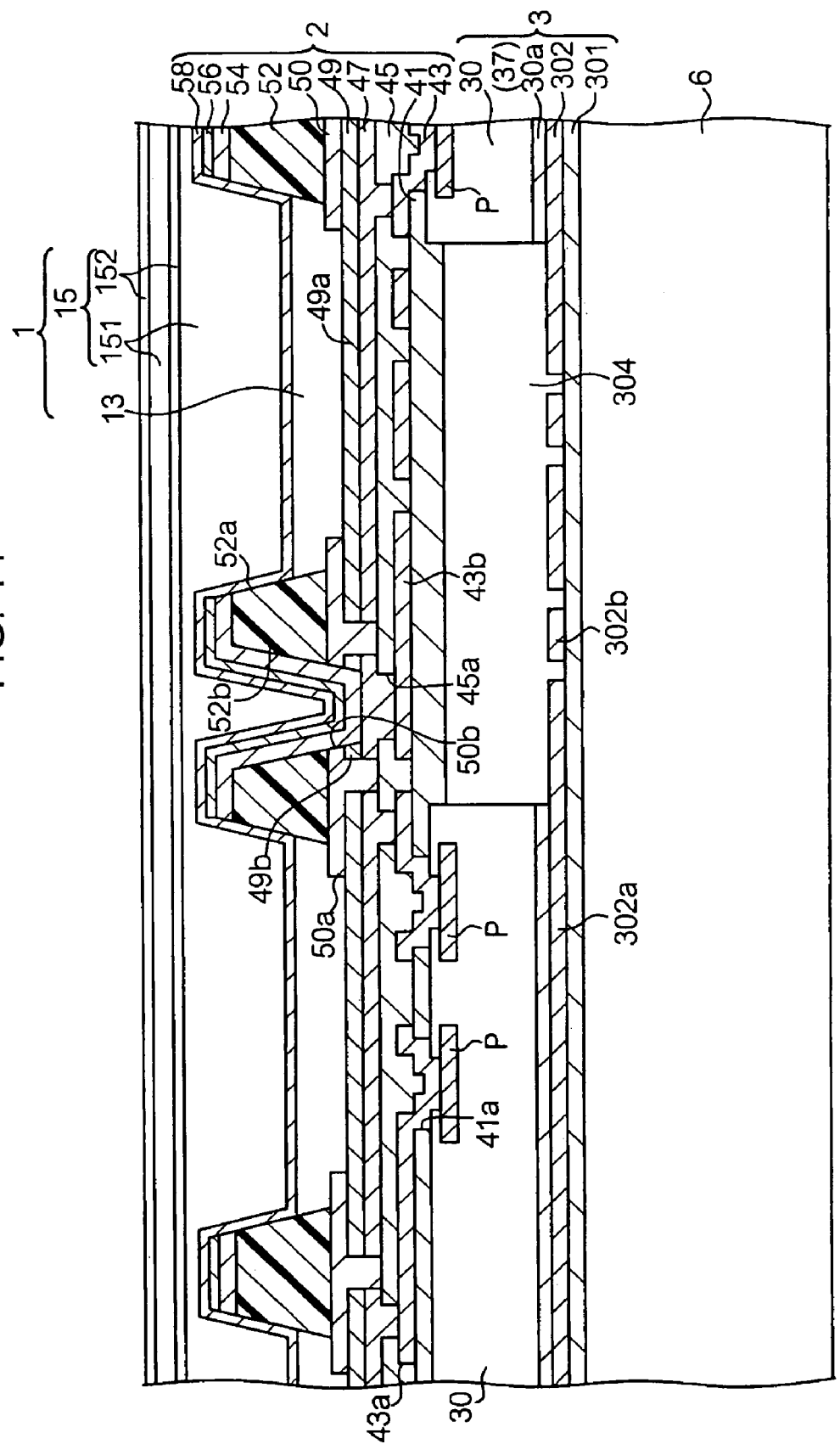
FIG. 14 is a cross-sectional view illustrating a configuration of an electro-optical device obtained according to a first exemplary manufacturing method.

First, with reference to FIG. 14, the stacked structure of the electro-optical device D obtained from the first manufacturing method will be described. As shown in FIG. 14, the electronic component layer 3 includes a base layer 301, a metal layer 302, IC chips 30 and a filling layer 304. The IC chips 30 shown in FIG. 14 are the pixel-driving IC chips 37.

The base layer 301 is a layer covering all of one surface of the support substrate 6, and is made of an insulating material such as silicon oxide, silicon nitride or silicon oxide-nitride. The base layer 301 is a layer to prevent impurities eluted from the support substrate 6 from being doped into the electronic components, such as the pixel-driving IC chips 37.

The metal layer 302 is a layer provided on the base layer 301, and is made of metal, such as copper (Cu) or gold (Au). The metal layer 302 includes mount portions 302a and alignment marks 302b. The mount portions 302a are a layer to improve the adhesion of the IC chips 30 to the support substrate 6 and to shield the incident light from the support substrate 6 toward the IC chips 30. Therefore, the mount portions 302a are provided to overlap the area in which the IC chips 30 should be disposed. By these mount portions 302a, the malfunction of the IC chips 30 due to irradiation of light can be reduced or prevented. On the other hand, the alignment marks 302b are marks to adjust the position of the IC chips 30 relative to the support substrate 6 to a predetermined position.

The IC chip 30 has a plurality of pads P which are the connection terminals. Each IC chip 30 is arranged on the mount portions 302a in a state in which the opposite side of the surface (hereinafter, referred to as "pad formed surface") on which the pads P are formed face the support substrate 6. A metal layer 30a is formed on the surface opposite to the pad formed surface in the IC chip 30, that is, the surface (hereinafter, referred to as "substrate surface") facing the support substrate 6 in a state in which the IC chip 30 is mounted on the support substrate 6.

Figure 15:
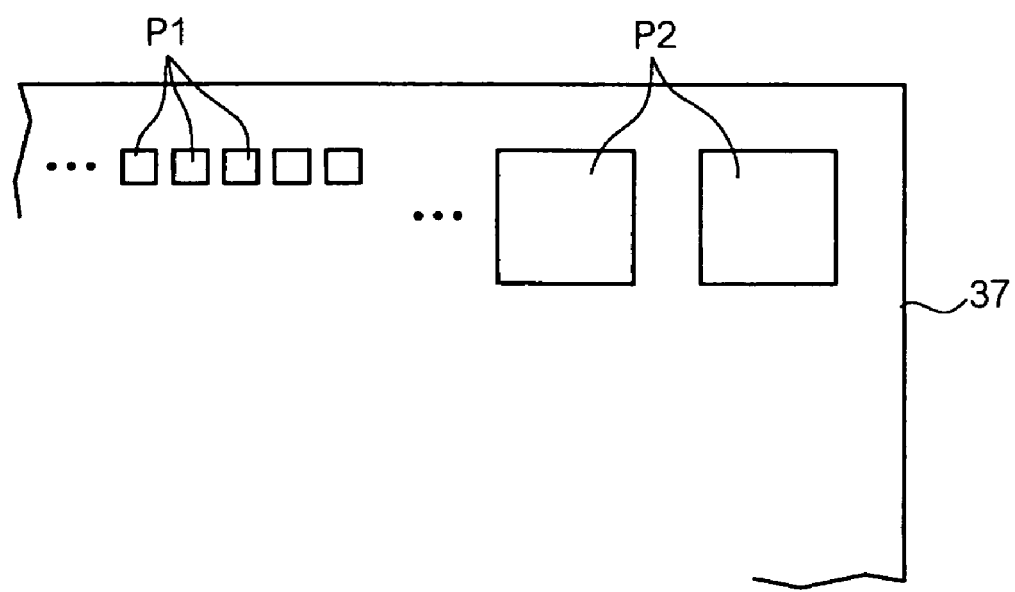
FIG. 15 is a schematic illustrating a configuration of a pad-forming surface of the pixel-driving IC chip.

FIG. 15 is a plan view illustrating the pad formed surface of a pixel-driving IC chip 37. As shown in FIG. 15, the plural pads P provided in the pixel-driving IC chip 37 are divided into first pads P1 and second pads P2, which have different sizes. The second pads P2 are terminals to connect the pixel-driving IC chip 37 to other IC chips (the controlling IC chip 31, the scanning IC chips 33, and the column data-converting IC chips 35) or the power source line. Each of the second pads P2 is sized to mechanically come in contact with the probe pins in testing the pixel-driving IC chip 37. Specifically, the plane shape of each second pad P2 is a rectangle in which the lengths in the longitudinal and transverse directions are all about 70 μm to 100 μm. On the other hand, the first pads P1 are terminals to connect the pixel-driving IC chip 37 to the organic EL elements 10. Each first pad P1 is smaller than the second pads P2. Specifically, the plane shape of each first pad P1 is a rectangle in which the lengths in the longitudinal and transverse directions are all about 10 μm to 30 μm.

As described above, the pixel-driving IC chips 37 of this exemplary embodiment have two kinds of pads having different sizes. Therefore, as compared with a case in which all pads P have the same size as the second pads, the area of the pad formed surface in each IC chip 30 can be reduced. Specifically, since a plurality of pixel-driving IC chips 37 are provided in one electro-optical device D, decreasing the sizes of the respective pixel-driving IC chips 37 can effectively contribute to decrease the whole size of the electro-optical device D. In order to obtain this advantage, it is preferable that the area of the first pad be 1/50 to 1/6 of the area of the second pad. Furthermore, the pads of the controlling IC chip 31, the scanning IC chips 33, and the column data-converting IC chips 35 have the same size as the aforementioned second pad. However, some or all pads of the IC chips may have the same size as the aforementioned first pad.

As described in FIG. 14, the filling layer 304 is a layer provided between the respective IC chips 30. That is, the filling layer 304 is provided to fill in the difference in level between the surface of the support substrate 6 (more specifically, the surface of the base layer 301) and the pad formed surfaces of the IC chips 30. The filling layer 304 is made of materials having high heat radiation. Specifically, the filling layer 304 is made of metal, such as copper (Cu), nickel (Ni) or tin (Sn). Accordingly, since the thermal uniformity of the whole electro-optical device D improves, the problems due to heat can be solved.

Next, the wire-forming layer 2 includes a first insulating layer 41, a first wiring layer 43, a second insulating layer 45, a second wiring layer 47, an anode layer 49, a third insulating layer 50, a bank layer 52, a conductive layer 54, a barrier layer 56, and a cathode layer 58. The first insulating layer 41, the second insulating layer 45, and the third insulating layer 50 are made of materials containing inorganic silicon or organic materials having heat resistance of 300° C. or more. At least the first insulating layer 41 of the insulating layers is made of one or plural materials selected from polyarylether group resin (for example, SiLK), arylether group resin, aromatic polymer, polyimide, fluorine-added polyimide, fluorine resin, benzocyclobutene, polyphenylene group resin, and polyparaphenylene group resin. On the other hand, the second insulating layer 45 and the third insulating layer 50 are made of the same materials as the first insulating layer 41, or TEOS (tetraethyloxysilane)/O$_2$ film or SiO$_2$ film referred to as spin on glass (SOG) film. In another aspect, the first insulating layer 41 and the second insulating layer 45 are made of insulating materials of low permittivity. According to this constitution, the cross-talk between wires can be suppressed.

The first insulating layer 41 is a layer covering the whole surface of the support substrate 6 on which the IC chips 30 and the filling layer 304 are provided. Contact holes 41a are provided in the portions of the first insulating layer 41 which overlap with the pads P in each IC chip 30. The aperture size of each contact hole 41a is determined so that the pads P of each IC chip 30 is exposed through the contact holes 41a even if errors in manufacturing (position errors when the IC chips 30 are arranged or position errors when the contact holes 41a are provided) occur. As described above, the first pads and the second pads in the IC chips 30 have different sizes. Therefore, the aperture sizes of the contact holes 41a corresponding to the first pad are different from the aperture sizes of the contact holes 41a corresponding to the second pad. Specifically, when the lengths of the first pad P1 in the longitudinal and transverse directions are all 16 μm, it is preferable that the contact hole 41a corresponding to the pad P1 is about 4 μm in width and about 4 μm in length. On the other hand, when the lengths of the second pad P2 in the longitudinal and transverse directions are all about 80 μm, it is preferable that the size of the contact hole 41a corresponding to the pad P2 be about 60 μm in width and about 60 μm in length.

The first wiring layer 43 is provided on the first insulating layer 41 and is electrically connected to the pads P of each IC chip 30 through the contact holes 41a. The first wiring layer 43 is made of a high conductive metal, such as aluminum (Al) or alloy containing Al. The first wiring layer 43 includes an anode wire 43a and a cathode power source line 43b. The anode wire 43a is connected to the anode layer 49. On the other hand, the cathode power source line 43b is connected to the cathode layer 58 in the organic EL element 10. The first wiring layer 43 includes the data lines DL to supply the data signals Dj from the column data-converting IC chips 35 to the pixel circuits 377, or the data control lines LXD to supply the data control signals XD (see FIG. 9) from the controlling IC chip 31 to the column data-converting IC chips 35.

The second insulating layer 45 is provided to cover the surface of the first insulating layer 41 provided with the first wiring layer 43. Contact holes 45a are provided in the portions of the second insulating layer 45 which overlap with a part of the first wiring layer 43. On the other hand, the second wiring layer 47 is provided on the second insulating layer 45 and is electrically connected to the first wiring layer 43 through the contact holes 45a. The second wiring layer 47 is made of a high conductive metal similarly to the first wiring layer 43. The second wiring layer 47 in this exemplary embodiment has a stacked structure of a layer made of aluminum and a layer made of titanium (Ti). By this structure, since the aluminum layer is covered with the titanium layer, the oxidation of aluminum layer by the oxide used as the anode layer 49 can be avoided.

The second wiring layer 47 includes the scanning control line group YL extending from the scanning IC chips 33 to the pixel-driving IC chips 37. Furthermore, the second wiring layer 47 includes wires to supply the compulsory off signal Doff from the controlling IC chip 31 to the pixel-driving IC chips 37, or wires to supply various signals (reset signal RSET, clock signal YSCL, and chip-selecting clock signal YECL) from the controlling IC chip 31 to the scanning IC chips 33. The wires to connect the pixel-driving IC chips 37 with the column data-converting IC chips 35 in the second wiring layer 47 are formed to be orthogonal to the wires connecting the scanning IC chips 33 with the pixel-driving IC chips 37 in the first wiring layer 43.

Figure 16:
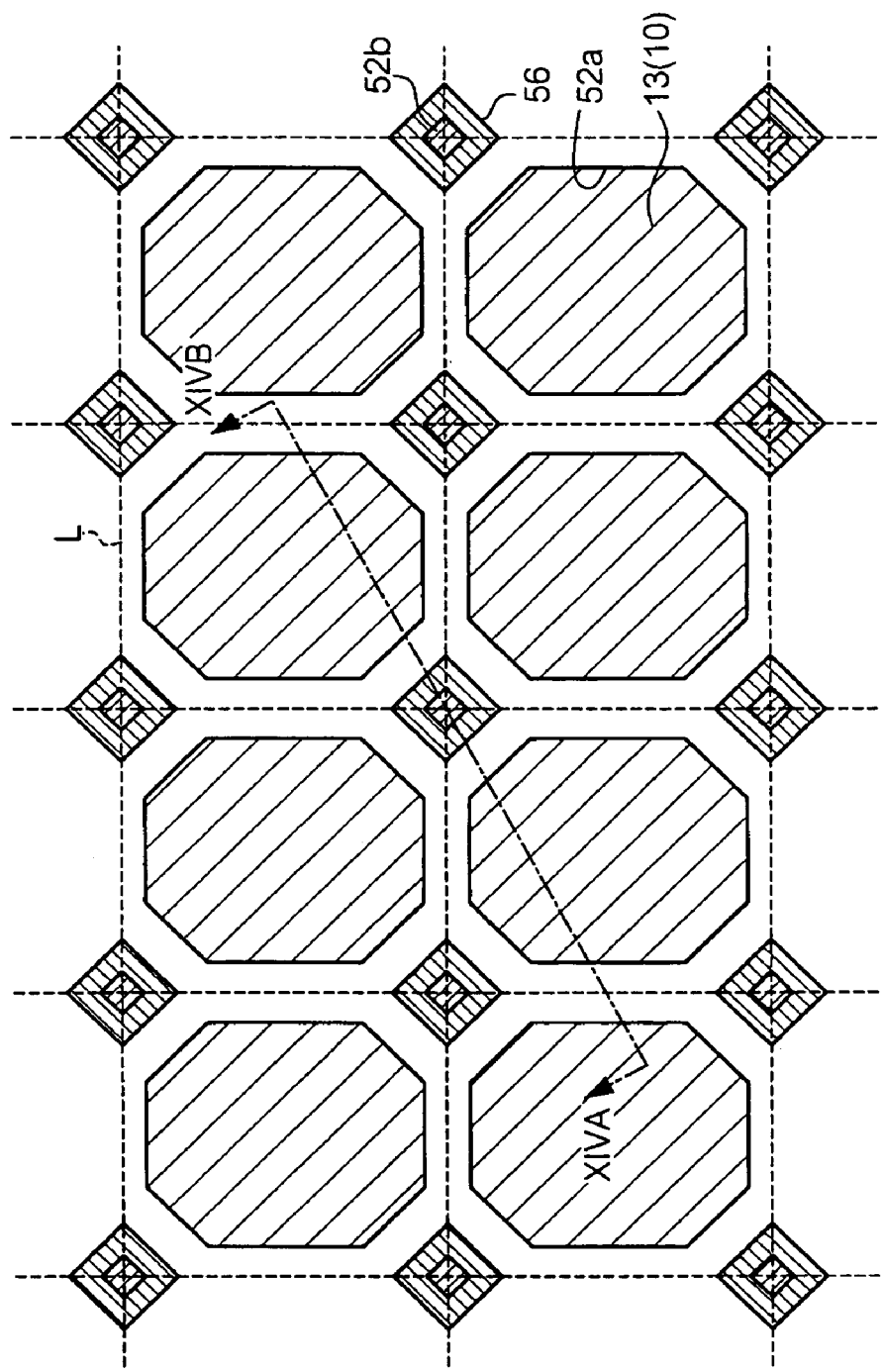
FIG. 16 is a plan view illustrating a configuration of an electro-optical device.

The power source line for high potential and the power source line for low potential (ground potential) are formed by properly combining the first wiring layer 43 and the second wiring layer 47. Herein, FIG. 16 is a plan view illustrating the configuration of the electro-optical device D. The cross-sectional view taken along a plane XIVA-XIVB in FIG. 16 corresponds to FIG. 14. As shown in FIG. 16, the power source lines L including the first wiring layer 43 and the second wiring layer 47 are provided among the organic EL elements 10 arranged in a matrix shape. Therefore, the plane shape of the power source lines L is a lattice shape.

The anode layer 49 is provided on the second wiring layer 47. The anode layer 49 includes anode portions 49a and interconnection portions 49b. The anode portions 49a are a layer formed right below the EL layer 13 to be described later. Therefore, the anode portions 49a are provided in the positions corresponding to a plurality of organic EL elements 10 and are arranged in a matrix shape. On the other hand, the interconnection portions 49b are a layer to connect the anode layer 58 with the first wiring layer 43. The interconnection portions 49b are situated in between the respective organic EL elements 10. Specifically, as shown in FIG. 16, the interconnection portion 49b is provided between two organic EL elements 10 adjacent to each other in the oblique direction. Therefore, a plurality of interconnection portions 49b is arranged in a matrix shape. However, the interconnection portions 49b can be properly omitted in accordance with the current values used to drive the organic EL elements 10.

The anode layer 49 is made of, for example, a compound of indium oxide and tin oxide (ITO: Indium Tin Oxide), or a compound of indium oxide and zinc oxide ($In_2O_3$—ZnO), or conductive materials having a high work function, such as gold (Au). Furthermore, since the light emitted from the organic EL elements 10 is output to an opposite side of the anode layer 49, it is not necessary for the anode layer 49 to have light transmission.

Next, the third insulating layer 50 is provided to cover the second wiring layer 47 and the second insulating layer 45 provided with the anode layer 49. The third insulating layer 50 has pixel aperture portions 50a and cathode contact portions 50b. The pixel aperture portions 50a are opening portions corresponding to the anode portions 49a in the anode layer 49. The cathode contact portions 50b are opening portions corresponding to the interconnection portions 49b in the anode layer 49.

The bank layer 52 is a layer covering the second insulating layer 45 on which the anode layer 49 and the second wiring layer 47 are formed. The bank layer 52 is made of, for example, organic resin materials, such as photosensitive polyimide, acryl, polyamide. The bank layer 52 is a layer to partition the organic EL elements 10 adjacent to each other. Therefore, the bank layer 52 has pixel aperture portions 52a opened correspondingly to the organic EL elements 10. Furthermore, the bank layer 52 of this exemplary embodiment has cathode contact portions 52b for electrically connecting the anode layer 49 to the second wiring layer 47. As shown in FIG. 16, the cathode contact portions 52b are opening portions corresponding to the interconnection portions 49.

The conductive layer 54 is a layer to connect a portion of the second wiring layer 47 with the cathode layer 58. Specifically, the conductive layer 54 extends from the surface of the bank layer 52 to the surface of the second wiring layer 47 through the cathode contact portions 52 and the cathode contact portions 50b of the third insulating layer 50. The conductive layer 54 is made of a high conductive metal, such as aluminum alloy. The barrier layer 56 is a layer to prevent oxidation of the conductive layer 54, and is provided to cover the conductive layer 54. The barrier layer 56 has a stacked structure of, for example, a layer made of titanium and a layer made of gold.

Next, the cathode layer 58 is provided on the EL layer 13 constituting the organic EL elements 10. The cathode layer 58 is electrically connected to the second wiring layer 47 through the barrier layer 56 and the conductive layer 54. The cathode layer 58 has a property (transparency) transmitting the light emitted from the organic EL elements 10. In a more preferable aspect, the cathode layer 58 is made of a material having a low work function. Specifically, the cathode layer 58 has a stacked structure of a first film made of lithium fluoride (LiF) or barium fluoride and the like, a second film made of calcium (Ca), and a third film made of gold. It is preferable that the materials of the first film and the second film are selected from metal belonging to group II or group III of the periodic table, or alloys or compounds containing the metal. On the other hand, the third film is a film to decrease the resistance of the first or second film. The materials of the third film include Pt, Ni or Pb as well as Au. Furthermore, the third film may be made of oxide containing In, Zn or Sn.

Next, the organic EL layer 1 includes an EL layer 13 and a sealing layer 15. The EL layer 13 is made of known EL materials. That is, the EL layer 13 has a structure obtained by stacking a hole injection layer, a hole transfer layer, a light emitting layer, an electron transfer layer, and an electron injection layer using appropriate technologies. The EL layer 13 is interposed between the anode layer 49 (anode portions 49a) and the cathode layer 58 included in the wire-forming layer 2. Based on this configuration, when current flows between the anode layer 49 and the cathode layer 58, light is emitted from the EL layer 13 by recombination of holes and electrons. The EL layer 13 may be made of any one of inorganic EL materials and organic EL materials. Furthermore, the organic EL materials include high molecular materials and low molecular materials.

The sealing layer 15 is a layer to isolate the EL layer 13 from the exterior. The sealing layer 15 has light transmission property so that the light emitted from the EL layer 13 emanates to the outside. The sealing layer 15 has a structure obtained by stacking alternately a plurality of flattened resin layers 151 and a plurality of barrier layers 152. The flattened resin layers 151 are formed by polymerizing and hardening resin monomers of an acryl group or a vinyl group, or a resin oligomer. Furthermore, the barrier layers 152 are made of (metal) oxide, such as $Al_2O_3$, $SiO_2$ or nitride film. Furthermore, a protective member may adhere onto the sealing layer 15. The protective member may adhere instead of the sealing layer 15 shown in FIG. 14. A plate-shaped (or film-shaped) member made of, for example, glass or hard plastic and having light transmission can be used as the protective member.

First Exemplary Manufacturing Method

Next, an exemplary method of manufacturing the electro-optical device D shown in FIG. 14 will be described.

Figure 17:
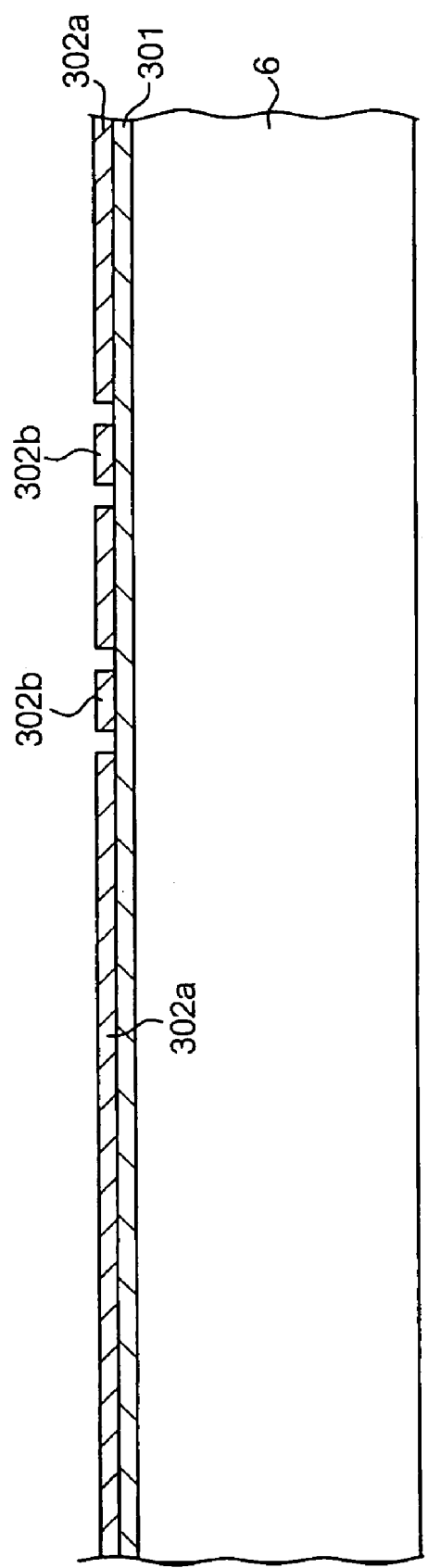
FIG. 17 is a schematic illustrating a process in which a substrate layer and a metal layer are formed in the first exemplary manufacturing method.

First, as shown in FIG. 17, the base layer 301 is formed on one surface of the support substrate 6. The base layer 301 is obtained by depositing silicon oxide using, for example, plasma CVD method. The thickness of the base layer 301 is about 100 nm to 300 nm. Next, the metal layer 302 is formed on the base layer 301. That is, first of all, a metal film made of copper or gold is formed by the sputtering method to cover the hole surface of the base layer 301. Then, the metal film is pattered and etched using a photolithography technology. By doing so, as shown in FIG. 17, the metal layer 302 including the mount portions 302a and the alignment marks 302b is obtained.

Figure 18:
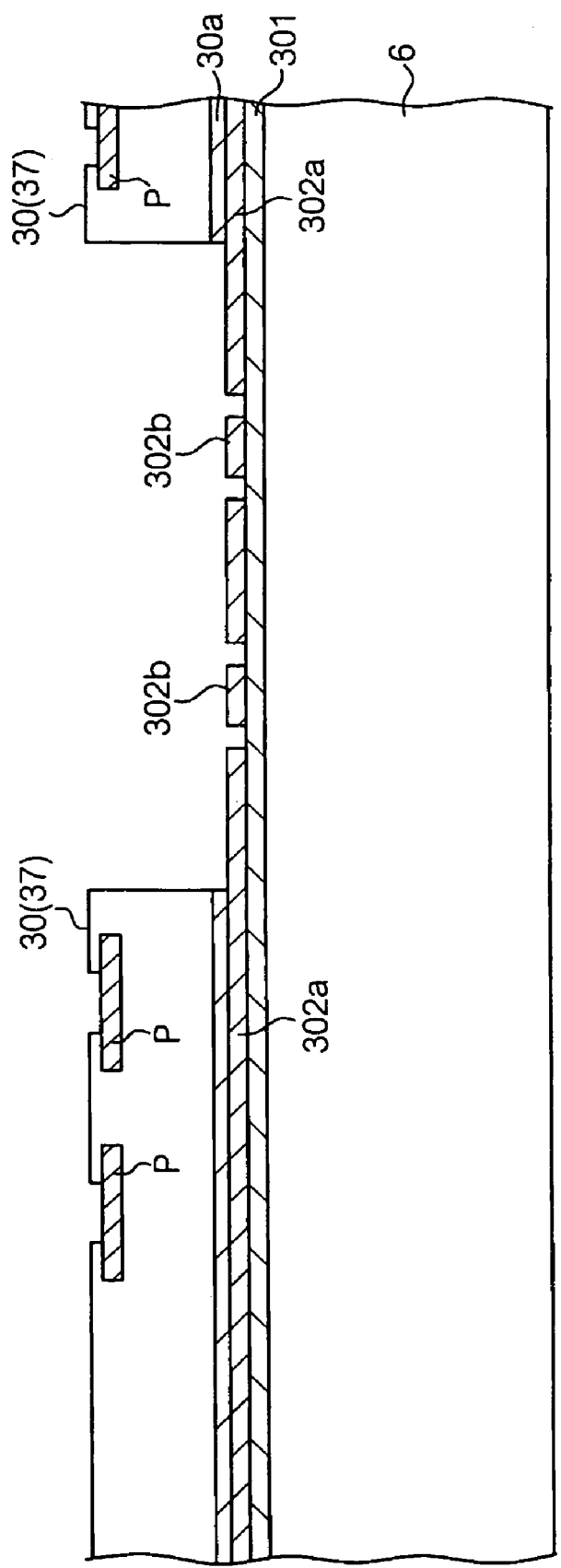
FIG. 18 is a schematic illustrating a process in which IC chips are arranged in the above method.

Next, as shown in FIG. 18, in a state where the opposite side of the pad formed surfaces faces the support substrate 6, the respective IC chips 30 (herein, the pixel-driving IC chips 37) are arranged on the mount portions 302a. A high-precision bare chip mounter having a mount precision of ±5 μm or less is used for the arrangement of the IC chips 30. Furthermore, the relative positional relationship of the respective IC chips 30 and the support substrate 6 is adjusted through the observation of the alignment marks 302b.

The following processes are carried out in advance for the respective IC chips 30. On the wafer before being divided into the IC chips 30 by dicing, a protective tape (not shown) adheres to the surface corresponding to the substrate surface. The protective tape is made of materials having UV curable property. Therefore, the protective tape adheres to the pad formed surfaces of the respective IC chips 30 provided on the mount portions 302a. The grinding process is carried out for the surface of the wafer corresponding to the pad formed surface of each IC chip 30. By this grinding process, the respective IC chips 30 have a thickness suitable for the formation of the wire-forming layer 2. Specifically, the thickness of each of the IC chips 30 is 100 μm or less (preferably, about 25 μm to 30 μm). Furthermore, the wafer is diced after the metal layer 30a is formed on the surface corresponding to the pad formed surfaces. Furthermore, in another aspect, a die bonding tape adheres instead of the metal layer 30a.

Figure 19:
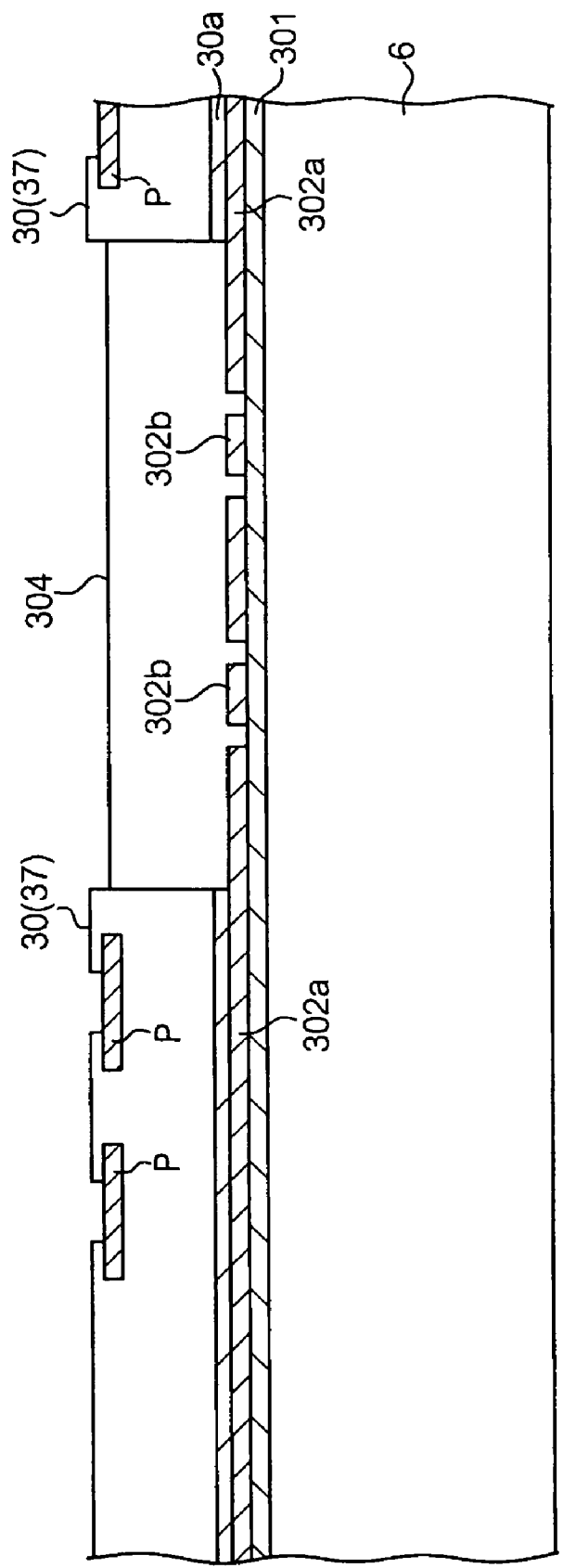
FIG. 19 is a schematic illustrating a process in which a filling layer is formed in the above method.

Next, as shown in FIG. 19, the filling layer 304 is formed to fill in the gaps between the respective IC chips 30 arranged on the support substrate 6. The filling layer 304 is obtained by the electric field plating using the IC chip 30 as a mask. The filling layer 304 is formed to be thinner than each IC chip 30. Specifically, the filling layer 304 is formed to be thinner than the IC chips 30 by about 0.1 μm to 3 μm.

Thereafter, the protective tape adhered to the substrate surface of each chip 30 is removed. Specifically, first, the UV ray is irradiated to the substrate surface of the IC chips 30. By doing so, the adhesive force of the protective tape is decreased. Subsequently, by applying organic solvent to the substrate surface of the IC chips 30, the protective tape is completely removed.

Figure 20:
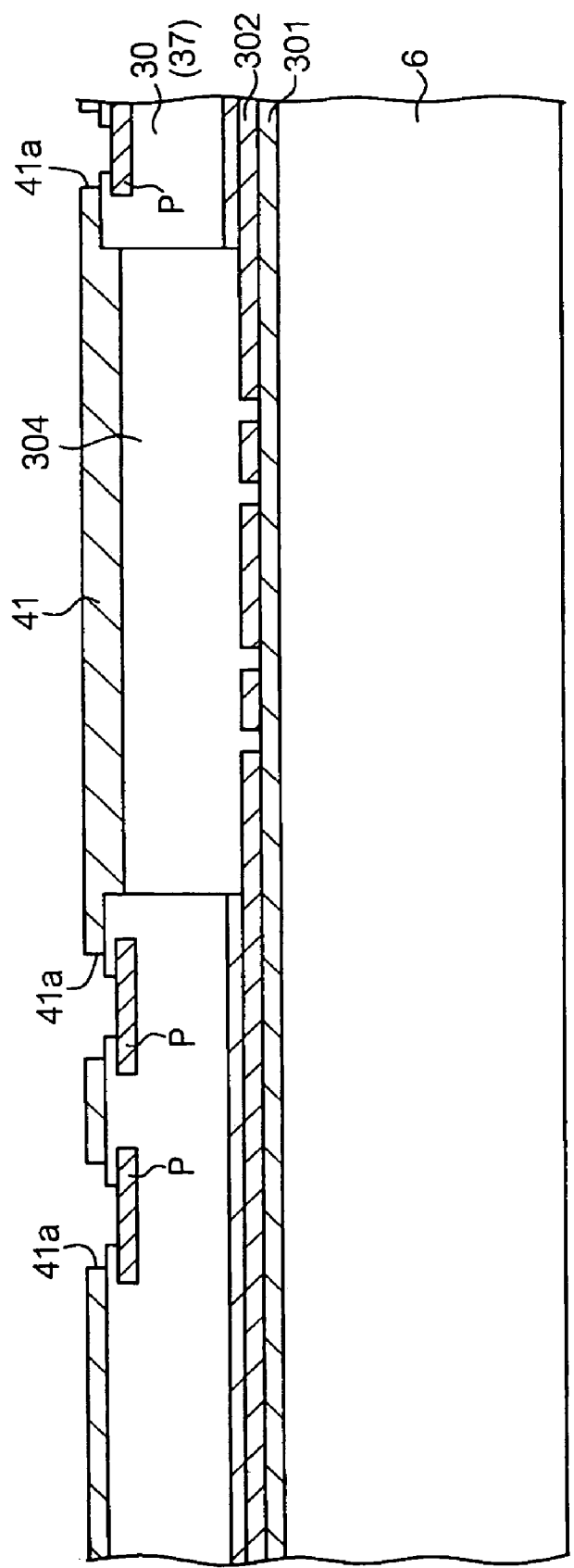
FIG. 20 is a schematic illustrating a process in which a first insulating layer is formed in the above method.

Next, as shown in FIG. 20, the first insulating layer 41 is formed to cover the whole surface of the support substrate 6 provided with the IC chips 30 and the filling layer 304. That is, an insulating film is first formed to cover the whole surface of the support substrate 6 by means of the plasma CVD method using $TEOS/O_2$. The thickness of the insulating film is about 400 nm to 900 nm. Furthermore, when the flatness of the insulating film formed by this method is not enough to form the wires, the insulating film is flattened by the CMP (Chemical Mechanical Polishing) method. Further, the insulating film may be formed by applying and sintering insulating materials. That is, by applying the solvent in which silanol $(Si(OH)_4)$ is dissolved in alcohol to the support substrate 6 and baking it at about 400° C., the insulating film is obtained. The respective IC chips 30 are molded on the support substrate 6 through the above processes.

Next, as shown in FIG. 20, the part of the insulating film, corresponding to the pads P of the IC chips, 30 is removed and thus the contact holes 41a are formed. These contact holes 41a are formed in a lump by the patterning process and the etching process using the photolithography technology. The first insulating layer 41 is obtained through the above processes. Furthermore, when the surfaces of the pads P are exposed through the contact holes 41a, the oxide films formed on the surfaces of the pads P are removed by the reverse sputtering.

Figure 21:
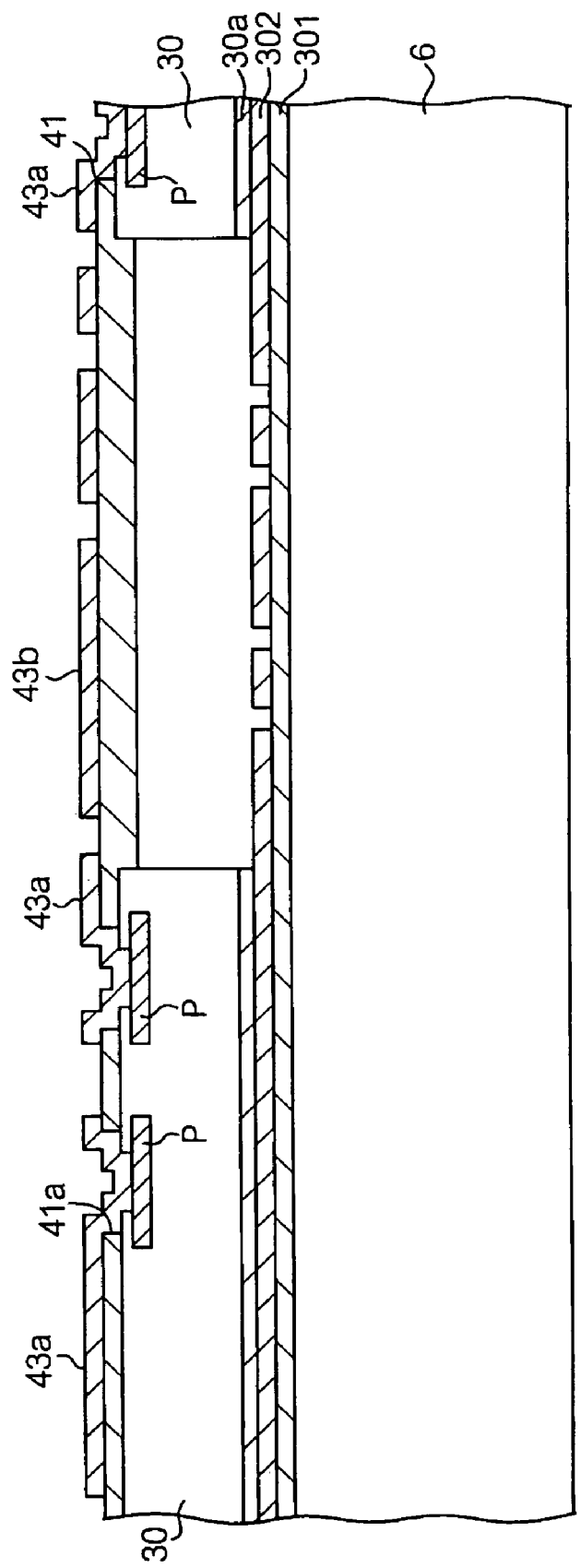
FIG. 21 is a schematic illustrating a process in which a first wiring layer is formed in the above method.

Subsequently, as shown in FIG. 21, the first wiring layer 43 is formed on the first insulating layer 41. That is, a metal film is first formed to cover the first insulating layer 41. The metal film is obtained by depositing the aluminum alloy, for example, using the sputtering. The thickness of the metal film is about 300 nm to 500 nm. The metal film leads to the surfaces of the pads P of the IC chips 30 through the contact holes 41a. Subsequently, the patterning process and the etching process using the photolithography technology are carried out for the metal film. By doing so, as shown in FIG. 21, the first wiring layer 43, including the anode wires 43a and the cathode power source lines 43b, is obtained. Furthermore, the first wiring layer 43 may be formed by using the inkjet technology. That is, by ejecting ink containing metal particles from the inkjet head onto the support substrate 6 and drying the ink with heat treatment, the first wiring layer 43 is obtained.

Figure 22:
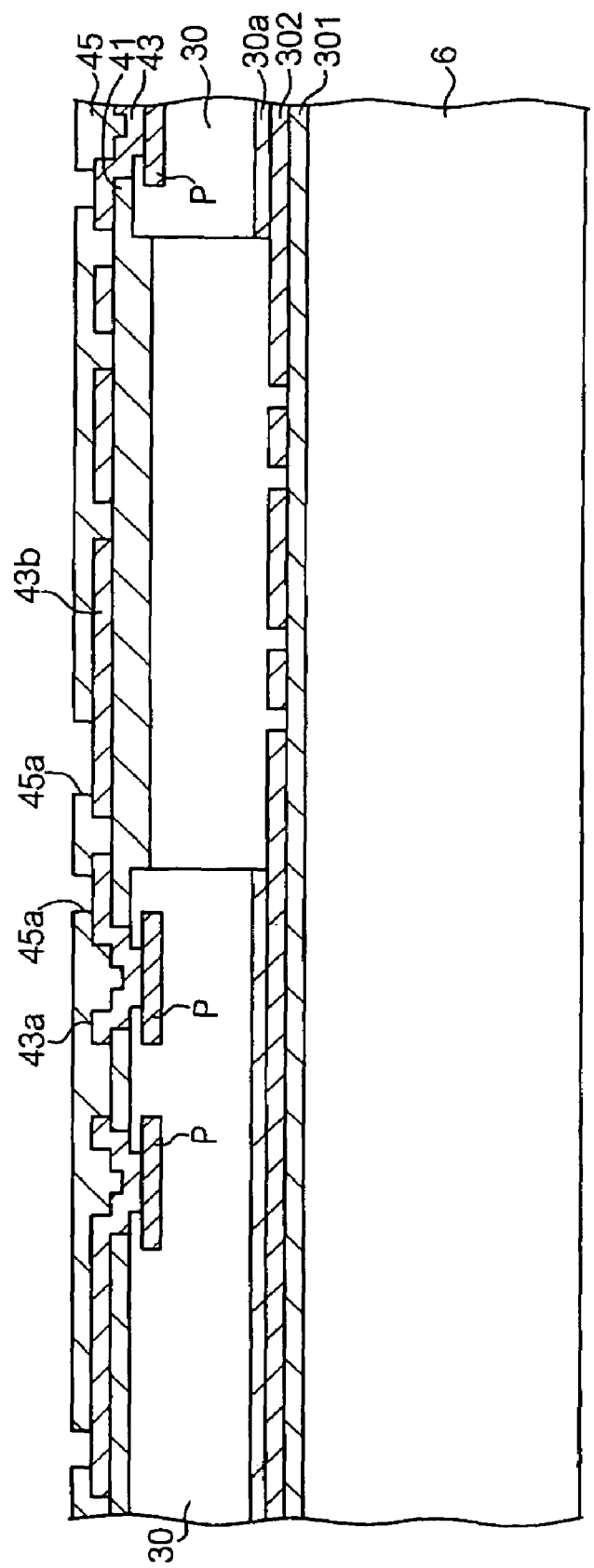
FIG. 22 is a schematic illustrating a process in which a second insulating layer is formed in the above method.

Next, as shown in FIG. 22, the second insulating layer 45 is formed to cover the surface of the first insulating layer 41 on which the first wiring layer 43 is formed. The second insulating layer 45 is formed by the same method as the first insulting layer 41. That is, an insulating film is first formed by the plasma CVD method or the sputtering. The thickness of the insulating film is about 500 nm to 900 nm. When the flatness of the insulating film is not enough to form the anode, the surface of the insulating film is flattened of the CMP method. Subsequently, the contact holes 45a are formed in a lump on a portion of the insulating film overlapping a part of the first wiring layer 43, and thus the second insulating layer 45 is obtained. The contact holes 45a are formed in the overlapping portions with parts of the anode wires 43a or the cathode power source lines 43b.

Figure 23:
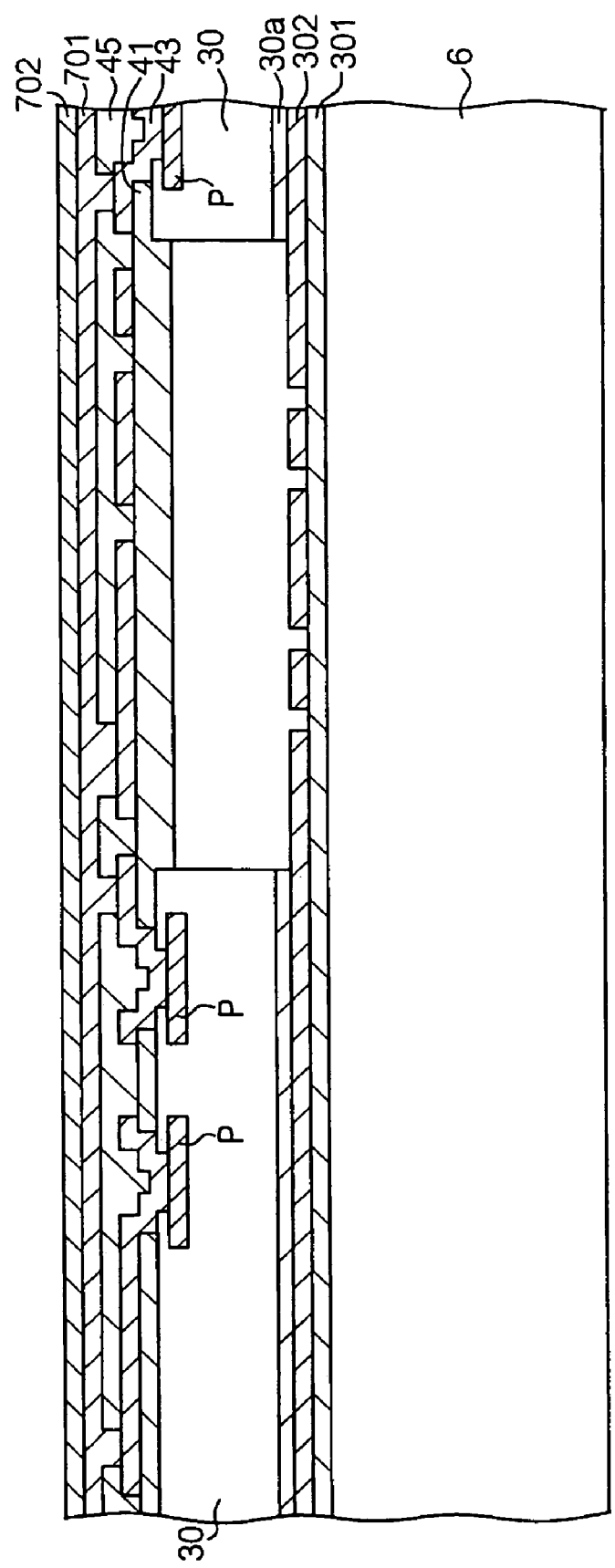
FIG. 23 is a schematic illustrating a process in which a metal film and an anode material film are formed in the above method.

Next, as shown in FIG. 23, a metal film 701 constituting the second wiring layer 47 is formed to cover the whole surface of the second insulating layer 45. The metal film 701 can be formed by, for example, the sputtering, the vacuum deposition method, or the aforementioned inkjet method. The metal film 701 includes, for example, a first film formed on the second insulating layer 45 and a second film covering the first film. The first film is formed of, for example, aluminum alloy of about 300 nm to 500 nm in thickness. On the other hand, the second film is formed of, for example, titanium of about 50 nm to 100 nm in thickness. Thereafter, as shown in FIG. 23, an anode material film 702 covering the metal film 701 is formed. The anode material film 702 is formed to be about 50 nm to 150 nm thick by, for example, the sputtering.

Figure 24:
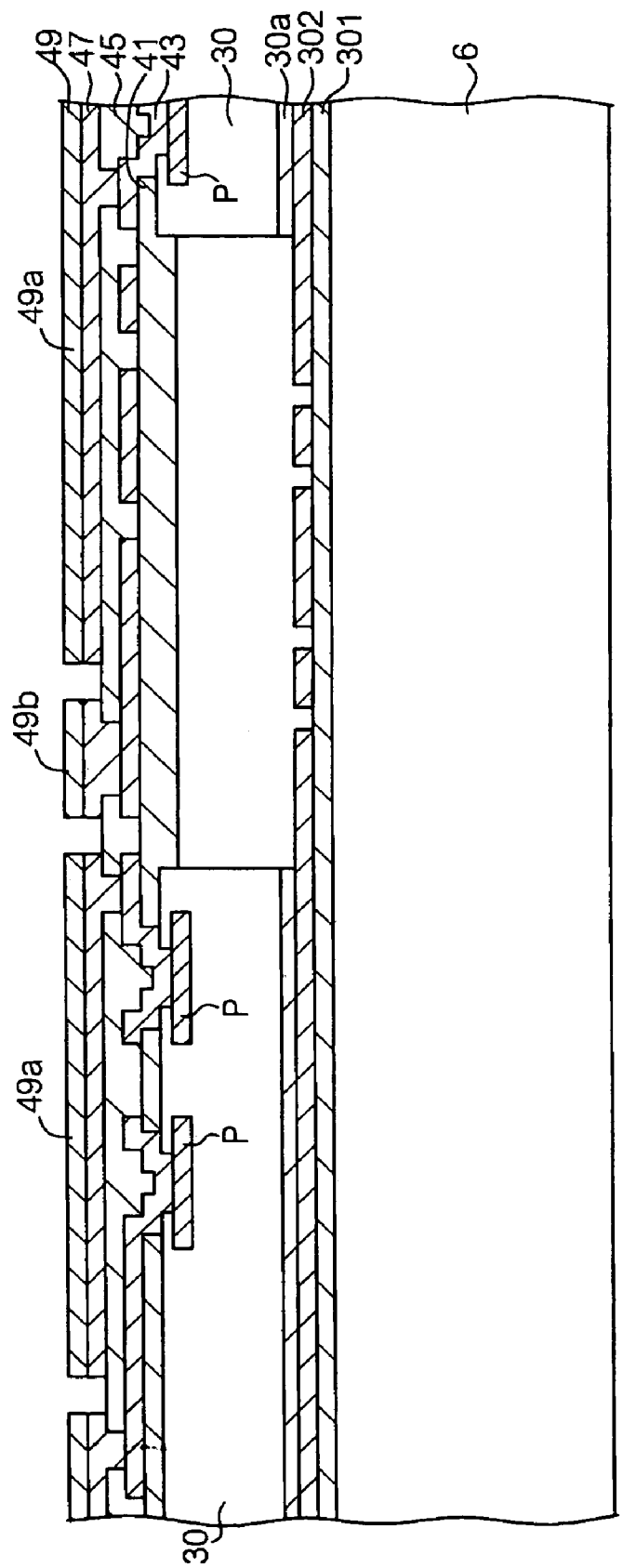
FIG. 24 is a schematic illustrating a process in which a second wiring layer and an anode layer are formed in the above method.

Subsequently, parts of the anode material film 702 and the metal film 701 are selectively removed by the patterning and the etching using the photolithography technology. As a result, as shown in FIG. 24, the second wiring layer 47 and the anode layer 49 are obtained. The anode layer 49 has the anode portions 49a positioned right below the EL layer 13, and the interconnection portions 49b positioned in the gaps among the organic EL elements 10.

Figure 25:
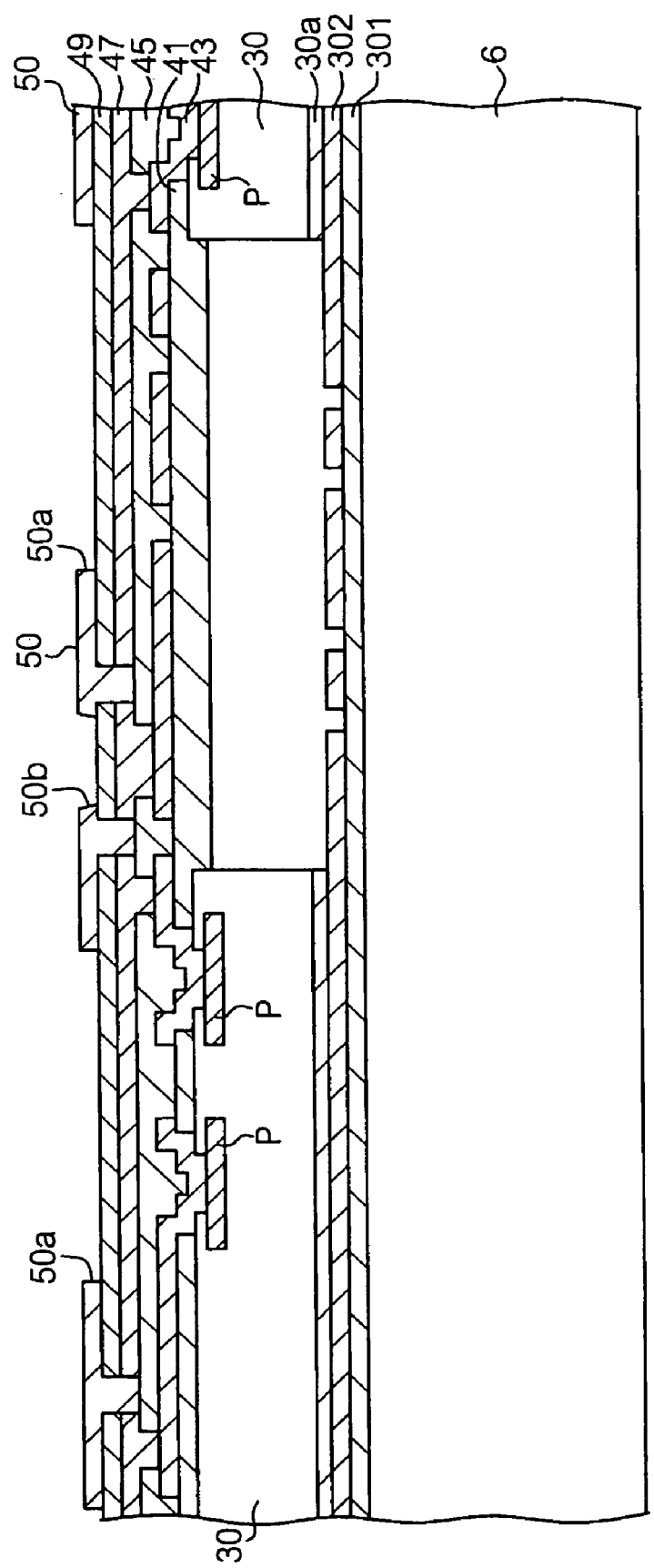
FIG. 25 is a schematic illustrating a process in which a third insulating layer is formed in the above method.

Thereafter, as shown in FIG. 25, the third insulating layer 50 is formed. That is, first, the silicon oxide is deposited to be about 150 nm to 300 nm by the plasma CVD method. Then, the regions of the silicon oxide film, corresponding to the pixel aperture portions 50a, and the cathode contact portions 50b are selectively removed by the photolithography technology, and the third insulating layer 50 is formed. Furthermore, when selectively removing the silicon oxide film, the portions of the silicon oxide film positioned in the vicinity of edges of the support substrate 6 are removed.

Figure 26:
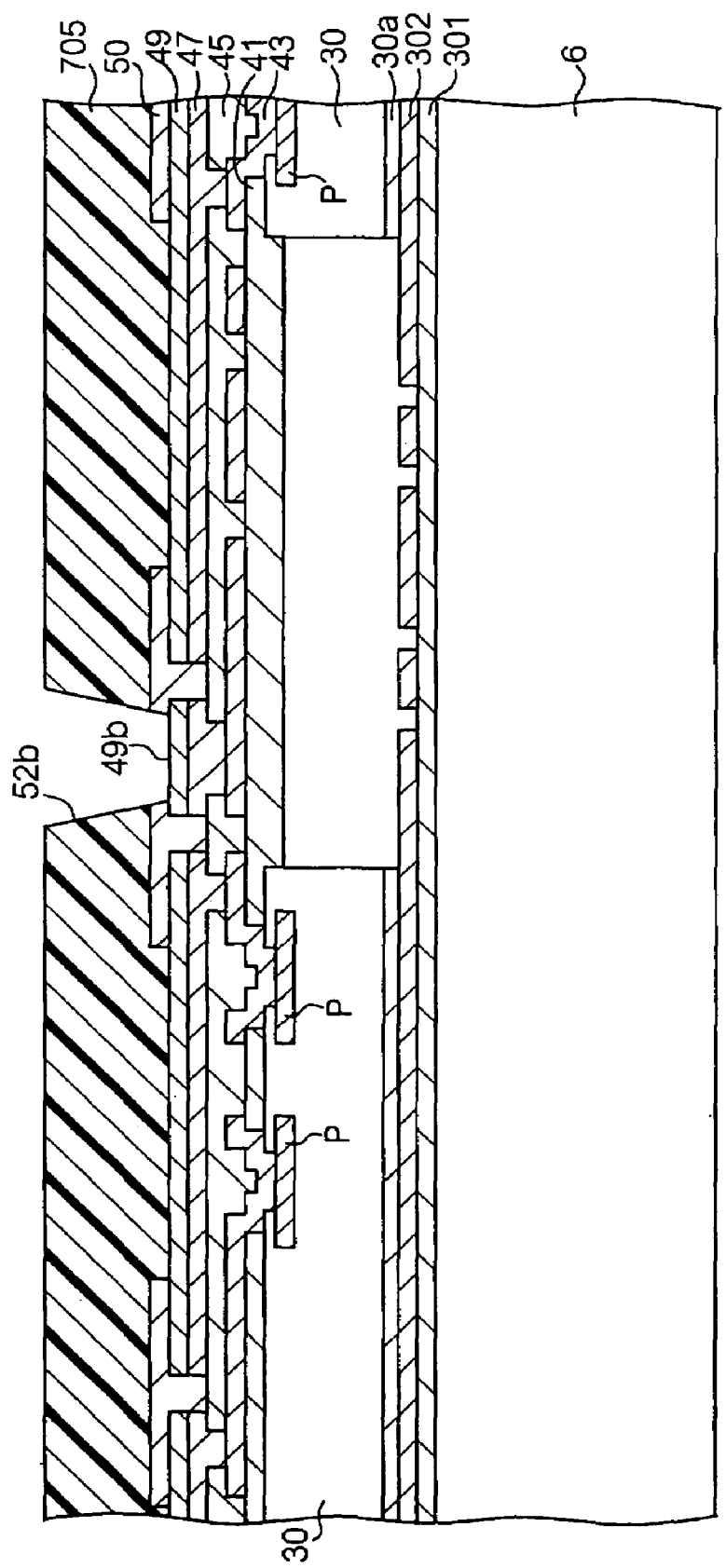
FIG. 26 is a schematic illustrating a process in which a resin layer is formed in the above method.

Next, as shown in FIG. 26, a resin film 705 constituting the bank layer 52 is formed. Specifically, the resin film 705 is obtained by applying organic materials, such as photosensitive polyimide, acryl, and polyamide, and hardening the organic materials by heating. The thickness of the resin film 705 is about 1.0 μm to 3.5 μm. The resin film 705 is opaque in its finishing state to prevent the light emitted from the EL layer 13 from traveling toward the IC chips. Thereafter, the patterning process and the developing process using a photo-mask are carried out for the resin film 705, and thus the cathode contact portions 52b are opened. As a result, as shown in FIG. 26, the interconnection portions 49b of the anode layer 49 are exposed. In addition, in forming the cathode contact portions 52b, the portions of the resin film 705 positioned in the vicinity of the edges of the support substrate 6 are removed.

Figure 27:
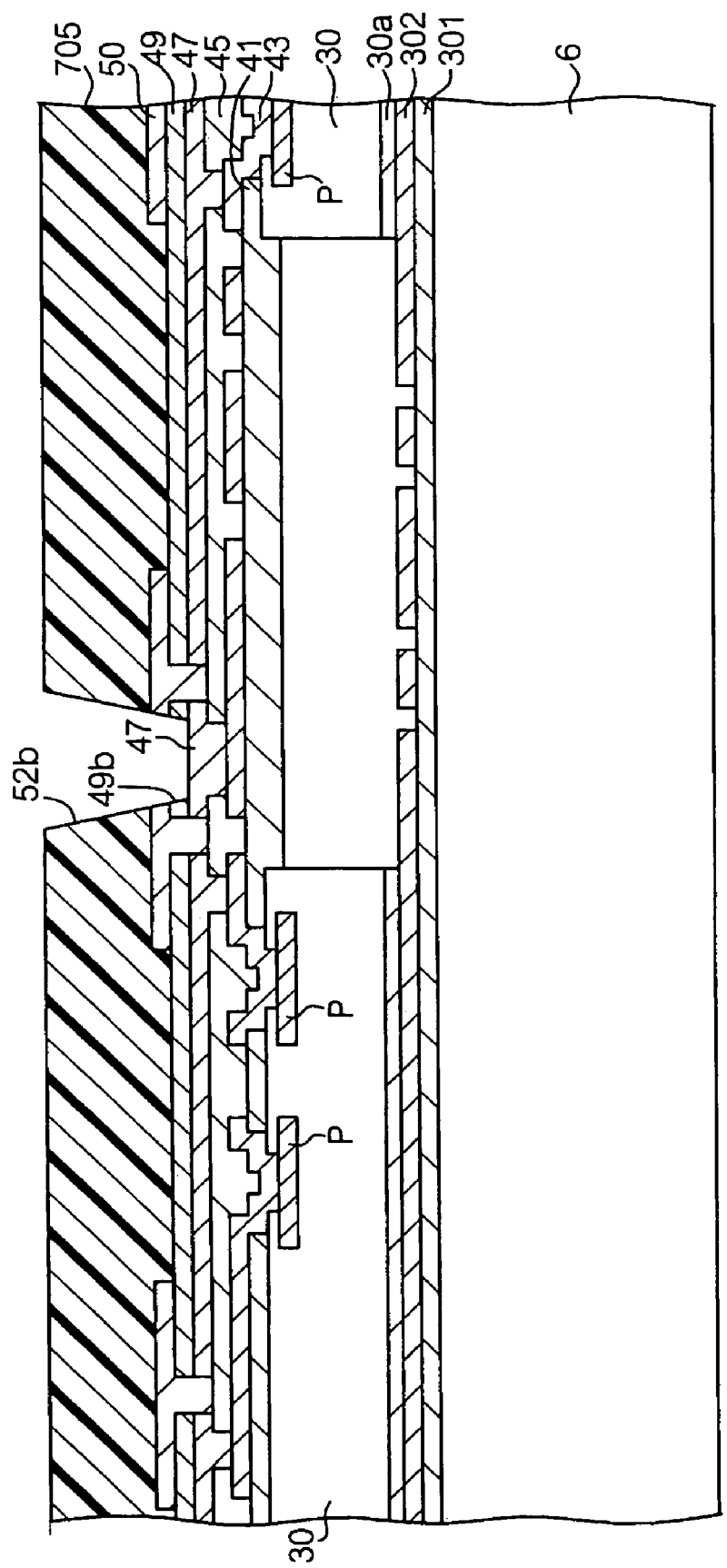
FIG. 27 is a schematic illustrating a process in which a part of the anode layer is removed in the above method.
Figure 28:
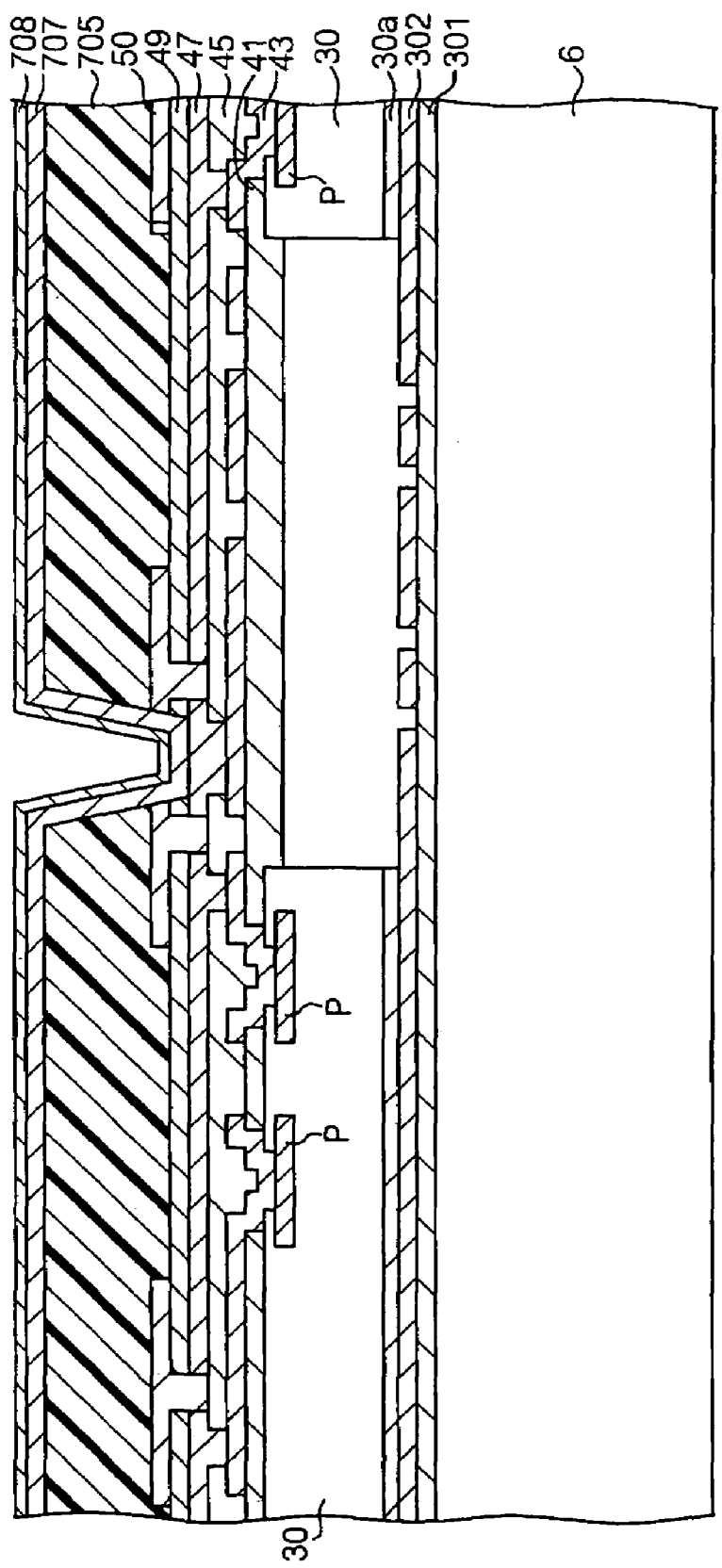
FIG. 28 is a schematic illustrating a process in which a conductive layer and a barrier layer are formed in the above method.
Figure 29:
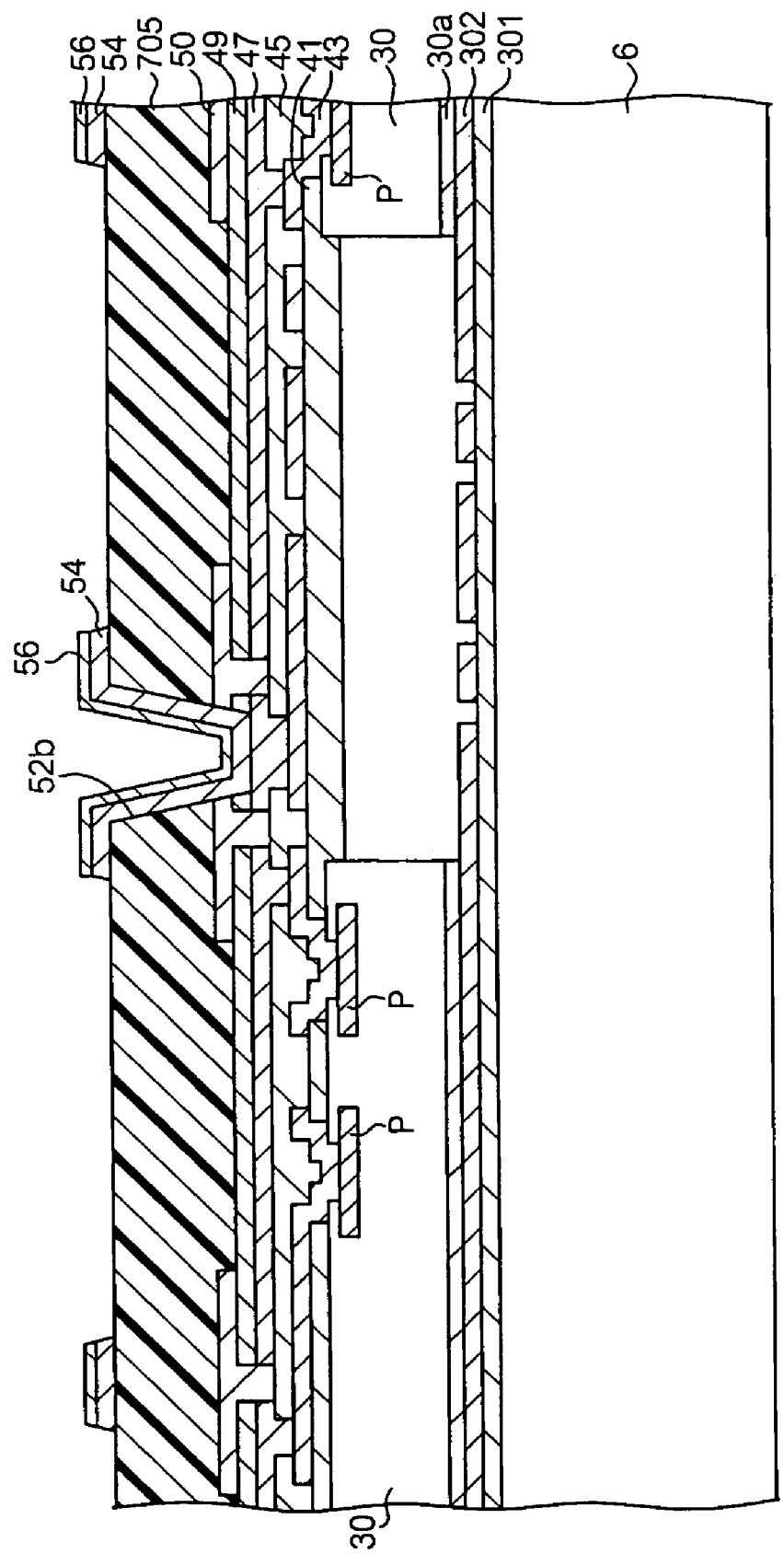
FIG. 29 is a schematic illustrating a process in which a conductive layer and a barrier layer are formed in the above method.

Subsequently, as shown in FIG. 27, parts of the interconnection portions 49b are removed by the etching process using the resin film 705 as a mask. As a result, the barrier layer (Ti layer) of the second wiring layer 47 is exposed. Thereafter, as shown in FIG. 28, a metal film 707 constituting the conductive layer 54 is formed. The metal film 707 is obtained by depositing metal, such as aluminum, using the sputtering. The thickness of the metal film 707 is about 300 nm to 500 nm. Subsequently, as shown in FIG. 28, a metal film 708 constituting the barrier layer 56 is formed. The metal film 708 is obtained by stacking a very thin film made of titanium and a film made of gold having a thickness of about 5 nm to 15 nm. The metal film 708 is formed using, for example, the sputtering. Subsequently, the pattering process and the etching process using the photo-mask are carried out for the metal film 707 and the metal film 708. By doing so, as shown in FIG. 29, the conductive layer 54 and the barrier layer 56 are obtained. Furthermore, after these processes, a black non-reflecting layer may be formed to cover the portions of the resin film 705 other than the cathode contact portions 52b. The non-reflecting layer is a layer having a low light reflectivity (that is, high light absorptance), and is made of, for example, oxide, such as $CrO_3$, $MnO_2$, $Mn_2O_3$, NiO, $Pr_2O_5$, or resin materials containing carbon particles.

Figure 30:
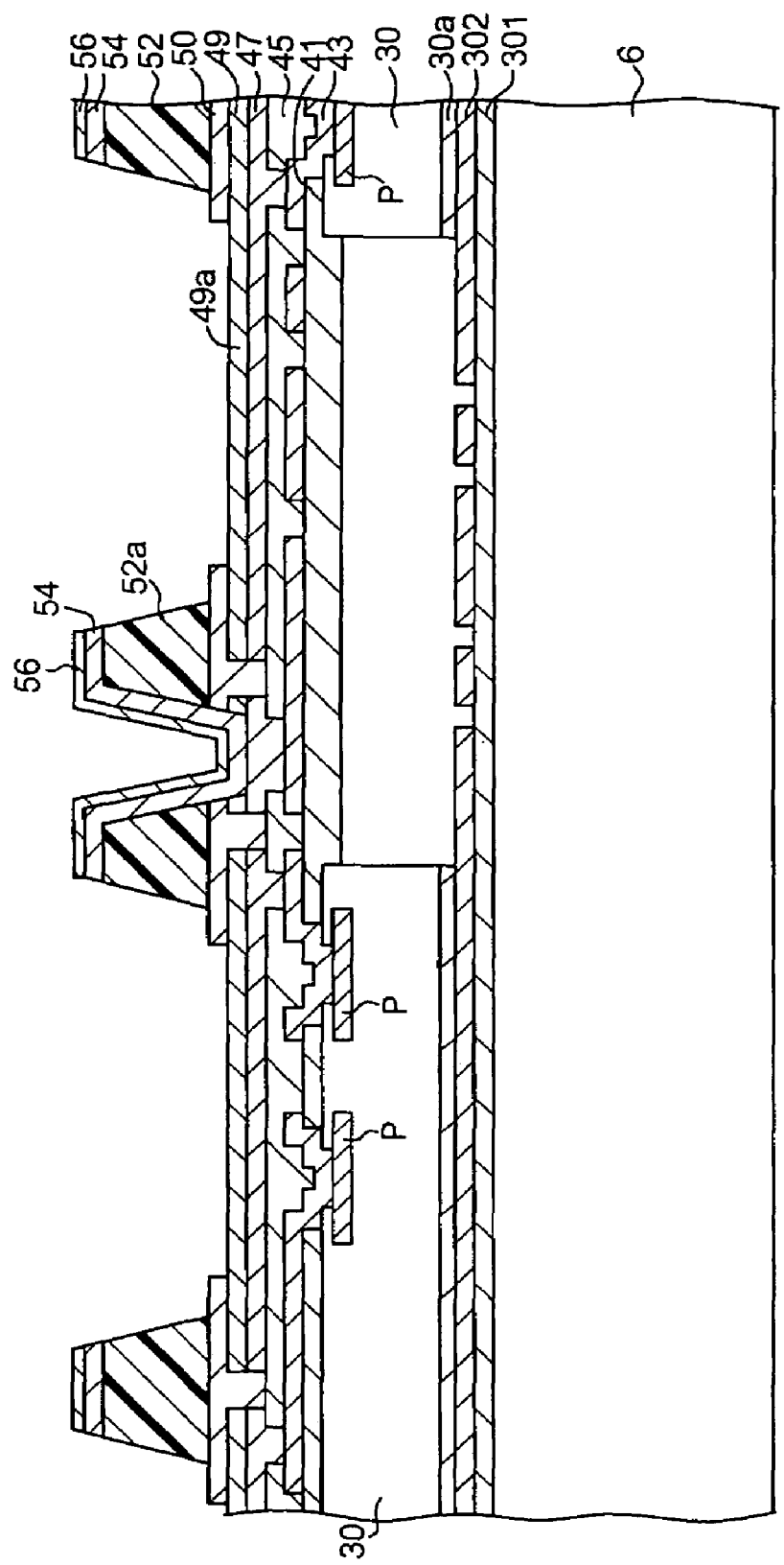
FIG. 30 is a schematic illustrating a process in which a bank layer is formed in the above method.

Subsequently, re-exposure and development using the conductive layer 54 as a mask are carried out for the resin film 705. As a result, as shown in FIG. 30, the pixel aperture portions 52a are provided above the anode portions 49a of the resin film 705. Then, the bank shape is fixed by baking the resin film 705. Through the above processes, the bank layer 52 is obtained. Subsequently, the plasma process, using 4-fluorine methane as a reaction gas, is carried out for the bank layer 52, and thus a lyophobic group is introduced into the surface thereof. By doing so, the surface of the bank layer 52 is lyophobic. On the other hand, since the lyophobic group is not introduced into the third insulating layer 50 or the anode layer 49, the surfaces thereof are lyophillic.

Figure 31:
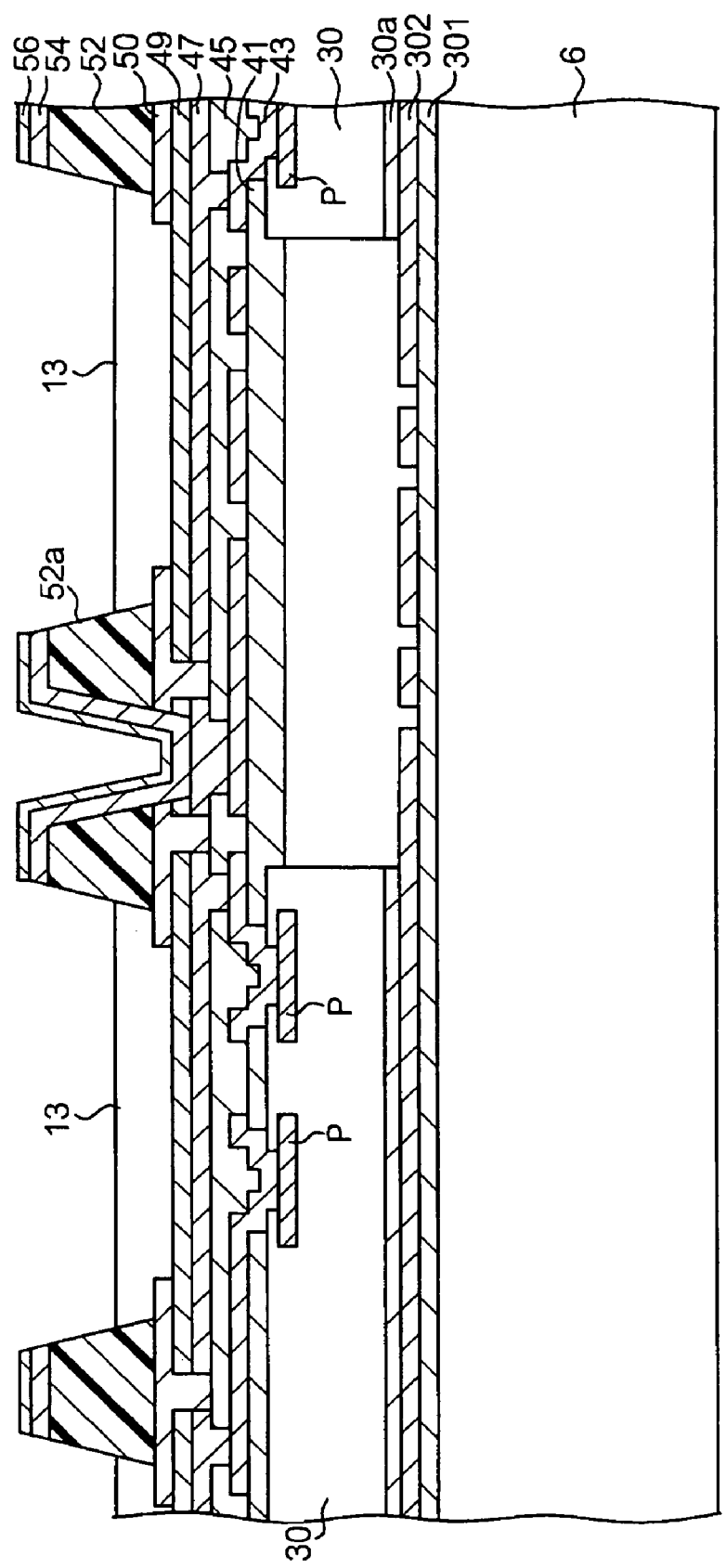
FIG. 31 is a schematic illustrating a process in which an EL layer is formed in the above method.

Next, as shown in FIG. 31, the EL layer 13 is formed in each of the pixel aperture portions 52a of the bank layer 52. When the EL layer 13 is made of a high polymer material, for example, PEDO (polythiophene)/PSS or PAni (polyanine) is first applied as a hole injection layer. Subsequently, the solution in which the light-emitting material, such as polyparaphenylenevinyl (PPV) group, polyvinylcarbasol (PVK) group, or polyfluorine group, is dissolved is applied to overlap the hole injection layer. As described above, the surface of the third insulating layer 50 or the anode layer 49 is lyophillic, while the surface of the bank layer 52 is lyophobic. Therefore, the liquid of the EL layer 13 effectively stays in the pixel aperture portions 52a of the bank layer 52. Furthermore, when the EL layer 13 is made of the high molecular material, a simple method, such as the inkjet method, print, and spin coating method, can be used in its formation. When the EL layer 13 is made of the low molecular material, the evaporation method or the transfer method using a shadow mask can be used in its formation. Furthermore, when the EL layer 13 emitting light of any one of three primary colors is formed for every pixel aperture portion 52a of the bank layer 52, the color display is possible. Or, a color filter may be formed above the EL layer 13 emitting the white light. A configuration of emitting only monochromatic light may be employed.

Figure 32:
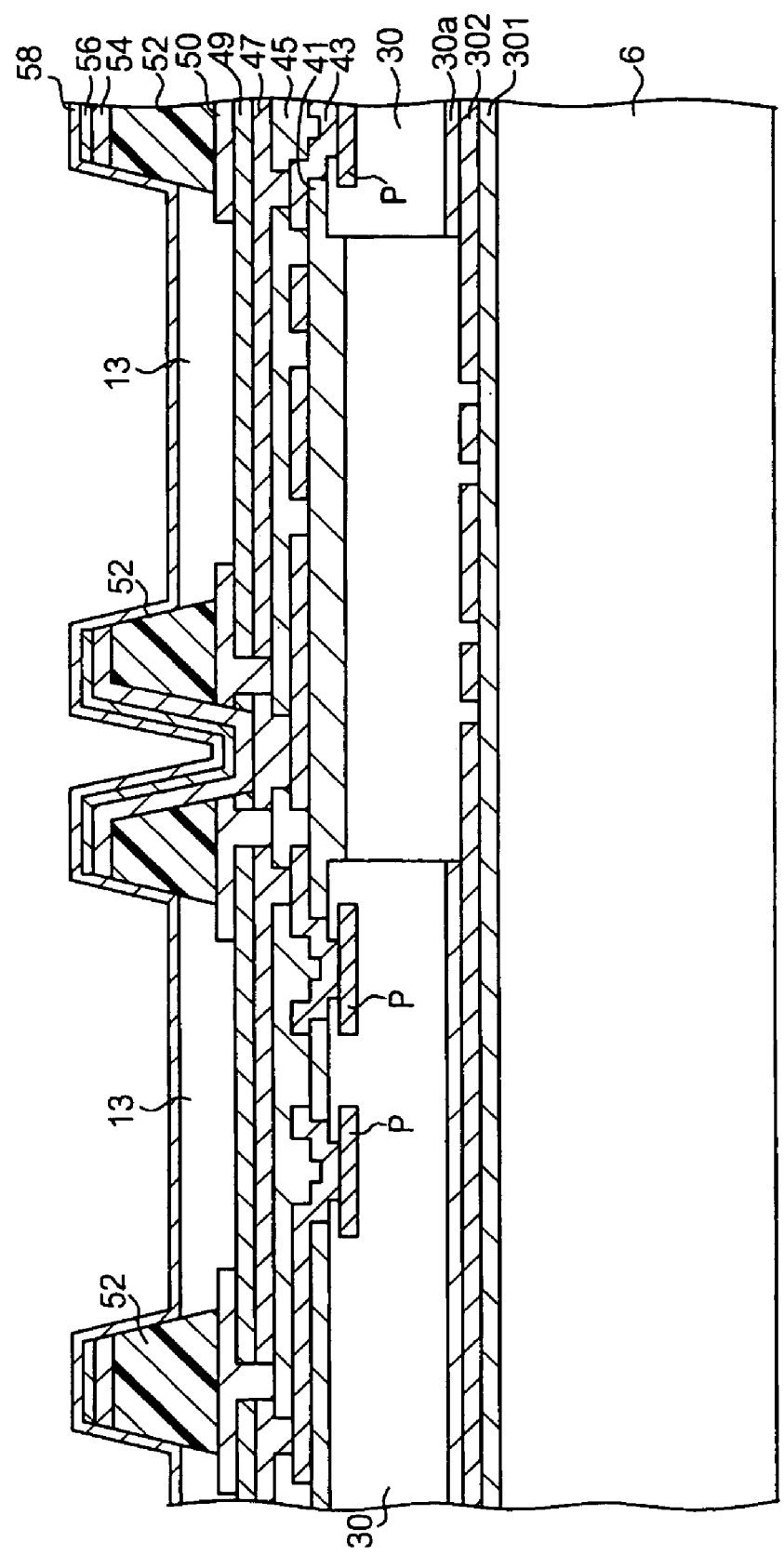
FIG. 32 is a schematic illustrating a process in which a cathode layer is formed in the above method.

Next, as shown in FIG. 32, the cathode layer 58 is formed to cover the whole surface of the bank layer 52 and the EL layer 13. That is, the continuous vapor deposition is carried out in vacuum by a multi-chamber type (cluster tool type) of film formation apparatus. As a result, the cathode layer 58 having a stacked structure of a very thin fluoride film of alkali metal, such as BaF or LiF, a Ca film of about 10 nm to 20 nm thick, and an Au film of about 2 nm to 15 nm thick is formed. Furthermore, the cathode layer 58 is formed after the EL layer 13 has been made of an organic material having low heat resistance. Therefore, it is preferable that the cathode layer 58 be formed in a condition of a temperature as low as possible.

Thereafter, as shown in FIG. 14, the sealing layer 15 including a flattened resin layer 151 and a barrier layer 152 is formed. Specifically, the monomer or the oligomer of resins, such as aryl group or vinyl group, is first ejected in vacuum, and then the resins are coated on the cathode layer 58. Subsequently, the UV ray is irradiated to the resin layer. By dong so, the resin layer is polymerized and hardened, and thus the aforementioned flattened layer 151 is obtained. Next, a thin film of metal oxide, such as $Al_2O_3$ or $SiO_2$, is formed on the flattened resin layer 151 by various film forming methods, and the barrier layer 152 is obtained. Various film forming methods, such as the vacuum deposition method, the sputtering method or the ion plating method, can be used in this film formation. In this exemplary embodiment, the flattened resin layer 151 and the barrier layer 152 are formed repeatedly. As a result, as shown in FIG. 14, the sealing layer 15 in which the plural flattened resin layers 151 and the plural barrier layers 152 are stacked alternatively is obtained. Thereafter, the protective member adheres to the surface of the uppermost barrier layer 152. Through the above processes, the electro-optical device D is completed.

According to the first exemplary manufacturing method, the following advantages can be obtained.

(1) Since the electro-optical device D is obtained by sequentially stacking three layers of the electronic component layer 3, the wire-forming layer 2, and the organic EL layer 1, it is possible to simplify the manufacturing processes and to reduce the manufacturing cost. In addition, since the respective layers are stacked without clearance, a very thin (about 1 mm thick) and very light electro-optical device can be obtained.

(2) The pixel-driving IC chips 37, which include the pixel circuits 377 to drive the organic EL elements 10, are provided in the electronic component layer 3, while the organic EL elements 10 are provided in the organic EL layer 1 positioned above the electronic component layer 3. Therefore, when selecting the positions in which the organic EL elements 10 should be arranged, it is not necessary to consider space to arrange the pixel circuits 377. The aperture ratio can be enhanced without limitation imposed by the pixel circuit 377.

(3) Since various wires are formed in a lump in the wire-forming layer 2 positioned between the electronic component layer 3 and the organic EL layer 1, the degree of freedom in the layout design of the wires can be enhanced, as compared with a case in which the wires are included in the electronic component layer 3 or the organic EL layer 1.

(4) The contact holes 41a of the first insulating layer 41 are formed in a lump by photolithography technology, and the first wiring layer 43 is formed in a lump to fill in the contact holes 41a. Therefore, even if the first pads P1 of the IC chips 30 have a very small size of 16 μm in length and 16 μm in width, each of the first pads P1 and the first wiring layer 43 are surely connected in a bundle. Furthermore, even if the number of pads P is large, the time required to connect the wires with the pads does not vary, and thus it is possible to enhance productivity or accomplish high degree of integration of wires.

Stacked Structure by Second Manufacturing Method

Figure 33:
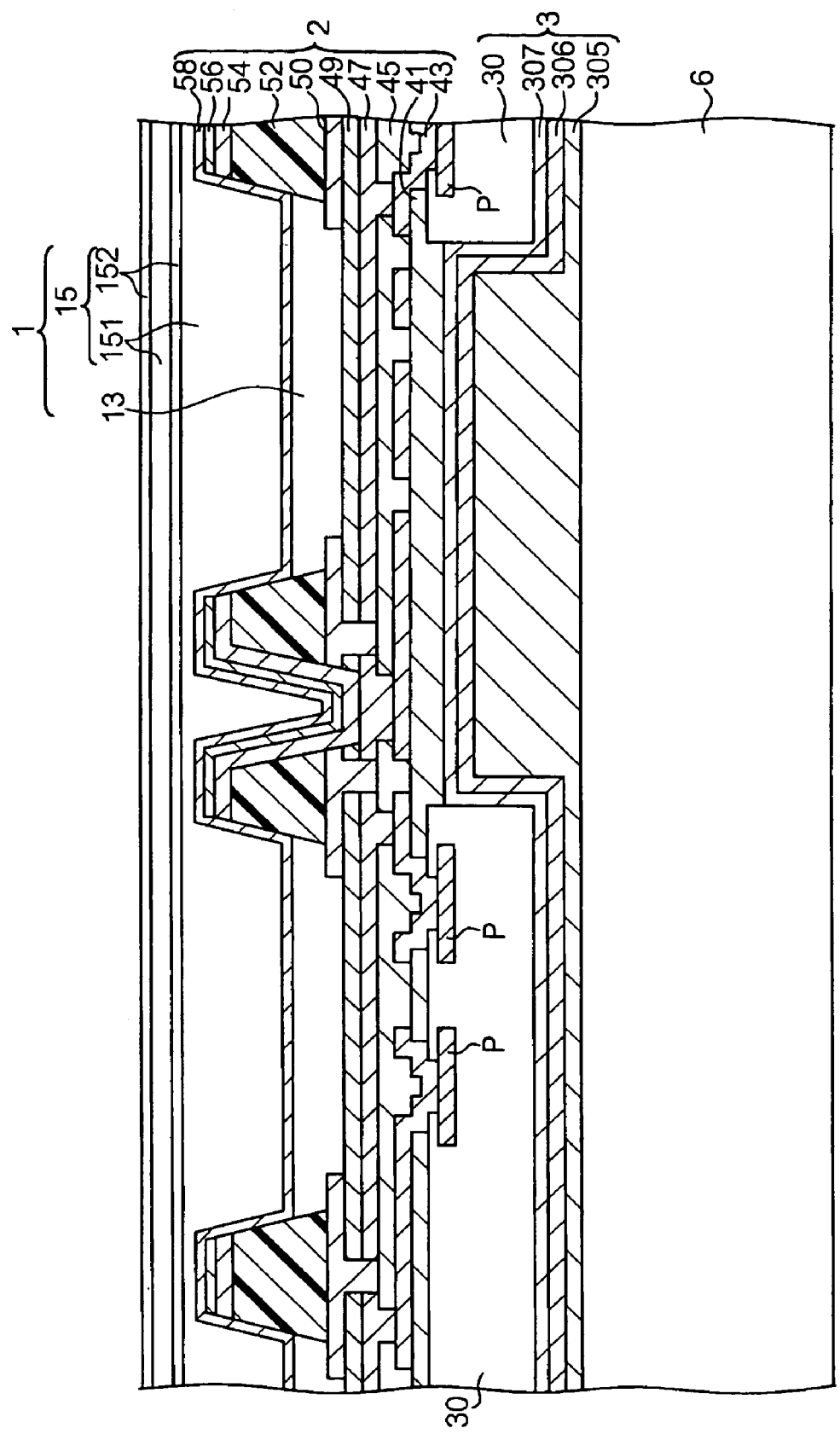
FIG. 33 is a cross-sectional view illustrating a configuration of an electro-optical device obtained according to a second exemplary manufacturing method.

Next, the stacked structure of the electro-optical device D, obtained by the second exemplary manufacturing method, will be described with reference to FIG. 33. In FIG. 33, the reference numerals common to the parts in FIG. 14 are marked identically to those of the electro-optical device D obtained by the first exemplary manufacturing method. The plane configuration of the electro-optical device D is as shown in FIG. 16. The electro-optical device D, shown in FIG. 33, has the same configuration as the electro-optical device D shown in FIG. 14, except for the structure of the electronic component layer 3.

As shown in FIG. 33, the electronic component layer 3 of the electro-optical device D includes the filling layer 305, the light-shielding layer 306, the base layer 307, and the IC chips (herein, the pixel-driving IC chips 37). The filling layer 305 is provided on the whole surface of the support substrate 6 to fill in the gaps among the respective IC chips 30. The filling layer 305 is made of a material having high heat radiation. By doing so, since the thermal uniformity of the whole electro-optical device D increases, generation of defects due to heat can be suppressed. Furthermore, the filling layer 305 is made of a material in which the coefficient of linear expansion is close to that of the IC chip 30. Therefore, the generation of heat stress, due to difference in the coefficient of linear expansion between the filling layer 305 and the IC chip 30, can be suppressed. Specifically, the filling layer 305 is made of a heat-resistant resin material in which silica filler is doped, glass of low-melting point, oxide, or metal such as copper.

The light-shielding layer 306 is provided on the filling layer 305 to cover the whole surface of the support substrate 6 including the regions in which the IC chips 30 are arranged. The light-shielding layer 306 is a layer to prevent the incident light from the support substrate 6 side from traveling toward the IC chips 30, and is made of, for example, a metal such as aluminum or copper. The malfunction of the IC chips 30 due to irradiation of light can be prevented by the light-shielding layer 306. Furthermore, when the filling layer 306 is made of a light-shielding conductive material, the light-shielding layer 306 can be omitted.

The base layer 307 is provided on the light-shielding layer 306 to cover the whole surface of the support substrate 6. The base layer 307 is a layer to form the wire-forming layer 2, and is made of, for example, silicon oxide. The stress generated in accordance with deformation of the filling layer 305 can be released by the base layer 307. Each of the respective IC chips 30 is arranged on the base layer 307 in a state that its substrate surface is opposite to the support substrate 6. The base layer 307 prevents impurities from infiltrating from the support substrate 6 or the filling layer 305 to the IC chips. Furthermore, the base layer 307 also electrically insulates the wires included in the wire-forming layer 2 from the light-shielding layer 306.

Second Manufacturing Method

Next, the method of manufacturing the electro-optical device D shown in FIG. 33 will be described.

Figure 34:
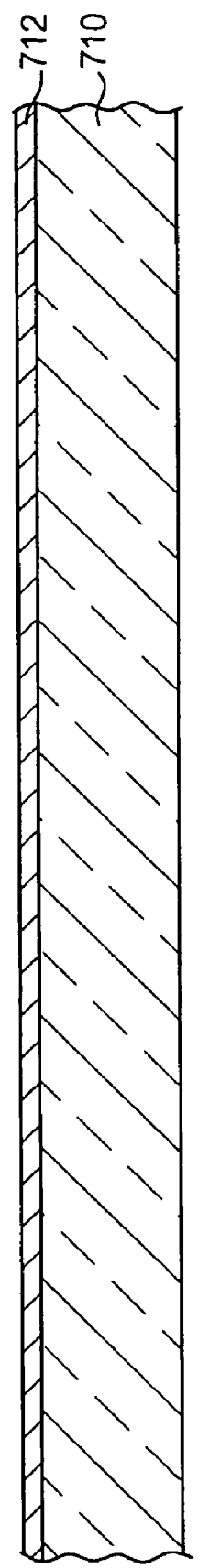
FIG. 34 is a schematic illustrating a process in which a photo-peeling layer is formed on a substrate in the second exemplary manufacturing method.

First, as shown in FIG. 34, a light peeling layer 712 is formed on the whole surface of a substrate 710. The substrate 710 is a plate-shaped member having light transmission, and is made of, for example, glass. On the other hand, the light peeling layer 712 is obtained by depositing amorphous silicon using the plasma CVD method.

Figure 35:
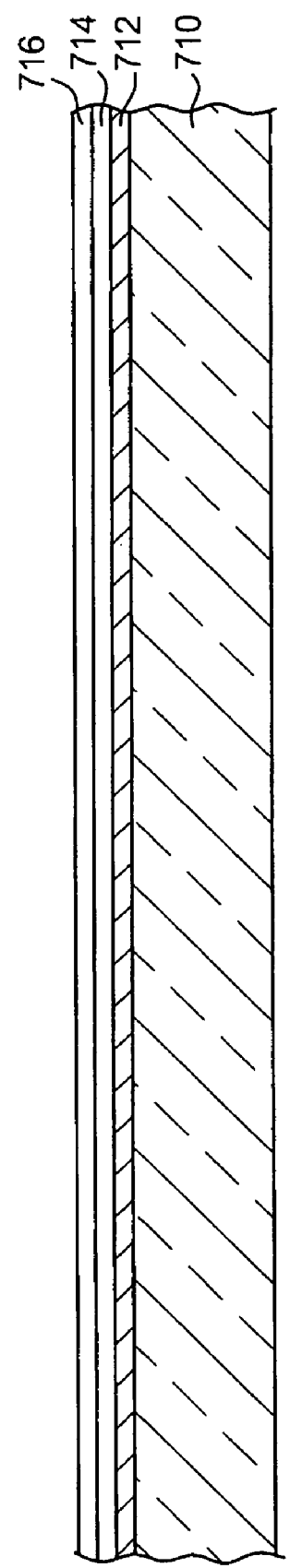
FIG. 35 is a schematic illustrating a process in which a metal layer and an adhesive layer are formed in the second exemplary manufacturing method.

Subsequently, as shown in FIG. 35, a metal layer 714 is formed on the light peeling layer 712. The metal layer 714 is obtained by depositing aluminum by, for example, the sputtering method. Thereafter, the patterning process and the etching process using a photo-mask are carried out for the metal layer 714. By doing so, the alignment marks to adjust the positions of the respective IC chips 30 are formed.

Next, as shown in FIG. 35, a resin film 716 is formed to cover the light peeling layer 712. The resin film 716 is a layer which would be the first insulating layer 41 in a subsequent process, and is made of a heat-resistant organic material. The resin film 716 is formed by the spin coating method or the painting, etc. In this process, the resin film 716 is in a semi-polymerized state and has adhesion. The thickness of the resin film 716 is about 0.1 m to 5 μm.

Figure 36:
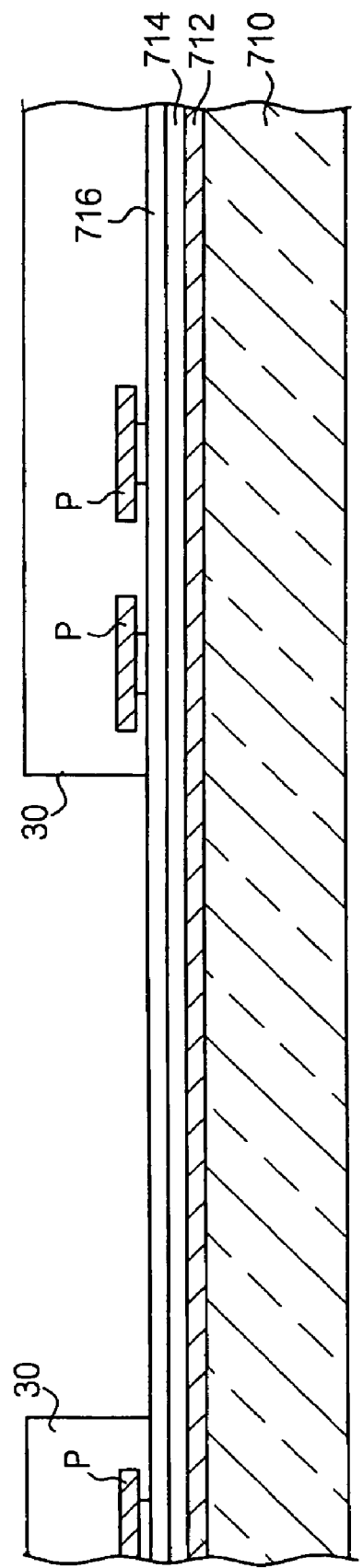
FIG. 36 is a schematic illustrating a process in which IC chips are arranged in the second exemplary manufacturing method.

Next, as shown in FIG. 36, the respective IC chips 30 are arranged in predetermined positions on the resin film 716. At that time, the respective IC chips 30 are arranged on the resin film 716 in a state in which their pad formed surfaces face the substrate 710. Therefore, the pads P can be prevented from being damaged in subsequent processes. In addition, the relative positional relationship between each IC chip 30 and the substrate 710 is adjusted by observing the alignment marks of the metal layer 714. A high precision bare chip mounter having, a mount precision of ±5 μm or less, is used to arrange the IC chips 30. After all the IC chips 30 are arranged, the resin film 716 is baked and thus completely polymerized. By doing so, the adhesion between the resin film 716 and the respective IC chips 30 is enhanced.

Figure 37:
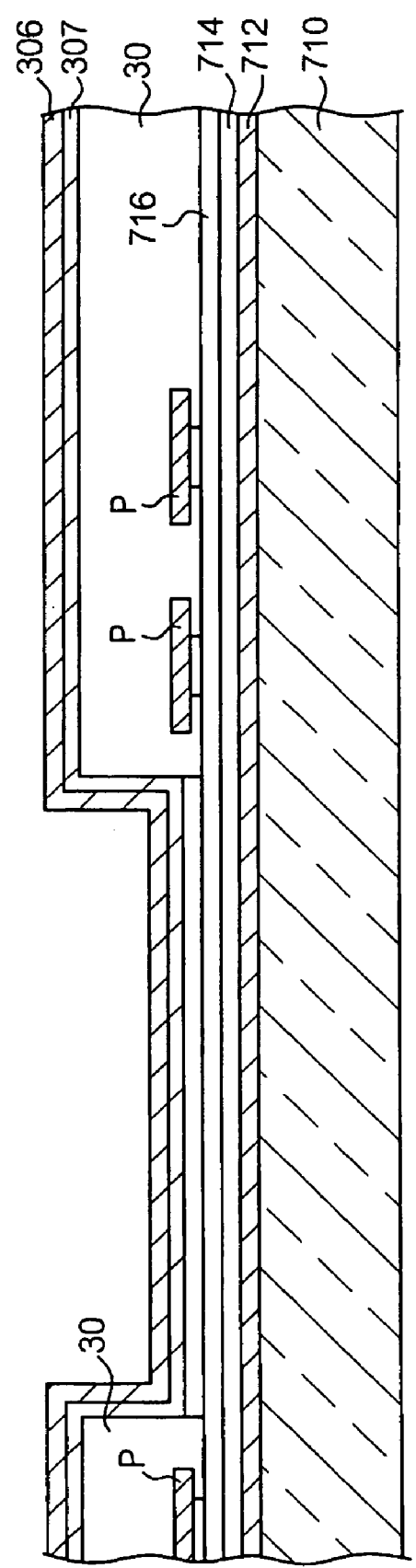
FIG. 37 is a schematic illustrating a process in which a substrate layer and a light-shielding layer are formed in the second exemplary manufacturing method.

Next, as shown in FIG. 37, the base layer 307 covering the whole surface of the substrate 710 on which the IC chips 30 are arranged is formed. The base layer 307 is obtained by depositing $SiO_2$ using, for example, the plasma CVD method. The thickness of the base layer 307 is about 100 nm to 500 nm. Subsequently, as shown in FIG. 37, the light-shielding layer 306 is formed to cover the whole surface of the base layer 307. The light-shielding layer 306 is obtained by depositing metal such as copper or aluminum using the sputtering method.

Figure 38:
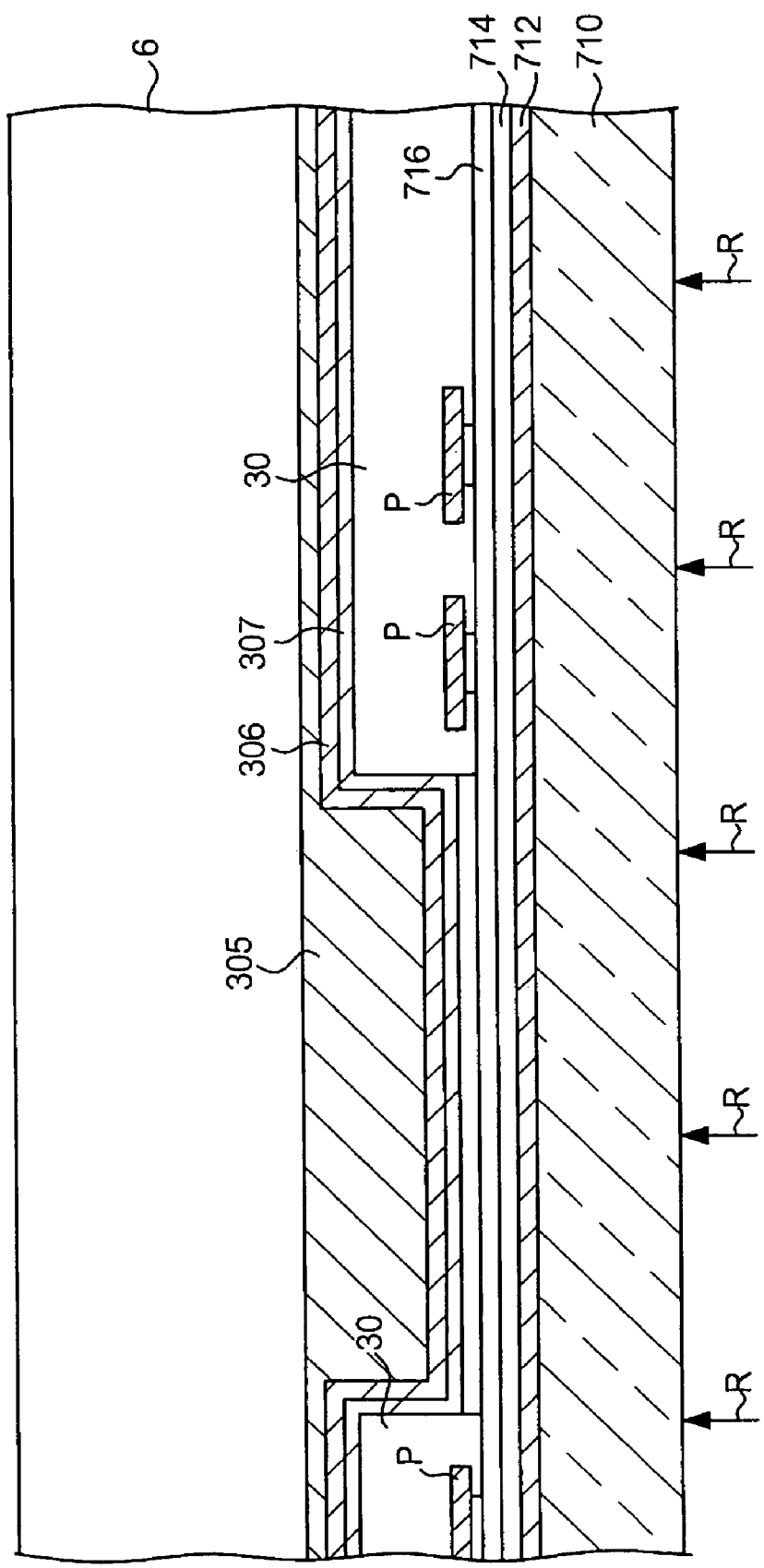
FIG. 38 is a schematic illustrating a process in which a support substrate adheres in the second exemplary manufacturing method.

Furthermore, as shown in FIG. 38, a hard resin is filled in the gaps among the respective IC chips 30. This hard resin is, for example, a heat-resistant resin material in which silica filler is doped, or glass of low-melting point. Subsequently, the support substrate 6 adheres to the substrate surfaces of the IC chips 30 through the hard resin. At that time, the IC chips 30 are used as spacers to adjust the space between the support substrate 6 and the substrate 710. Thereafter, the filling layer 305 is obtained by hardening the hard resin by heating.

Next, as shown in FIG. 38, the excimer laser light R, which is an ultraviolet ray, is irradiated toward the substrate 710. By doing so, the light peeling layer 712 is exploded. That is, hydrogen contained in the light peeling layer 712 is vaporized, and thus cracks are generated in the light peeling layer 712. In this state, the substrate 710 is peeled off by the light peeling layer 712. Subsequently, the metal layer 714 and the light peeling layer 712 are removed by an etching solution. The etching solution dissolves the metal layer 714 and the light peeling layer 712, but does not affect the resin film 716.

Figure 39:
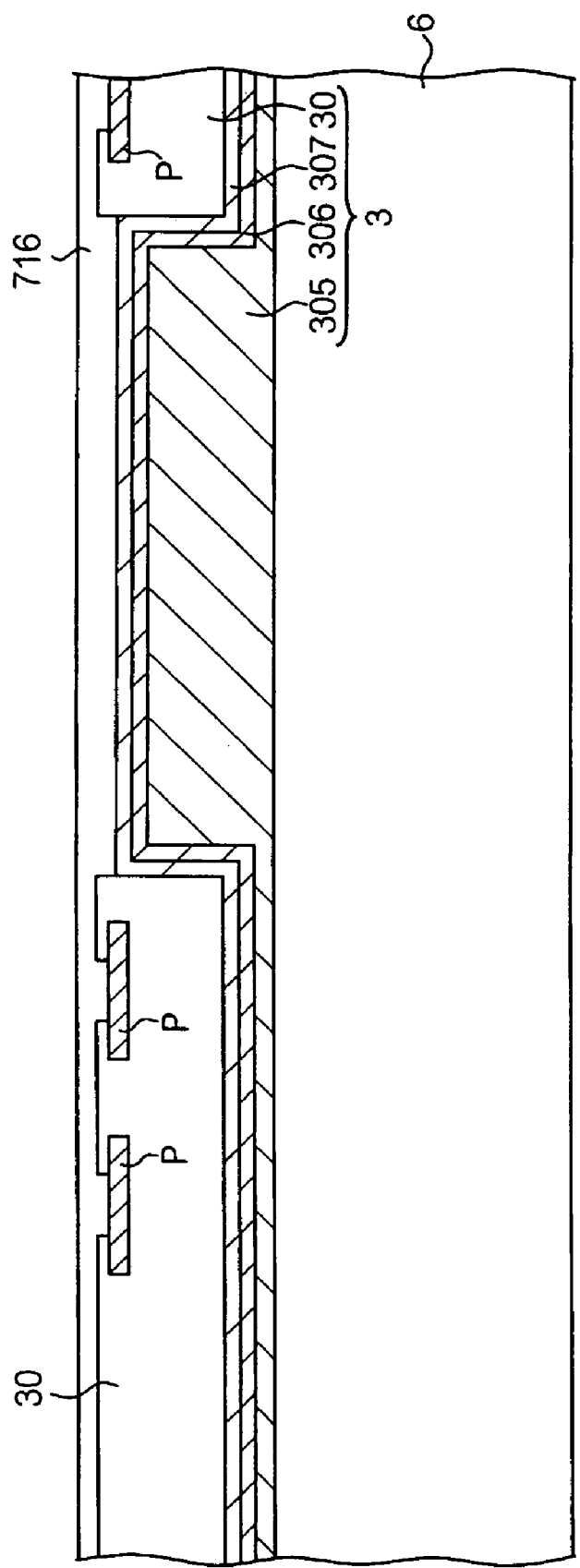
FIG. 39 is a schematic illustrating a state in which the substrate peels off in the second exemplary manufacturing method.

Thereafter, as shown in FIG. 39, the support substrate 6 is reversed such that the surface on which the IC chips 30 are provided is directed upward. By doing so, the electronic component layer 3 of the electro-optical device D shown in FIG. 33 is formed. In the electronic component layer 3 obtained by this manufacturing method, the pad formed surfaces of the respective IC chips 30 and the surface of the base layer 307 are positioned in almost the same plane. Thereafter, the patterning process and the etching process are carried out for the resin film 716 to obtain the first insulating layer 41. The subsequent manufacturing processes are similar to the first manufacturing method shown in FIGS. 20 to 32.

According to the second exemplary manufacturing method, the following advantages are obtained.

(1) Since the gaps among the respective IC chips 30 are filled by the filling layer 305, it is not necessary to flatten the filling layer 305 to suit the surfaces of the respective IC chips 30. Therefore, it is possible to simplify the manufacturing processes. In addition, as compared with the first exemplary manufacturing method, it is not necessary to make the IC chips 30 thin, and thus the respective IC chips 30 can be easily handled. Therefore, the possibility that defects may occur in the IC chips 30 during the manufacturing processes can be reduced.

(2) Since the base layer 307 or the filling layer 305 is formed in a state in which the pads P of the respective IC chips 30 are directed to the substrate 710, the pads P may be prevented from being damaged when forming the layers. Therefore, the electrically bad connection between each of the IC chips 30 and the first wiring layer 43 may be prevented. As a result, the characteristics of the electro-optical device D are maintained at a high level, and the throughput may be enhanced.

(3) Since the respective IC chips 30 are fixed by the base layer 307 or the filling layer 305, it is not necessary to fix the respective IC chips 30 after closely adhering them to the substrate 710. Since it is sufficient to arrange only the respective IC chips 30, the time required to mount the respective IC chips 30 is shortened.

(4) Since the wire-forming layer 2 is stacked on the electronic component layer 3 in which the pads P are exposed, for example, it is possible to collectively connect the pads P of the IC chips 30 with the wires of the wire-forming layer 2 using the photolithography technology. Therefore, it is not necessary to provide bumps and the like to connect the pads P of the respective IC chips 30 with the wires. As a result, it is possible to simplify the manufacturing processes and shorten the manufacturing time.

(5) Since the resin film 716, which would be the first insulating layer 41, is used as the layer to adhere the respective IC chips 30, the manufacturing processes can be simplified, as compared with the method of providing the adhesive layer separately from the insulating layer 41. However, a method of providing the adhesive layer separately from the insulating layer 41 may be employed. Instead of the resin film 716 in FIG. 35, a method, in which the adhesive layer is provided to adhere the respective IC chips, and then the adhesive layer is removed after peeling off the substrate 710, may be employed. In this case, after removing the adhesive layer, the first insulating layer 41 is formed.

However, the power source line, to which the power source potential of high potential or low potential, is applied, can be formed by a process separate from the process in which the first wiring layer 43 and the second wiring layer 47 are formed. For example, as described below, a process of forming the power source line can be carried out just before the process of arranging the respective IC chips 30 in the second exemplary manufacturing method.

Figure 40:
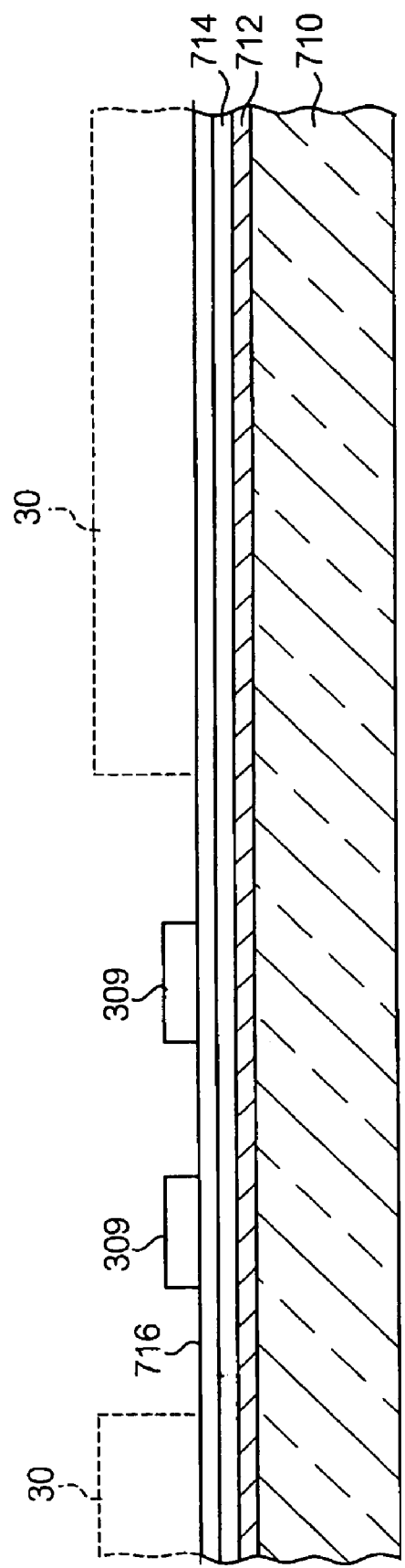
FIG. 40 is a schematic illustrating a process in which power source lines are formed in another example of the second exemplary manufacturing method.

First, as shown in FIG. 36, before the respective IC chips 30 are arranged, the power source line 309 is formed on the resin film 716. In FIG. 40, profiles of the respective IC chips 30 to be arranged on the resin film 716 in the subsequent process are marked in dotted lines. The power source lines 309 are formed at a position not overlapping the alignment marks of the metal layer 714, in regions other than the regions in which the respective IC chips 30 would be arranged.

Specifically, a conductive layer made of a conductive material, such as aluminum or copper, is first formed on the resin film 716. The conductive layer can be formed by, for example, the electroless plating, the sputtering or the inkjet technology. Next, the patterning process and the etching process are carried out for the conductive layer to obtain the power source line 309 shown in FIG. 40. Thereafter, similarly to the process shown in FIG. 36, the respective IC chips 30 are arranged on the resin film 716, and then the light-shielding layer 306 and the base layer 307 are formed to cover the power source line 309 and the IC chips 30. The processes thereafter are as described above. Furthermore, in another example, the process of forming the power source line 309 can be carried out right after the respective IC chips 30 are arranged on the resin film 716. Furthermore, in the first exemplary manufacturing method described above or the third exemplary manufacturing method described later, the power source line 309 can be formed through the same procedure.

Figure 41:
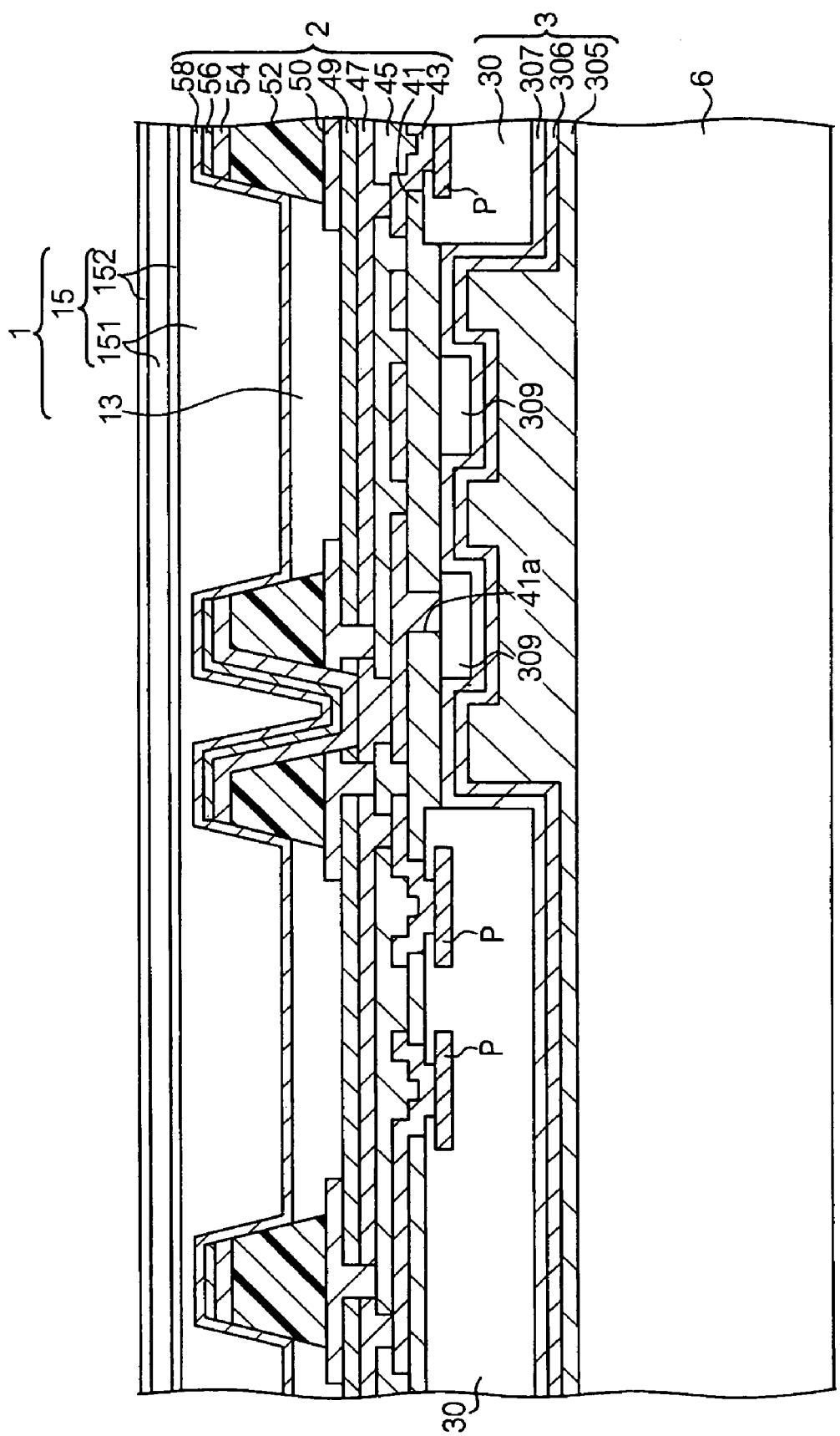
FIG. 41 is a cross-sectional view illustrating a configuration of an electro-optical device obtained according to another example of the second exemplary manufacturing method.

FIG. 41 is a view illustrating the stacked structure of the electro-optical device D obtained by this manufacturing method. As shown in FIG. 41, in this electro-optical device D, the power source lines 309 are situated between the base layer 307 and the first insulating layer 41. The power source lines 309 are connected to the first wiring layer 43 through the contact holes 41a provided in the first insulating layer 41.

Stacked Structure by Third Exemplary Manufacturing Method

Figure 42:
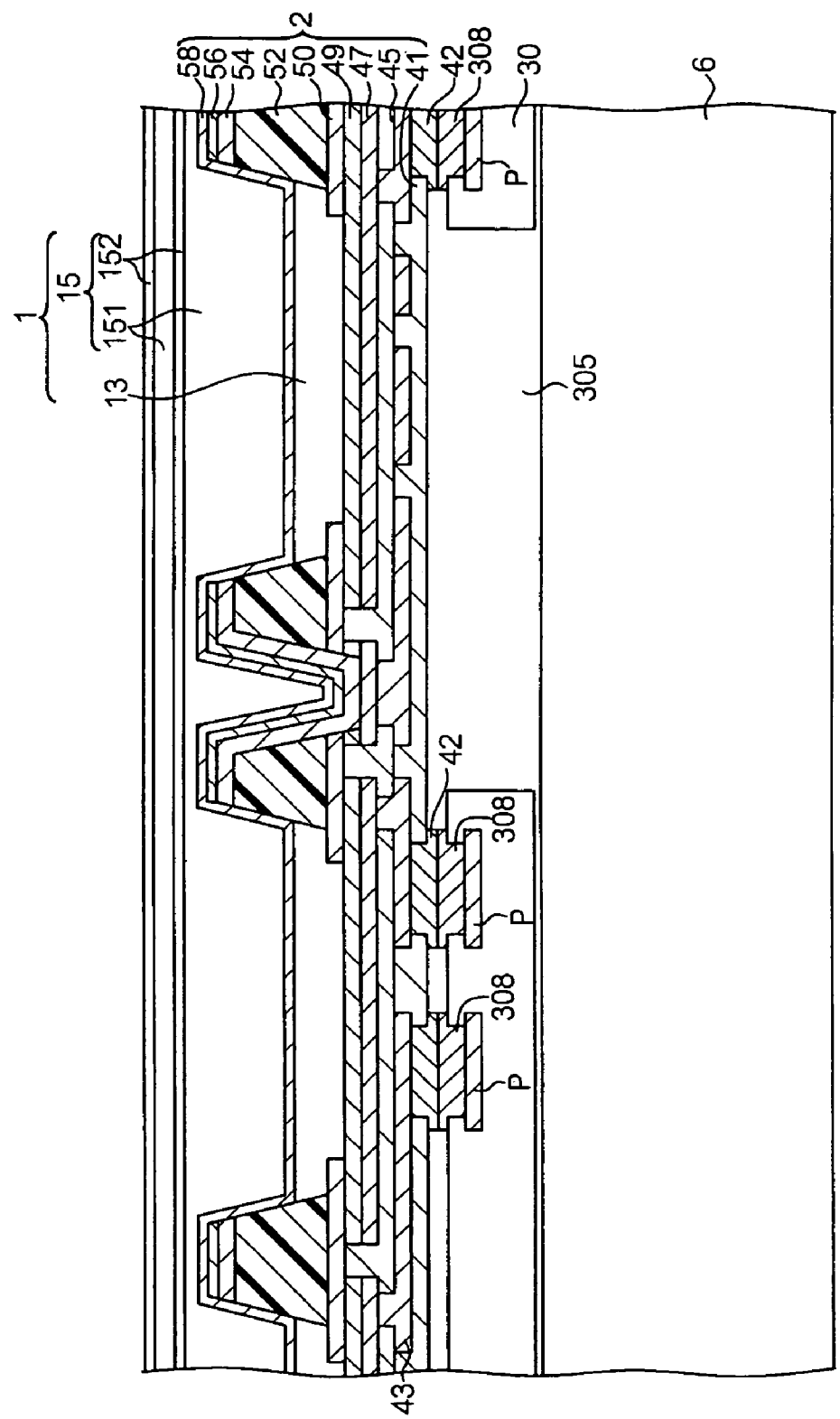
FIG. 42 is a cross-sectional view illustrating a configuration of an electro-optical device obtained according to a third exemplary manufacturing method.

Next, with reference to FIG. 42, the stacked structure of the electro-optical device D obtained by the third exemplary manufacturing method will be described. In FIG. 42, the reference numerals common to the parts of FIG. 14 are marked to the parts identical to those of the electro-optical device D obtained by the first exemplary manufacturing method. The plane configuration of the electro-optical device D is as shown in FIG. 16.

As shown in FIG. 42, in the electro-optical device D obtained by the third exemplary manufacturing method, bumps (projected electrodes) 308 are formed on the pads P of the IC chips 30. The bumps 308 are made of metal, such as indium (In) or gold (Au). The bumps 308 are connected to the bumps 42. The bumps 42 are connected to the first wiring layer 43 through the contact holes 41a opened in the first insulating layer 41. The bumps 42 are made of metal, such as indium or gold, similarly to the bumps 308.

Third Exemplary Manufacturing Method

Next, the method of manufacturing the electro-optical device D shown in FIG. 42 will be described.

Figure 43:
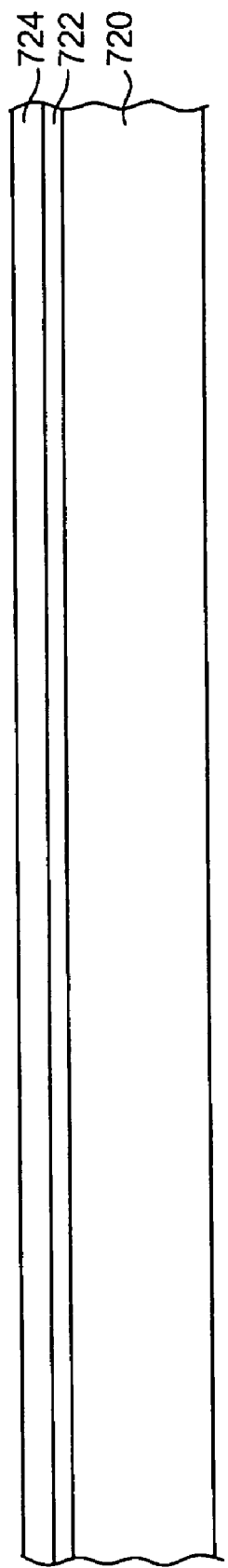
FIG. 43 is a schematic illustrating a process in which a photo-peeling layer is formed in the third exemplary manufacturing method.

First, as shown in FIG. 43, an insulating layer 722 is formed to cover the whole surface of the substrate 720. The substrate 720 is a plate-shaped member having light transmission, and is made of, for example, glass. On the other hand, the insulating layer 722 is obtained by depositing $SiO_2$ using, for example, the plasma CVD method. Furthermore, when the flatness of the insulating layer 722 is not enough, the insulating layer 722 is flattened by the CMP method. Subsequently, as shown in FIG. 43, a light peeling layer 724 is formed on the whole surface of the insulating layer 722. The light peeling layer 724 is obtained by depositing amorphous silicon using, for example, the plasma CVD method.

Figure 44:
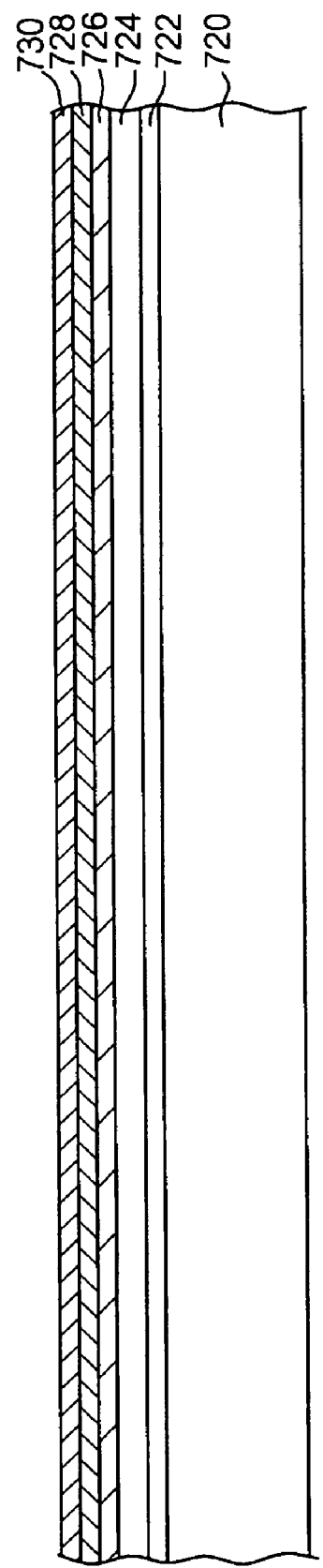
FIG. 44 is a schematic illustrating a process in which an insulating layer and a conductive layer are formed in the third exemplary manufacturing method.
Figure 45:
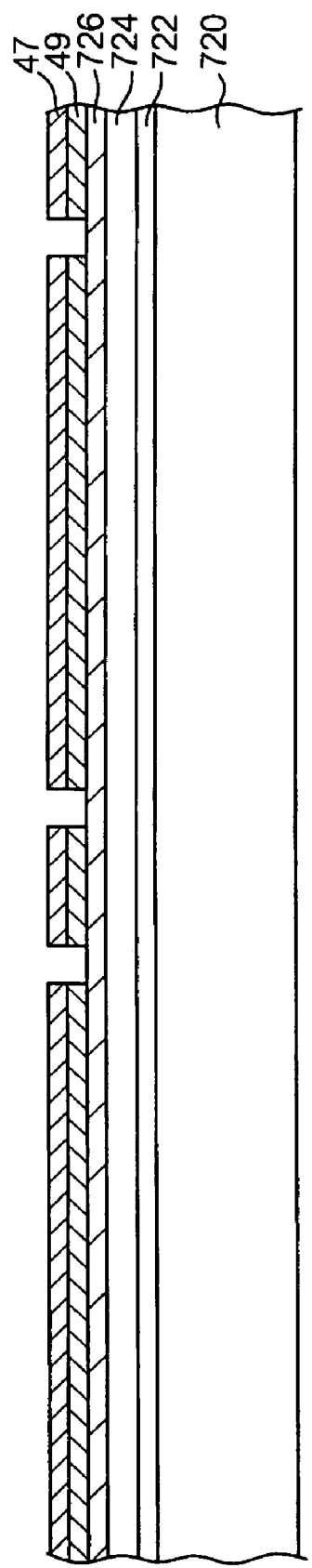
FIG. 45 is a schematic illustrating a process in which a second wiring layer and an anode layer are formed in the third exemplary manufacturing method.

Next, as shown in FIG. 44, an insulating film 726 is formed on the whole surface of the light peeling layer 724. The insulating film 726 is obtained by depositing $SiO_2$ using the plasma CVD method. The insulating film 726 is a layer which would be the third insulating layer 50 shown in FIG. 42. Thereafter, as shown in FIG. 44, a conductive film 728 which would be the anode layer 49 is formed on the insulating film 726. The conductive film 728 is obtained by depositing a conductive material having a large work function, such as ITO, using the sputtering method. In addition, as shown in FIG. 44, a metal film 730 which would be the second wiring layer 47 is formed to cover the conductive film 728. The metal film 730 is obtained by stacking a layer made of aluminum, etc. on the surface of a layer made of titanium, etc. For example, the sputtering can be used to form the metal film 730. Subsequently, as shown in FIG. 45, the patterning process and the etching process using a photo-mask are carried out for the conductive film 728 and the metal film 730 to obtain the anode layer 49 and the second wiring layer 47 shown in FIG. 42.

Figure 46:
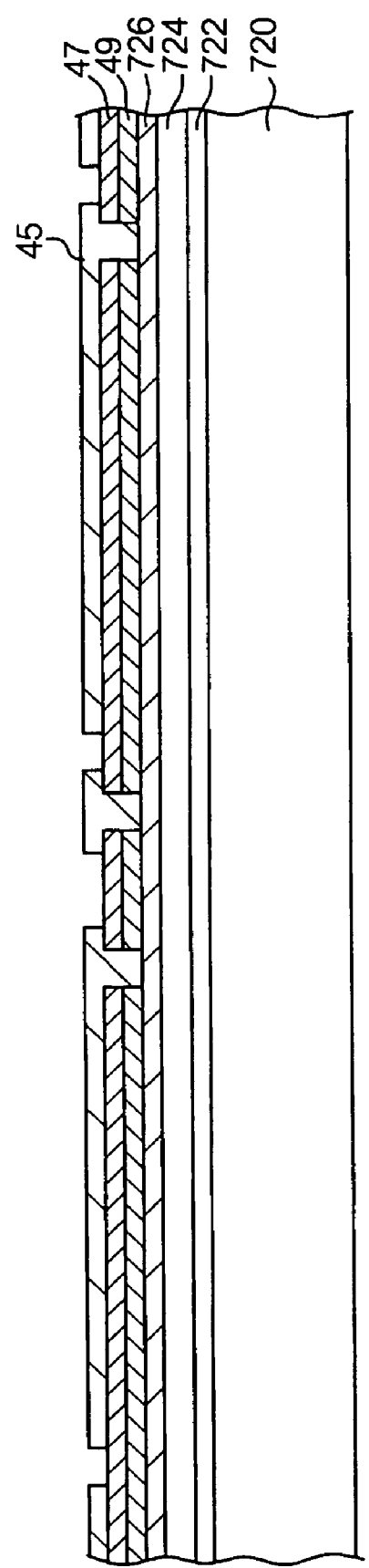
FIG. 46 is a schematic illustrating a process in which a second insulating layer is formed in the third exemplary manufacturing method.
Figure 47:
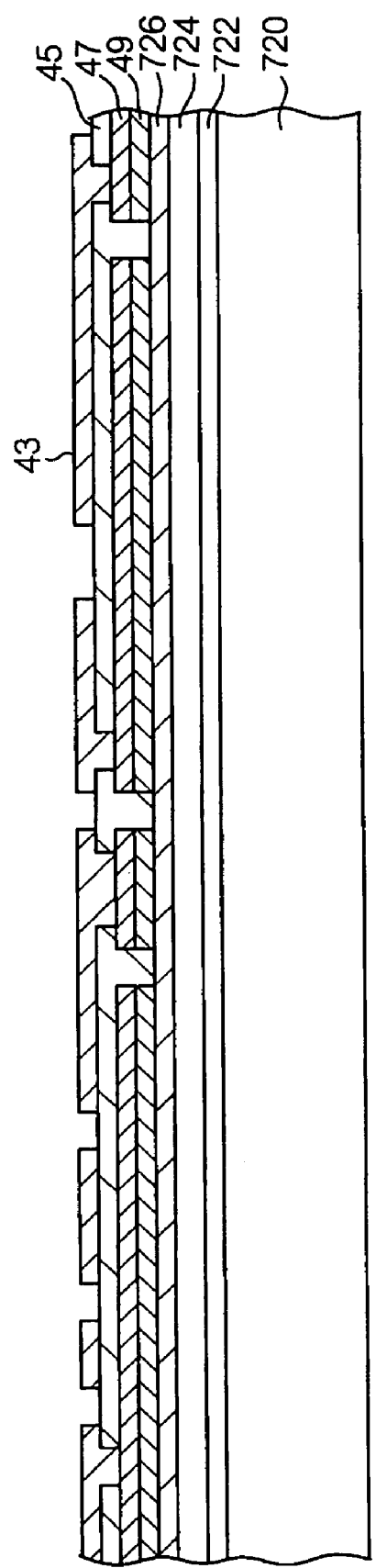
FIG. 47 is a schematic illustrating a process in which a first wiring layer is formed in the third exemplary manufacturing method.

Next, the second insulating layer 45 is formed as shown in FIG. 46. The second insulating layer 45 is obtained by forming an insulating layer made of $SiO_2$ to cover the anode layer 49 and the second wiring layer 47 and then by patterning and etching the insulating layer using the photo-mask. Subsequently, the first wiring layer 43 is formed as shown in FIG. 47. The first wiring layer 43 is obtained by patterning and etching a metal layer made of aluminum formed by the sputtering.

Figure 48:
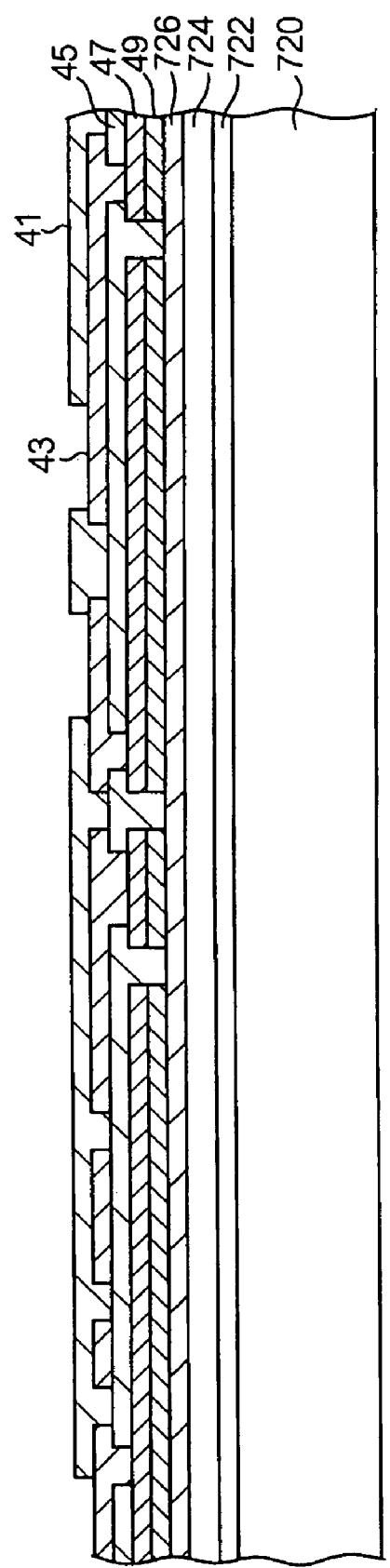
FIG. 48 is a schematic illustrating a process in which a first insulating layer is formed in the third exemplary manufacturing method.
Figure 49:
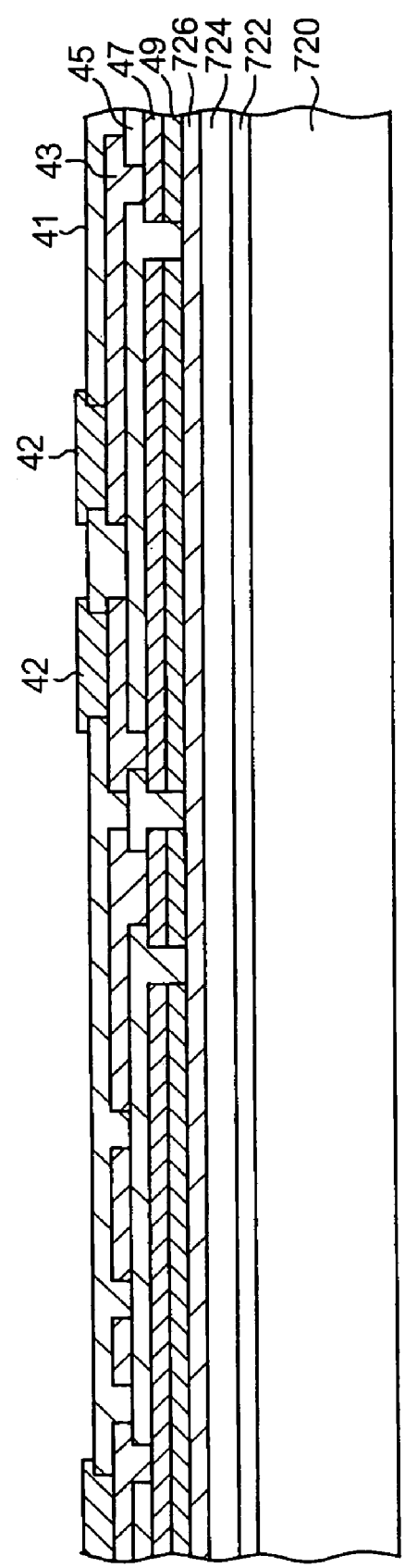
FIG. 49 is a schematic illustrating a process in which bumps are formed in the third exemplary manufacturing method.

Thereafter, the first insulating layer 41 is formed as shown in FIG. 48. That is, first of all, an insulating film made of $SiO_2$, etc. is formed to cover the first wiring layer 43. Then, the portions of the insulating film opposite to the pads P of the IC chips 30 are removed by the patterning process and the etching process to obtain the first insulating layer 41. Subsequently, as shown in FIG. 49, the bumps 42 are formed in the portions of the first wiring layer 43 opposite to the bumps 308 of the IC chips. The bumps 42 are formed to be about 0.5 µm to 5 µm thick by, for example, the lift off method. The bumps 42 are made of metal, such as indium or gold. When the bumps 42 are made of indium, their surfaces are covered with metal such as gold. By doing so, oxidation of the bumps 42 is prevented.

Figure 50:
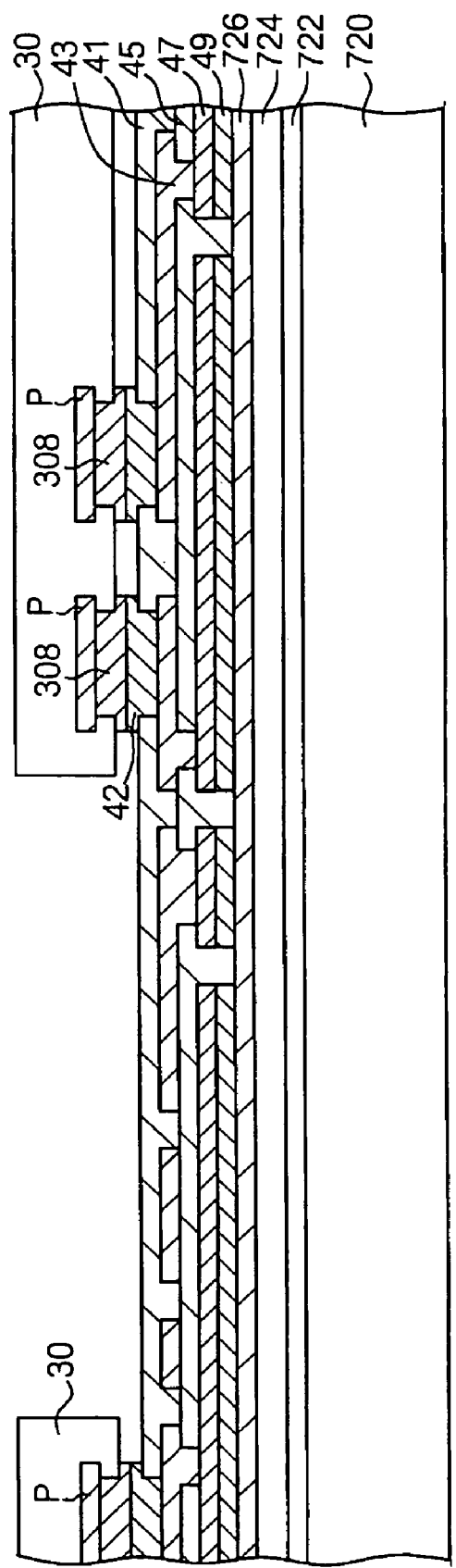
FIG. 50 is a schematic illustrating a process in which the IC chips are arranged in the third exemplary manufacturing method.

On the other hand, the bumps 308 are formed on the pads P of the respective IC chips 30. The bumps 308 are made of metal, such as indium or gold. The thickness of the bumps 308 is about 2 µm to 10 µm. Thereafter, as shown in FIG. 50, the respective IC chips 30 are arranged on the first insulating layer 41 in a state in which the bumps 308 of IC chips 30 are opposite to the bumps 42 on the first wiring layer 43. A high-precision bare chip mounter, having mount precision of ±5 µm or less, is used to arrange the IC chips 30. Subsequently, the bumps 42 and the bumps 308 are heated in an instant. By doing so, the bumps 42 and the bumps 308 are bonded.

Figure 51:
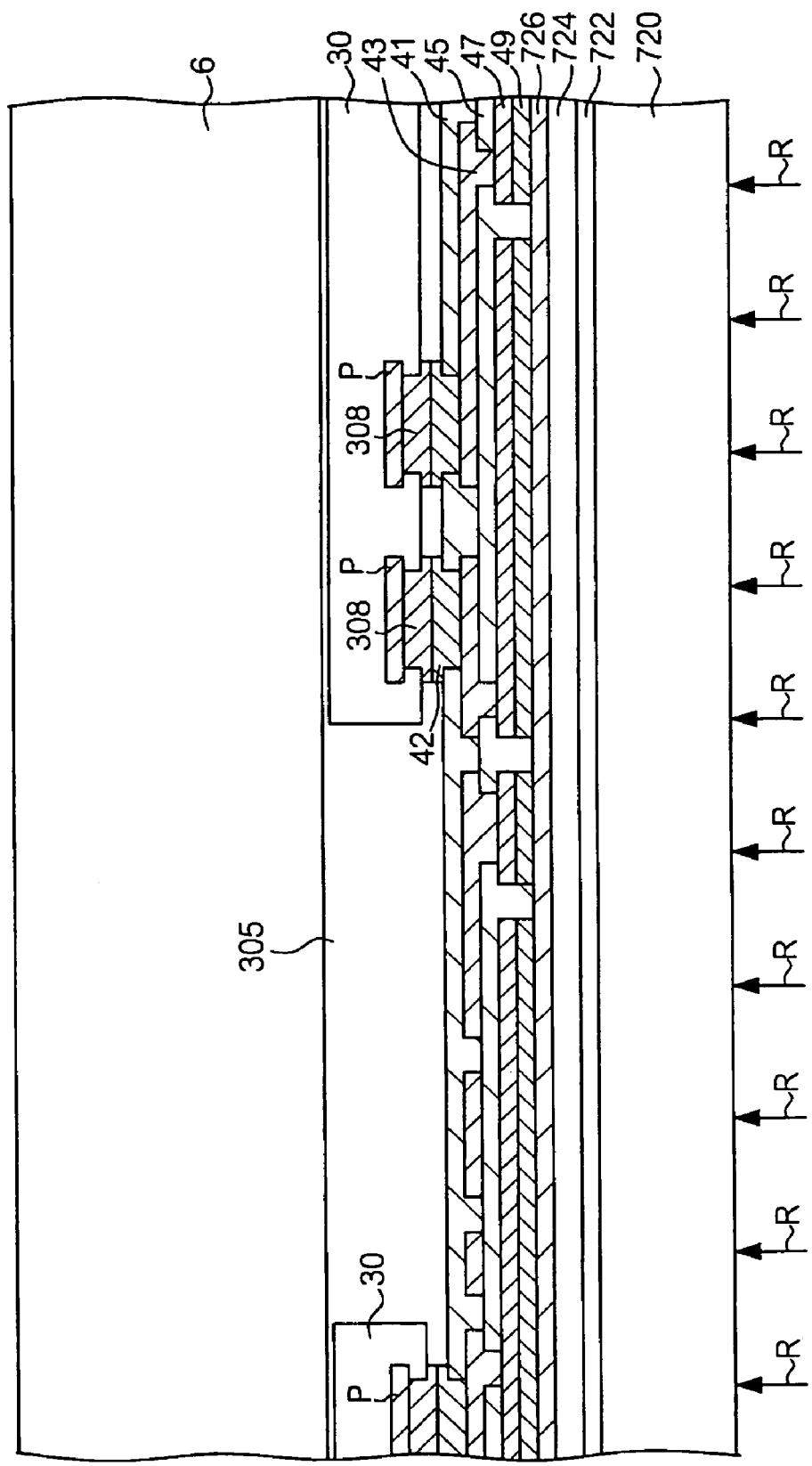
FIG. 51 is a schematic illustrating a process in which a support substrate adheres in the third exemplary manufacturing method.

Next, as shown in FIG. 51, a resin material is filled in the gaps among the respective IC chips 30. The resin material contains carbon particles to have the light-shielding properties. Thereafter, as shown in FIG. 51, the support substrate 6 adheres to the substrate surfaces of the IC chips 30. Furthermore, the resin material filled among the IC chips 30 is hardened to obtain the filling layer 305.

Figure 52:
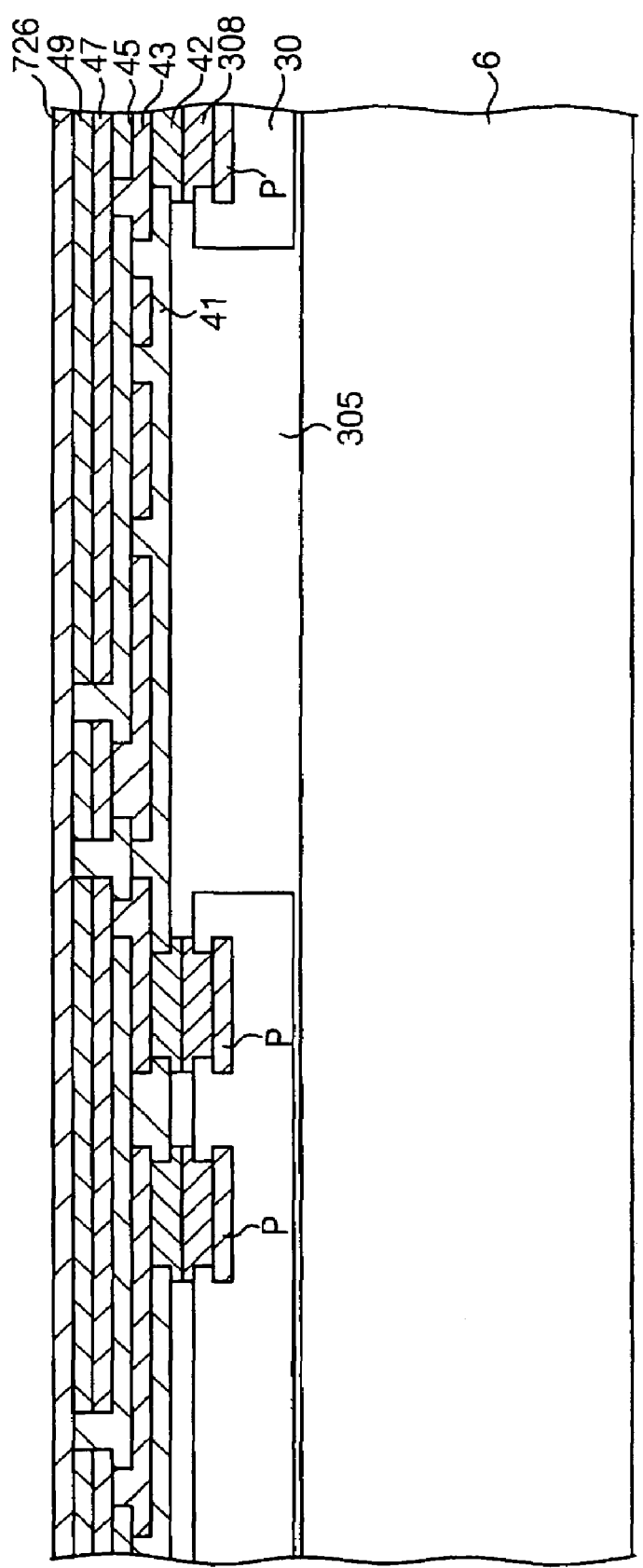
FIG. 52 is a schematic illustrating a state in which the substrate peels off in the third exemplary manufacturing method.

Subsequently, as shown in FIG. 51, the excimer laser light R, which is an ultraviolet ray, is irradiated toward the substrate 720. By doing so, the light peeling layer 724 is exploded, and the substrate 720 is peeled off by he light peeling layer 724 as shown in FIG. 52. Furthermore, the amorphous silicon remaining on the insulating film 726 is removed by the etching process.

Thereafter, the patterning process and the etching process using a photo-mask are carried out for the insulating film 726 to obtain the third insulating layer 50 as shown in FIG. 42. The manufacturing processes thereafter are similar to the first exemplary manufacturing method shown in FIGS. 26 to 32.

According to the third exemplary manufacturing method, the following advantages can be obtained.

Similar to the first and second exemplary manufacturing methods described above, if the anode layer 49 is formed after the electronic component layer 3 or the respective wiring layers, and the respective insulating layers have been formed, the flatness of the surface of the anode layer 49 can be deteriorated due to stepped differences in the layers. According to the third exemplary manufacturing method, the conductive film 728 which would be the anode layer 49, is formed on the flat substrate 720 before forming other elements. Thus the flatness of the surface of the anode layer 49 is maintained at a very high level. Accordingly, the uniformity of the thickness of the organic EL elements 10 is maintained. Therefore the light-emitting brightness can be made to be uniform all over the display surface (the whole area). In addition, the third exemplary manufacturing method can similarly apply to a case where active elements made from the low-temperature polysilicon are used in the electro-optical device D as well as for a case where the IC chips 30, including active elements, are used in the electro-optical device.

C: Electronic Apparatus

Next, the electronic apparatus according to the present invention will be described.

Personal Computer

Figure 53:
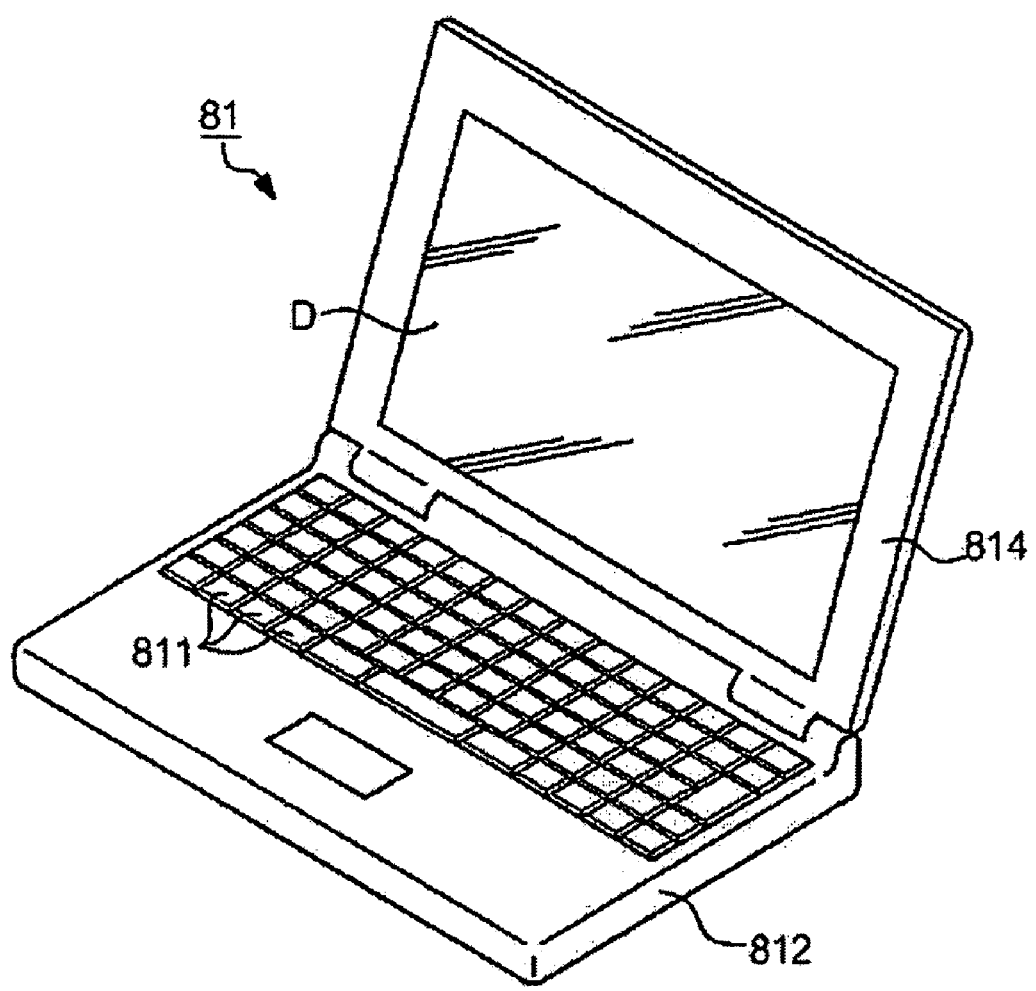
FIG. 53 is a perspective view illustrating a configuration of a personal computer as an example of an electronic apparatus.

FIG. 53 is a perspective view illustrating a configuration of a personal computer as an example of the electronic apparatus according to the present invention. As shown in FIG. 53, the personal computer 81 includes a main body unit 812 including a keyboard 811 and a display unit 814 including the aforementioned electro-optical device D.

In this configuration, the IC chips having various functions relating to the display of images can be included in the electronic component layer 3. Such kind of chips include, for example, IC chips having a display buffer memory or CPU, or IC chips having a data expanding function based on MPEG (Motion Picture Experts Group) or MP3 (MPEG Audio Layer-3), etc. Furthermore, when the display surface of the electro-optical device D is used as a touch panel, the IC chip having a function related to input thereof can be included in the electronic component layer 3.

Electronic Book

Figure 54:
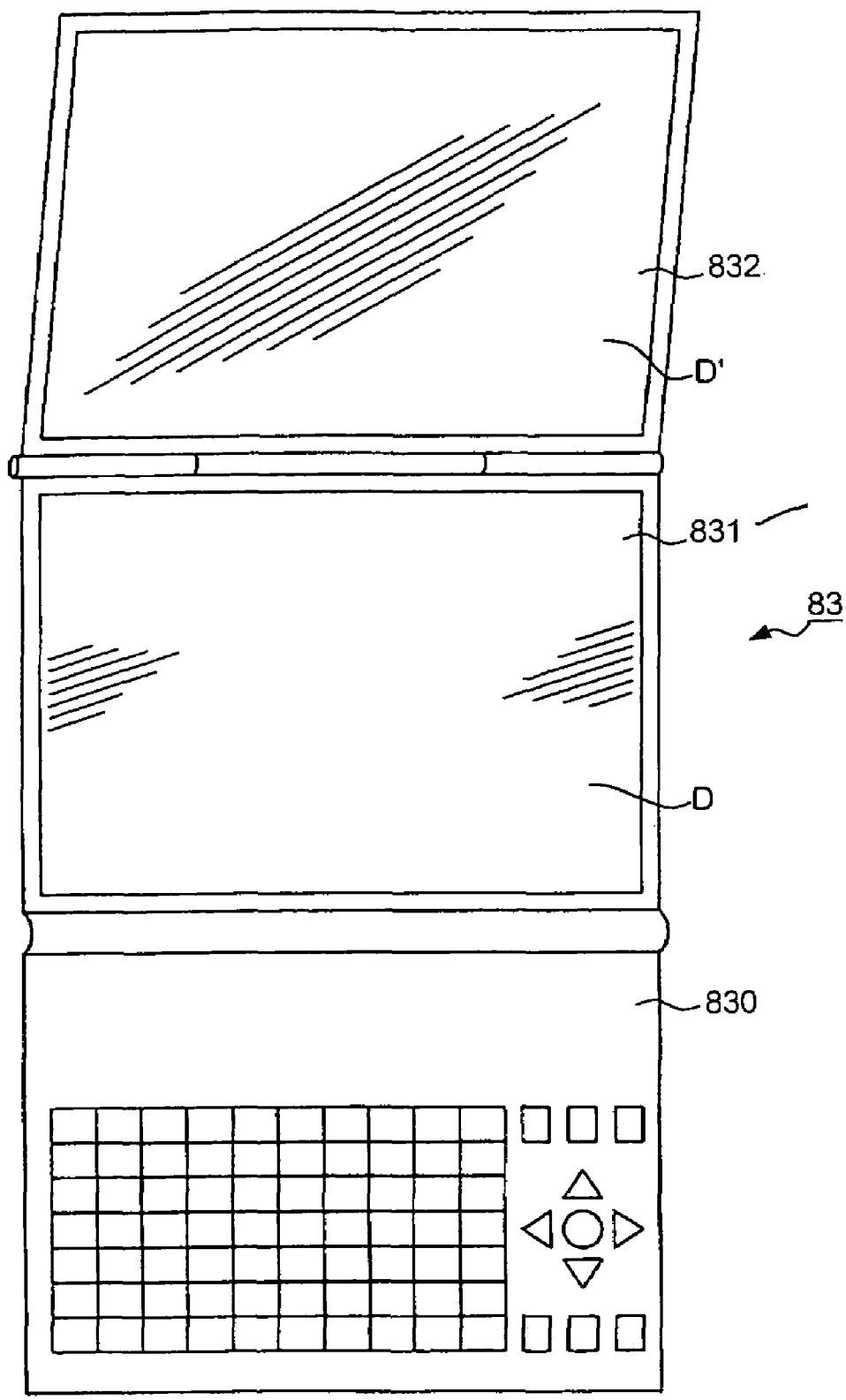
FIG. 54 is a perspective view illustrating a configuration of an electronic book as an example of an electronic apparatus.

Next, FIG. 54 is a perspective view illustrating a configuration of an electronic book as an example of the electronic apparatus according to the present invention. As shown in FIG. 54, the electronic book 83 has a main body unit 830, a first display unit 831, and a second display unit 832. The main body unit 830 includes a keyboard for receiving user's command. The first display unit 831 includes the aforementioned electro-optical device D, that is, the electro-optical device D which displays images using the light-emission from the organic EL elements 10. The second display unit 832 includes the electro-optical device D' which displays images using a plurality of pixels. However, the pixels in the second display unit 832 do not emit light by themselves. Specifically, the non-emissive display, such as an electrophoresis display, a reflective LCD (Liquid Crystal Display), a toner display, and a twist ball display, is used as the electro-optical device D' of the second display unit 832.

The first display unit 831 is attached to an edge of the main body unit 830 through a hinge. Therefore, the first display unit 831 can rotate using the edge of the main body unit 830 as a shaft. On the other hand, the second display unit 832 is attached to an edge of the first display unit 831 opposite to the main body unit 830 through a hinge. Therefore, the second display unit 832 can rotate using the edge of the first display unit 831 as a shaft.

Based on such a configuration, the display by the first display unit 831 is executed by making the organic EL elements 10 emit light. On the other hand, when the display by the second display unit 832 is executed, the organic EL elements 10 in the first display unit 831 emits light with almost the same brightness. The light emitted from the first display unit 831 is reflected from the display surface of the second display unit 832 and then is observed by an observer. That is, the first display unit 831 functions not only as a display device, but also as an illuminating device (so-called front light) when images are displayed by the second display unit 832. According to this configuration, although the second display unit 832 is the non-emissive display, the illuminating device to secure the brightness of display does not need to be provided independently. As a result, since the total thickness of the first display unit 831 and the second display unit 832 can be about 2 mm or less, the electronic book, which is thinner and lighter than a book using papers and has high performance, can be realized.

In addition, the electronic apparatus to which the present invention can apply is not limited to the apparatuses shown in FIGS. 53 and 54. That is, in addition, the present invention can apply to various apparatuses having the function of displaying images, such as a mobile phone, a game machine, an electronic paper, a video camera, a digital still camera, a car navigation apparatus, a car stereo apparatus, an operation manipulating panel, a printer, a scanner, a television, a video player, a pager, an electronic pocketbook, an electronic calculator, and a word processor.

D: Modification

The aspects described above are only for exemplification, and various modifications can be made to the aspects. An example of the modifications is as follows.

(1) Although it has been exemplified that the pixel-driving IC chips 37, the scanning IC chips 33, the column data-converting IC chips 35, and the controlling IC chip 31 are arranged on one support substrate 6, a portion or all of the scanning IC chips 33, the column data-converting IC chips 35, and the controlling IC chip 31 may be arranged on other substrates. Furthermore, a portion or all of the scanning IC chips 33, the column data-converting IC chips 35, and the controlling IC chip 31 may be integrated into one IC chip.

(2) As shown, with respect to the personal computer as an example of the electronic apparatus, the systemized and integrated element substrate or package can be realized by applying the present invention to various electronic apparatuses. That is, in the element substrate, the electronic component layer having various active elements or passive elements is sealed by the wire-forming layer having wires connected to the connection terminals of the respective electronic components. The active elements included in the electronic component layer include various components, such as an IC chip (CMOS type or bipolar type) to realize various functions, and a memory or a compound semiconductor. On the other hand, the passive elements included in the electronic component layer include various chip components, such as resistors, capacitors, or inductors. According to such element substrate, various electronic components are systemized and integrated, and thus it is possible to accomplish a miniaturized, light, and highly efficient electronic apparatus.

(3) The present invention can apply to other electro-optical devices as well as the device using the EL elements. That is, the present invention applies to any device, only if the device includes the electro-optical elements to convert the electrical action into the optical action. Such an electro-optical device includes a liquid crystal display device using liquid crystal, an electrophoresis display device, which uses micro capsules containing colored liquid and white particles dispersed in the colored liquid, a twist ball display, which uses twist balls in which different colored balls are coated to regions having different polarities, a toner display using black toners, a field emission display using fluorescent materials, a LED (Light Emitting Diode) display using LEDs, and a plasma display panel (PDP) using a high-pressure gas such as helium or neon.

Furthermore, the electro-optical device, according to the present invention, is not limited to a device to display images. The present invention may be applied to an image forming device using organic EL, LED or a field emission device (FED), or optical engine portion of an electrophotographic apparatus. In this type of apparatus, the light corresponding to the image data is irradiated to a photosensitive body, such as a photosensitive drum, and toners are absorbed onto the latent image formed. Then, the toners are transcribed to a writing material such as paper. The electro-optical device, according to the present invention, can apply to a device to irradiate the light corresponding to the image data to the photosensitive body. That is, this electro-optical device includes light-emitting elements (electro-optical elements), each irradiating the light to the photosensitive body, and driving circuits to separately drive the respective light-emitting elements. In another aspect, a configuration in which a line exposure is possible correspondingly to a writing material having various widths, such as A4 size or A3 size paper is employed. According to the electro-optical device of the present invention, it is possible to realize a thin and highly efficient printer or complex machine.

Furthermore, the present invention can apply to the electro-optical device using the electro-optical elements, such as CCD (Charge Coupled Device) which outputs the current or voltage corresponding to the irradiated quantity of light.

This electro-optical device is used as, for example, a light sensor array device (image pickup device) in a digital camera. Such type of light sensor array device is realized by providing the CCD instead of the organic EL elements 10 of the electro-optical device D, according to the above embodiments, and further providing the A/D converting circuits, which convert the analog signals output from the CCD into digital signals, instead of the D/A converting circuits 356. Furthermore, according to another aspect, the electro-optical device used as a display device and the electro-optical device used as a light sensor array device are combined into a body. According to such a device, the light-emitting brightness from the display device can be adjusted automatically in accordance with the peripheral brightness detected by the light sensor array device.

In addition, the present invention can be applied to a device including elements other than the electro-optical elements. That is, the present invention may be applied to an element driving device including a plurality of driven elements (for example, arranged in the matrix shape) arranged at different positions in a plane, respectively, and unit circuits to drive the respective driven elements. For example, if elements to detect static electricity or pressure are used as the driven elements instead of the electro-optical elements (for example, CCD of the aforementioned light sensor array) of the electro-optical device according to the present invention, devices to detect user's manipulation are realized. This element driving device can be used as an input device, such as a touch panel or a thin keyboard, in various electronic apparatuses.

As described above, according to the present invention, the deviation in characteristics of the active elements can be suppressed in a circuit to drive the driven elements, such as the electro-optical elements.

What is claimed is:

1. A method of manufacturing an electro-optical device having a plurality of electro-optical elements, the method comprising:
arranging element-driving IC chips having a plurality of unit circuits to drive the electro-optical elements such that a terminal-forming surface of each of the element-driving IC chips on which connection terminals are formed is directed to one side to form an electronic component layer including the element-driving IC chips;
forming a wire-forming layer, which includes wires to connect the respective unit circuits included in the element-driving IC chips with the electro-optical elements corresponding to the unit circuits, directly in contact with the surface of the electronic component layer to which the connection terminals of the element-driving IC chips are directed; and
forming an element layer including the plurality of electro-optical elements on the opposite side of the electronic component layer as seen from the wire-forming layer.

2. A method of manufacturing an electro-optical device having a plurality of electro-optical elements, the method comprising:
arranging element-driving IC chips, each having a plurality of unit circuits to drive the electro-optical elements, on one surface of a substrate in a state in which a terminal-forming surface of each of the element-driving IC chips on which connection terminals are formed is opposite to the substrate to form an electronic component layer including the element-driving IC chips;
peeling off the substrate from the electronic component layer;
forming a wire-forming layer, which includes wires to connect the respective unit circuits included in the element-driving IC chips with the electro-optical elements corresponding to the unit circuits, on the surface of the electronic component layer from which the substrate has been peeled off; and
forming an element layer including the plurality of electro-optical elements on the opposite side of the electronic component layer as seen from the wire-forming layer.

3. The method of manufacturing an electro-optical device according to claim 2, further comprising:
forming a peeling layer on the one surface of the substrate before forming the electronic component layer,
in the forming of the electronic component layer, the electronic component layer being formed on the opposite side of the substrate as seen from the peeling layer, and
in the peeling off of the substrate, the substrate being peeled off from the boundary surface between the electronic component layer and the peeling layer by the peeling layer.

4. The method of manufacturing an electro-optical device according to claim 2, further comprising:
forming an adhesive layer on the one surface of the substrate before forming the electronic component layer,
in the forming of the electronic component layer, the terminal-forming surfaces of the element-driving IC chips being adhered to the adhesive layer.

5. The method of manufacturing an electro-optical device according to claim 4, the adhesive layer being made of an insulating material, and
in the forming of the wire-forming layer, the wire-forming layer being formed on the surface of the adhesive layer covering the electronic component layer.

6. A method of manufacturing an electro-optical device having a plurality of electro-optical elements, the method comprising:
forming electrodes to supply current or to apply voltage to the electro-optical elements on one surface of a substrate, while forming a wire-forming layer including wires to connect the electrodes with each of a plurality of unit circuits;
forming an electronic component layer, which includes element-driving IC chips having the plurality of unit circuits to drive the electro-optical elements, on the opposite side of the substrate as seen from the wiring layer;

peeling off the substrate from the wire-forming layer; and forming the electro-optical elements contacting the electrodes on the opposite side of the electronic component layer as seen from the wire-forming layer to form an element layer including the plurality of electro-optical elements.

7. The method of manufacturing an electro-optical device according to claim 6, further comprising:

forming a peeling layer on the one surface of the substrate before forming the electronic component layer, in the forming of the wire-forming layer, the wire-forming layer being formed on the opposite side of the substrate as seen from the peeling layer, and in the peeling off of the substrate, the substrate being peeled off from the boundary surface between the wire-forming layer and the peeling layer by the peeling layer.

8. The method of manufacturing an electro-optical device according to claim 2, further comprising:

fixing a support substrate on the opposite side of the substrate as seen from the electronic component layer before the peeling off the substrate.

9. The method of manufacturing an electro-optical device according to claim 2, in the forming of the wire-forming layer, the wires to connect the unit circuits with the electro-optical elements are formed, an insulating layer being formed to cover the wires and having apertures in portions corresponding to a part of the wires, and electrode portions being formed in the apertures of the insulating layer, and in the forming of the electronic component layer, projected electrodes provided in the connection terminals of the element-driving IC chips being bonded to the electrode portions.

10. The method of manufacturing an electro-optical device according to claim 1, the forming of the electronic component layer, comprising:

arranging the plurality of element-driving IC chips, each having a plurality of unit circuits, and forming a filling layer between the respective element-driving IC chips.

11. The method of manufacturing an electro-optical device according to claim 10, the forming of the electronic component layer comprising:

forming a substrate layer between the plurality of element-driving IC chips and the filling layer.

12. The method of manufacturing an electro-optical device according to claim 1, the forming of the electronic component layer comprising:

forming a light-shielding layer to shield light on the opposite side of the wire-forming layer as seen from the electronic component layer.

13. The method of manufacturing an electro-optical device according to claim 12, the light-shielding layer being made of a conductive material.

14. The method of manufacturing an electro-optical device according to claim 1, the forming of the electronic component layer, the plurality of element-driving IC chips, each having a plurality of terminal circuits, being arranged in positions facing the plurality of electro-optical elements corresponding to the plurality of unit circuits included in the respective element-driving IC chips.

15. A method of manufacturing an element driving device having a plurality of driven elements, the method, comprising:

arranging element-driving IC chips, each having a plurality of unit circuits to drive the driven elements, such that a terminal-forming surface of each of the element-driving IC chips on which connection terminals are formed is directed to one side to form an electronic component layer including the element-driving IC chips;

forming a wire-forming layer, which includes wires to connect the respective unit circuits included in the element-driving IC chips with the driven elements corresponding to the unit circuits, directly in contact with en the surface of the electronic component layer to which the connection terminals of the element-driving IC chips directed; and forming an element layer including the plurality of driven elements on the opposite side of the electronic component layer as seen from the wire-forming layer.

16. A method of manufacturing an element driving device having a plurality of driven elements, the method comprising:

arranging element-driving IC chips, each having a plurality of unit circuits to drive the driven elements, on one surface of a substrate in a state in which a terminal-forming surface of each of the element-driving IC chips on which connection terminals are formed is opposite to the substrate to form an electronic component layer including the element-driving IC chips;

peeling off the substrate from the electronic component layer;

forming a wire-forming layer, which includes wires to connect the respective unit circuits included in the element-driving IC chips with the driven elements corresponding to the unit circuits, on the surface of the electronic component layer from which the substrate peeled off; and forming an element layer including the plurality of driven elements on the opposite side of the electronic component layer as seen from the wire-forming layer.

17. A method of manufacturing an element driving device having a plurality of driven elements, the method comprising:

forming electrodes to supply current or to apply voltage to the driven elements on one surface of a substrate, while forming a wire-forming layer including wires to connect the electrodes with each of a plurality of unit circuits;

forming an electronic component layer, which includes element-driving IC chips having the plurality of unit circuits to drive the driven elements, on the opposite side of the substrate as seen from the wiring layer;

peeling off the substrate from the wire-forming layer; and forming the driven elements contacting the electrodes on the opposite side of the electronic component layer as seen from the wire-forming layer to form an element layer including the plurality of driven elements.

* * * * *